(12) United States Patent
Tatsumi

(10) Patent No.: US 7,655,481 B2
(45) Date of Patent: Feb. 2, 2010

(54) METHOD FOR MANUFACTURING INDUSTRIAL PRODUCTS AND COMBINATION OF MASKS FOR MANUFACTURING THE SAME

(75) Inventor: Yuuichi Tatsumi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 592 days.

(21) Appl. No.: 11/325,545

(22) Filed: Jan. 5, 2006

(65) Prior Publication Data

US 2006/0166384 A1 Jul. 27, 2006

(30) Foreign Application Priority Data

Jan. 14, 2005 (JP) ............................. 2005-008402

(51) Int. Cl.
*H01L 21/66* (2006.01)
(52) U.S. Cl. .............................. 438/17; 430/5; 430/331; 430/394; 438/6; 438/18
(58) Field of Classification Search .................. 257/74, 257/41, 246, 48, 642; 365/205; 438/17, 438/18, 6; 430/5, 311, 394
See application file for complete search history.

(56) References Cited

U.S. PATENT DOCUMENTS

| | | | | |
|---|---|---|---|---|
| 4,641,353 | A * | 2/1987 | Kobayashi | 382/144 |
| 5,324,980 | A * | 6/1994 | Kusunoki | 257/74 |
| 5,965,902 | A * | 10/1999 | Beffa | 257/48 |
| 6,794,677 | B2 * | 9/2004 | Tamaki et al. | 257/41 |
| 2005/0056913 | A1 * | 3/2005 | Farnworth | 257/642 |
| 2005/0128843 | A1 * | 6/2005 | Kajimoto et al. | 365/205 |
| 2006/0017076 | A1 * | 1/2006 | Lankhorst et al. | 257/246 |

FOREIGN PATENT DOCUMENTS

| | | |
|---|---|---|
| JP | 11-102856 | 4/1999 |
| JP | 2003-133385 | 5/2003 |

OTHER PUBLICATIONS

Kaustuve Bhattacharyya, et al. "Investigation of Reticle Defect Formation at DUV Lithography"; 22$^{nd}$ Annual Bacus Symposium on Photomask Technology, Brian J. Grenon, Kurt R. Kimmel, Editors, Proceedings of SPIE; vol. 4889; 2002; pp. 478-487.

* cited by examiner

*Primary Examiner*—Mark F Huff
*Assistant Examiner*—Rashid Alam
(74) *Attorney, Agent, or Firm*—Oblon, Spivak, McClelland, Maier & Neustadt, L.L.P.

(57) ABSTRACT

A method for manufacturing an industrial product encompasses: forming a intermediate product pattern, which implements a part of a intermediate product of the industrial product by a sequence of processes corresponds to a part of a procedure for manufacturing the industrial product; forming an interconnect-changing insulator on the intermediate product pattern; boring sampling contact holes in the interconnect-changing insulator so as to make bare a part of the intermediate product pattern to define sampling sites; delineating evaluation interconnects on the interconnect-changing insulator so that each of the evaluation interconnects can electrically connected to at least one of the sampling sites of intermediate product pattern; and measuring an electrical resistance between subject sampling sites through the evaluation interconnects so as to detect a product defect in the intermediate product pattern.

20 Claims, 37 Drawing Sheets

METHOD FOR MANUFACTURING INDUSTRIAL PRODUCTS AND COMBINATION OF MASKS FOR MANUFACTURING THE SAME

CROSS REFERENCE TO RELATED APPLICATIONS AND INCORPORATION BY REFERENCE

This application claims benefit of priority under 35 USC 119 based on Japanese Patent Application No. P2005-008402 filed Jan. 14, 2005, the entire contents of which are incorporated by reference herein.

BACKGROUND OF THE INVENTION

1. Field of the Invention

The present invention relates to a fabrication method for miniaturized industrial products. In particular, it relates to a fabrication method preferable for development and standardization of a new manufacturing process for a miniaturized structure.

2. Description of the Related Art

For fabrication of a large-scale semiconductor integrated circuit with a minimum feature size F of 100 to 150 nm or less, advanced mask processing technology and lithography technology are needed. Particularly as the degree of miniaturization increases, there is increased difficulty in generating a flawless mask having many fine line-and-space patterns.

In addition to a mask level problem, with fabrication of micro-patterns for a semiconductor integrated circuit, there is a serious issue of generation of interconnect pattern defects or element pattern defects due to characteristics of substrate materials, fabrication environment, defective mask patterns, or lithography tool operating technology.

With a fabrication method for a microscopic semiconductor integrated circuit, one problem that occurs on semiconductor wafers includes fluctuations in pattern ends, which may cause short-circuit failure or open-circuit failure in the pattern of the semiconductor integrated circuit. Typically, ascribable to the fluctuations in pattern ends, an allowable error margin is required within the fabrication procedure so as to suppress the problem, and the fluctuations in pattern ends account for dimensional allowance. Accordingly, when a new fabrication procedure for a semiconductor integrated circuit is scheduled to be developed and standardized, or when designing a new semiconductor integrated circuit, with principal patterns serving as the target semiconductor integrated circuit disposed in central and principal area of a chip area, a plurality of evaluation test patterns (circuits) called "test element group (TEG) patterns" are merged in a part of the semiconductor wafer such as the periphery of the chip area so as to evaluate the fabrication procedure, electrical characteristics, fabrication conditions, and circuit functions by the TEG patterns.

A method of measuring electrical characteristics between terminals (pads) of a process testing pattern called "a process level TEG (PL-TEG) pattern" and a method of evaluating (estimating) yield and the like from the results has been adopted for evaluation of each process levels such as polysilicon film growth, impurity diffusion, and metal film formation (see Japanese Patent Application Laid-Open No. 2003-133385). PL-TEG pattern is a pattern of a specific mask (hereafter called "a process-level evaluation mask") for examining process dependency in order to investigate adverse affects such as causing open-circuit failure or short-circuit failure in the actual device patterns of semiconductor integrated circuit when process conditions for the semiconductor integrated circuit fabrication method vary. The process-level evaluation mask is implemented by closely aligned patterns equivalent to fine line patterns arranged in the semiconductor integrated circuit as a target industrial product, and is intended to easily statistically recognize short-circuit failures or open-circuit failures in the patterns of each process level.

Using semiconductor memory as an example of the target industrial product, each of the chip areas arranged on a semiconductor wafer is occupied by a plurality of semiconductor elements, called memory cells, each of which is configured to store data. Since an increasingly larger number of memory cells may be arranged within the same given area size as micro-fabrication technology of fine patterns advances, the most advanced micro-fabrication technology is typically used for the fabrication of the memory cell patterns during development, and state-of-the-art micro-fabrication technology is used for the fabrication of line patterns and space patterns. Due to this situation in the micro-fabrication technology, production of the process-level evaluation mask is generally carried out at the highest quality presently available, and exclusive masks for flawless patterns are required for examining open-circuit characteristics and short-circuit characteristics of patterns on semiconductor wafers.

Accordingly, production of the process-level evaluation mask is very difficult due to processing limits in each process. Meanwhile, because there are strict demands on transfer of the images of the process-level evaluation mask for examining processing fluctuation in the results of transferring the images onto the semiconductor wafer, the conditions for transferring the images of the process-level evaluation masks onto the semiconductor wafer are strict. Therefore, differences in image-transfer behavior between the process-level evaluation masks and masks routinely employed to the main portion of the semiconductor memory (or the target industrial product) in the actual fabrication sequences (hereafter called "working mask for a target industrial product" or simply "working mask") is an important factor for determination of the processing fluctuation on the semiconductor wafer, "the main portion of the semiconductor memory" excludes peripheral regions of a chip area where TEG patterns are merged on the semiconductor wafer, if the target industrial product is a semiconductor integrated circuit.

Particularly, it is impossible to precisely evaluate processing fluctuation by the exclusive PL-TEG pattern in the earlier technology, the PL-TEG pattern is implemented by a different pattern disposed on the same mask substrate than that of the actual device pattern, taking into consideration loading effects and the like during lithography and dry etching processes of micro-patterns. This problem emanates from difference in the covering rate of the fine patterns between the actual device pattern and corresponding PL-TEG pattern on the mask substrate. Therefore, it required much labor by doubling the job, because an extra job such as separately finding the correlation between the exclusive PL-TEG mask and the working mask becomes necessary, thereby causing an indeterminate factor in the evaluation of the processing fluctuation. In other words, in the earlier technology, the practical meaning of the method of preparing the exclusive PL-TEG mask separate from the working mask is becoming not as important nowadays where the absolute value of dimensions is becoming smaller, and essentially, covering rate and pattern density of the process-level evaluation mask are required to be the same as the covering rate and the pattern density of the working mask.

Furthermore, in the earlier technology, with extremely miniaturized, high accuracy masks, adverse influences of individual differences of the respective working masks increase, and the method using the exclusive PL-TEG mask is reaching its limit, and the production of the exclusive PL-TEG mask itself is becoming difficult.

SUMMARY OF THE INVENTION

An aspect of the present invention inheres in a method for manufacturing an industrial product, encompassing (a) forming a first intermediate product pattern, which implements at least a part of a first intermediate product of the industrial product, at a surface of a base body to be processed by a sequence of processes including lithography process with a first set of working masks, the sequence of processes corresponds to a part of a procedure for manufacturing the industrial product; (b) forming an interconnect-changing insulator on the first intermediate product pattern; (c) boring a plurality of sampling contact holes in the interconnect-changing insulator so as to make bare a part of the first intermediate product pattern to define a plurality of sampling sites; (d) delineating a plurality of evaluation interconnects on the interconnect-changing insulator so that each of the evaluation interconnects can electrically connected to at least one of the sampling sites of first intermediate product pattern; and (e) measuring an electrical resistance between subject sampling sites through the evaluation interconnects so as to detect a product defect in the first intermediate product pattern.

Another aspect of the present invention inheres in a combination of masks encompassing (a) a set of working masks configure to fabricate an intermediate product pattern, which implements at least a part of an intermediate product of the industrial product, at a surface of a base body to be processed by a sequence of processes including lithography process with the working masks, the sequence of processes corresponds to a part of a procedure for manufacturing the industrial product; (b) a first evaluation mask configure to bore a plurality of sampling contact holes in an interconnect-changing insulator formed on the intermediate product pattern so as to make bare a part of the intermediate product pattern to define a plurality of sampling sites; and (c) a second evaluation mask configure to delineate a plurality of evaluation interconnects on the interconnect-changing insulator so that each of the evaluation interconnects can electrically connected to at least one of the sampling sites of intermediate product pattern. Here, an electrical resistance is measured between subject sampling sites through the evaluation interconnects so as to detect a product defect in the intermediate product pattern.

A still another aspect of the present invention inheres in a method for manufacturing an industrial product with a procedure controlled by a process-level evaluation using a combination of masks encompassing: (a) a set of working masks configure to fabricate an intermediate product pattern, which implements at least a part of an intermediate product of the industrial product, at a surface of a base body to be processed by a sequence of processes including lithography process with the working masks, the sequence of processes corresponds to a part of a procedure for manufacturing the industrial product; (b) a first evaluation mask configure to bore a plurality of sampling contact holes in an interconnect-changing insulator formed on the intermediate product pattern so as to make bare a part of the intermediate product pattern to define a plurality of sampling sites; and (c) a second evaluation mask configure to delineate a plurality of evaluation interconnects on the interconnect-changing insulator so that each of the evaluation interconnects can electrically connected to at least one of the sampling sites of intermediate product pattern, wherein an electrical resistance is measured between subject sampling sites through the evaluation interconnects so as to detect a product defect in the intermediate product pattern.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE INVENTION

Figure 1:
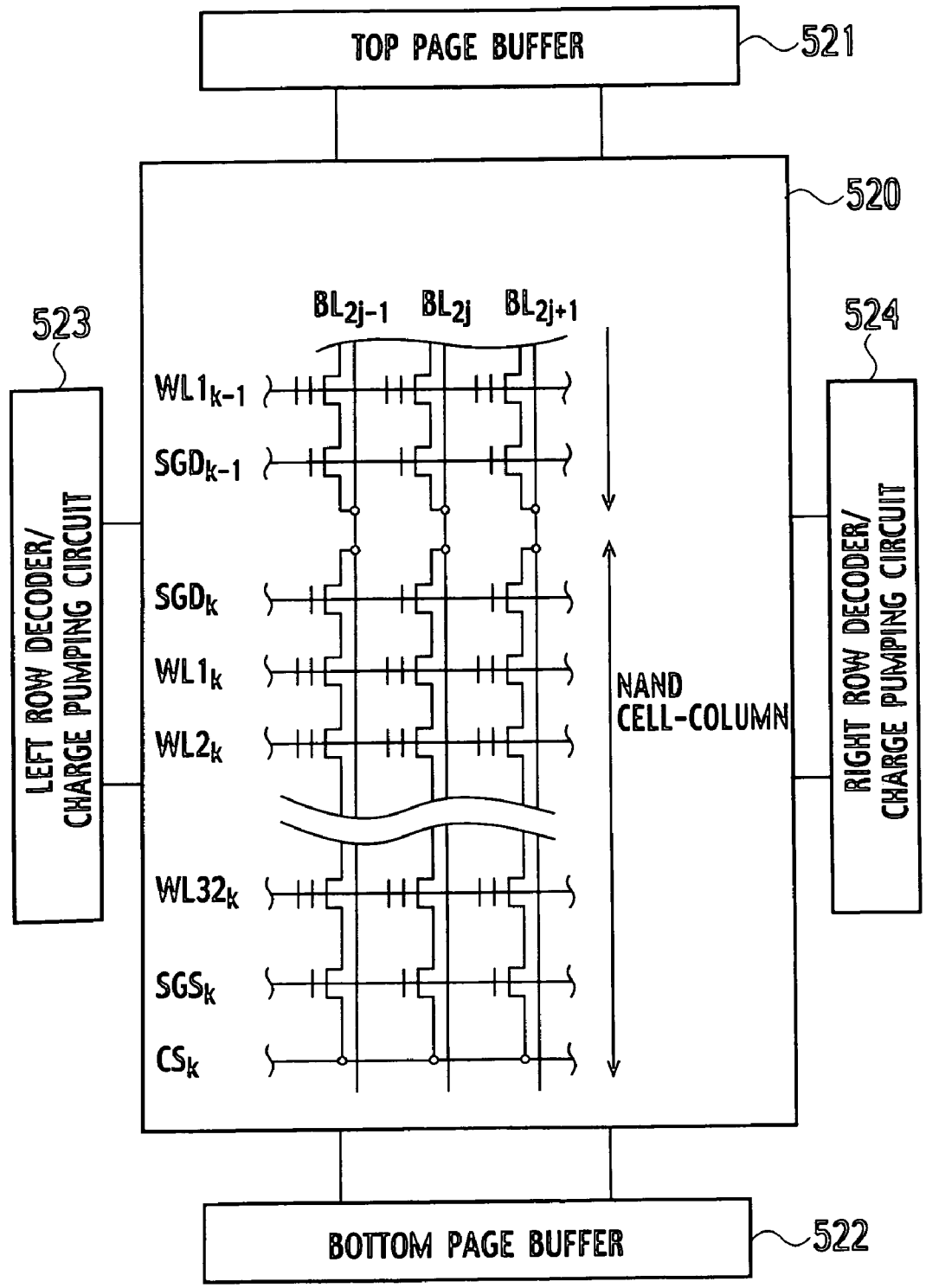
FIG. 1 is a block diagram showing a logical circuit configuration of nonvolatile semiconductor memory (NAND flash memory) as a preferred example describing a fabrication method for a target industrial product according to an embodiment of the present invention.

A technical idea of functioning as voltage-measuring patterns capable of detecting short-circuit failure or open-circuit failures by combining process-level evaluation patterns for verifying reliance of a target industrial product (final product) with various intermediate product patterns of the industrial product is exemplified in detail with the embodiment of the present invention given below using the accompanying drawings. Here, the intermediate product patterns correspond to actual device patterns, each of which implements at least a part of an intermediate product of the industrial product (final product), at a surface of a base body to be processed by a sequence of processes including lithography process with a working mask, the sequence of processes corresponds to a part of an entire procedure for manufacturing the industrial product.

Another technical idea facilitating employment of a defective mask, by electrically isolating a defective portion (if there is) to be generated by corresponding defective portion in the working mask to be used in a normal routine procedure so that there are no adverse affects from the defective portion, when providing an evaluation pattern configured to measure electrical characteristics, is also exemplified in detail using the accompanying drawings.

Furthermore, although the embodiment given below establishes the same effectiveness as that for the exclusive PL-TEG in the earlier technology, partially using working masks, thereby overcoming the effect of difference in image-transfer behavior between the working masks of the industrial product and the exclusive PL-TEG masks, it merely exemplifies devices and methods to embody the technical ideas of the present invention, which are not to be limited to materials, shapes, structures, or arrangements of components in the following description. In other words, through description of a fabrication method for a target industrial product according to the embodiment of the present invention is described through description of a nonvolatile semiconductor memory (NAND flash memory) fabrication method as a representative example; however, the technical ideas of the present invention are able to be modified within the technical scope of the appended claims, and are intended for fabrication of various industrial products without being limited to the fabrication method for the nonvolatile semiconductor memory (NAND flash memory). In other instances, well-known manufacturing materials, processes and equipment are not set forth in detail in order not to unnecessarily obscure the present invention.

Prepositions, such as "on", "over", "under", "beneath", and "normal" are defined with respect to a planar surface of the substrate, regardless of the orientation in which the substrate is actually held. A layer is on another layer even if there are intervening layers. As it will be appreciated, in the following description, the terms drain and source can be exchanged without modifying the structure itself.

Final Product: Nand Flash Memory

FIG. 1 is a block diagram showing a main portion of a logical circuit configuration of nonvolatile semiconductor memory (NAND flash memory) as an example of the industrial product (final product), encompassing a memory cell array 520 and peripheral circuits (521, 522, 523, and 524) arranged in the periphery of the memory cell array 520. The peripheral circuits (521, 522, 523, and 524) embrace a top page buffer 521, a bottom page buffer 522, a left row decoder/charge pumping circuit 523, and a right row decoder/charge pumping circuit 524.

Figure 2:
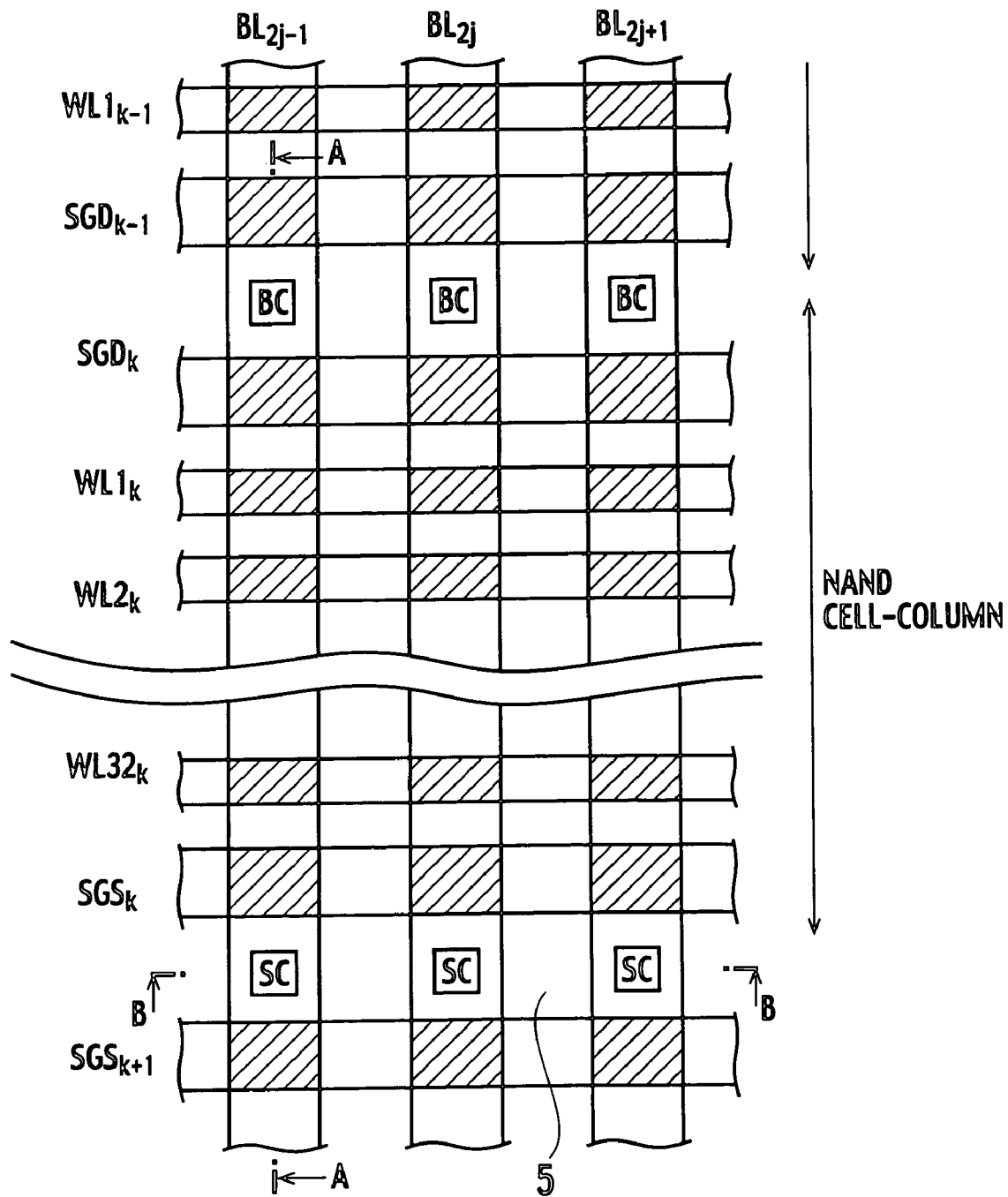
FIG. 2 is a top view schematically showing a physical layout pattern structure of a part of a memory cell array of the nonvolatile semiconductor memory shown in FIG. 1.

As shown in FIG. 2, the memory cell array 520 includes a plurality of word lines $WL_{1k}$, $WL_{2k}$, ..., $WL_{32k}$, $WL_{1k-1}$, ... aligned along the row direction, and a plurality of data transfer lines (bit lines) $BL_{2j-1}$, $BL_{2j}$, $BL_{2j+1}$, ... aligned along the column direction orthogonal to the word lines $WL_{1k}$, $WL_{2k}$, ..., $WL_{32k}$, $WL_{1k-1}$, ... In addition, a plurality of memory cell transistors having charge storage layers, which have respective charge storage states controlled by one of the multiple word lines $WL_{1k}$, $WL_{2k}$, ..., $WL_{32k}$, ... $WL_{1k-1}$, ..., are aligned along the column direction of FIG. 2. FIG. 1 and FIG. 2 show a case where thirty-two memory cell transistors are aligned along the column direction, implementing a memory cell column. A pair of select transistors, which select a group of memory cell transistors adjacently aligned in the memory cell column along the column direction, is provided at either end of the memory cell column. A pair of select gate lines $SGD_k$ and $SGS_k$ is connected to the respective gates of this pair of select transistors. The top page buffer 521 and the bottom page buffer 522 are connected to the data transfer lines $BL_{2j-1}$, $BL_{2j}$, $BL_{2j+1}$, ... and are for reading out respective pieces of memory cell column information. The left row decoder/charge pumping circuit 523 and the right row decoder/charge pumping circuit 524 are connected to the word lines $WL_{1k}$, $WL_{2k}$, ..., $WL_{32k}$, $WL_{1k-1}$, ... and control respective charge storage states of the respective memory cell transistors implementing the memory cell column.

The data transfer lines $BL_{2j-1}$, $BL_{2j}$, $BL_{2j+1}$, ... are aligned along the row direction at very close intervals of 2-3 F—with a minimum feature size F—so that a region including, for example, approximately 530 data transfer lines BL $BL_{2j-1}$, $BL_{2j}$, $BL_{2j+1}$, . . . implements a single "memory cell array block". For example, if 32-bit memory cell transistors serially aligned implement a single NAND cell column, 530 NAND cell columns are aligned in parallel along the row direction, implementing a NAND memory cell block. The NAND cell columns are arranged in, for example, approximately 2048 blocks along the column direction.

Figure 3A:
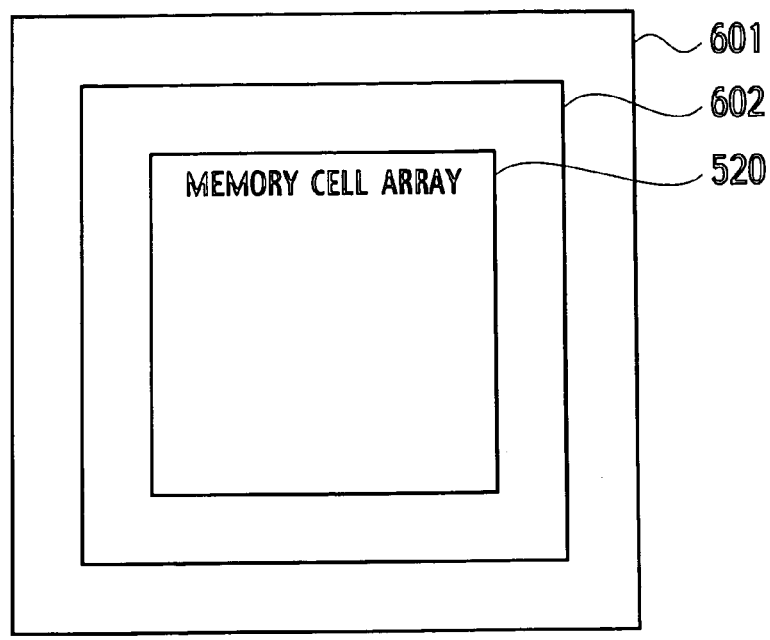
FIG. 3A is a top view schematically showing a physical layout on a semiconductor chip of the nonvolatile semiconductor memory (NAND flash memory) according to the embodiment of the present invention.

FIG. 3A is a top view schematically showing a physical arrangement of NAND flash memory as the nonvolatile semiconductor memory according to the embodiment of the present invention. The memory cell array 520 is arranged in the central portion of a semiconductor chip (chip area) 601, and peripheral circuits 602 such as the top page buffer 521, the bottom page buffer 522, the left row decoder/charge pumping circuit 523, and the right row decoder/charge pumping circuit 524 are arranged in the periphery of the memory cell array 520. The area occupied by peripheral circuits 602 implements the main portion of the chip area 601.

Figure 3B:
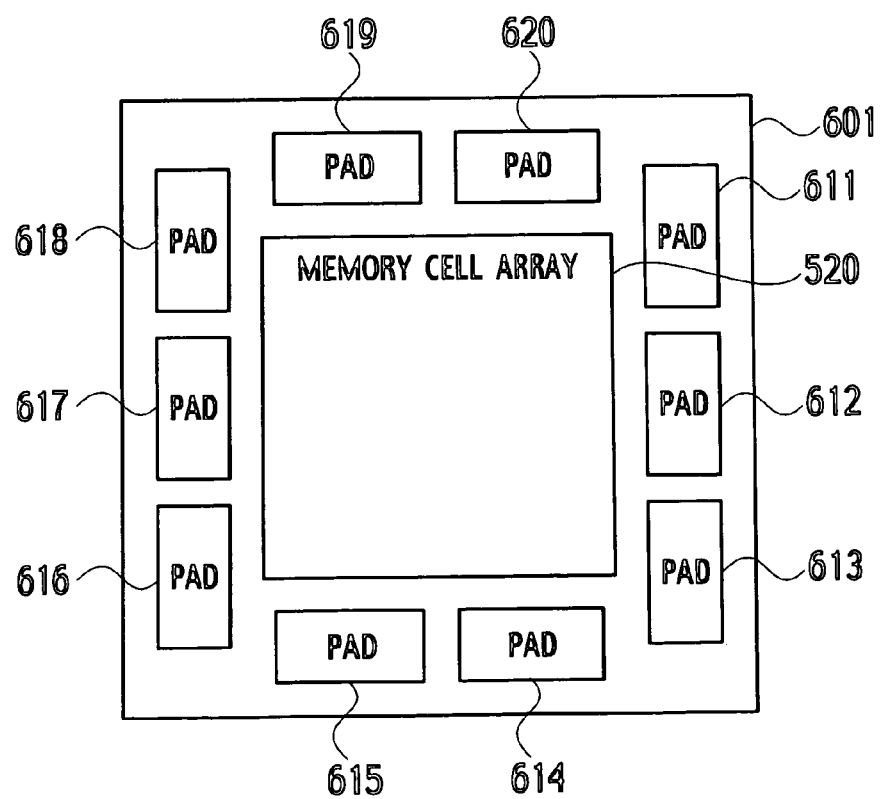
FIG. 3B is a top view showing an exemplary process-level evaluation pattern to be used as needed for each process in the fabrication method for a target industrial product (fabrication method for the nonvolatile semiconductor memory) according to the embodiment.

FIG. 3B exemplifies a part of process-level evaluation patterns to be used for evaluating any subject processes in the fabrication procedure for the nonvolatile semiconductor memory according to the embodiment of the present invention. FIG. 3B shows an arrangement of a plurality of probing pads 611, 612 . . . and 620 in the periphery of the memory cell array 520, which connect tips of testing probes for measuring voltage during process-level evaluation. Although omitted from FIG. 3B, the probing pads 611, 612, . . . , and 620 are electrically connected to mutually close aligned portions of patterns in the memory cell array 520 and through respective evaluation interconnects (extension interconnects) for process-level evaluation. The evaluation interconnects (extension interconnects) are wirings used for electrically extending internal wirings of internal circuit toward the outside of chip area. The evaluation interconnects for process-level evaluation will be described later using FIGS. 14, 15, 24, 25, 33, 34, and 40). The measurement of voltages through the probing pads 611, 612 . . . and 620, when a subject process has completed, can detect short-circuit failures and open-circuit failures of micro-patterns implemented in the memory cell array 520. In other words, the same functionality and effectiveness achieved by the PL-TEG in the earlier technology can be achieved with the intermediate product patterns of the industrial product. As long as the evaluation interconnects (extension interconnects) for process-level evaluation can connect specified portions in the memory cell array 520 to the probing pads 611, 612 . . . and 620 so that the specified portions can electrically connected to the outside of the semiconductor chip, a rough mask pattern not requiring a microscopic line width or the like may be employed for the evaluation interconnects (extension interconnects).

Figure 4:
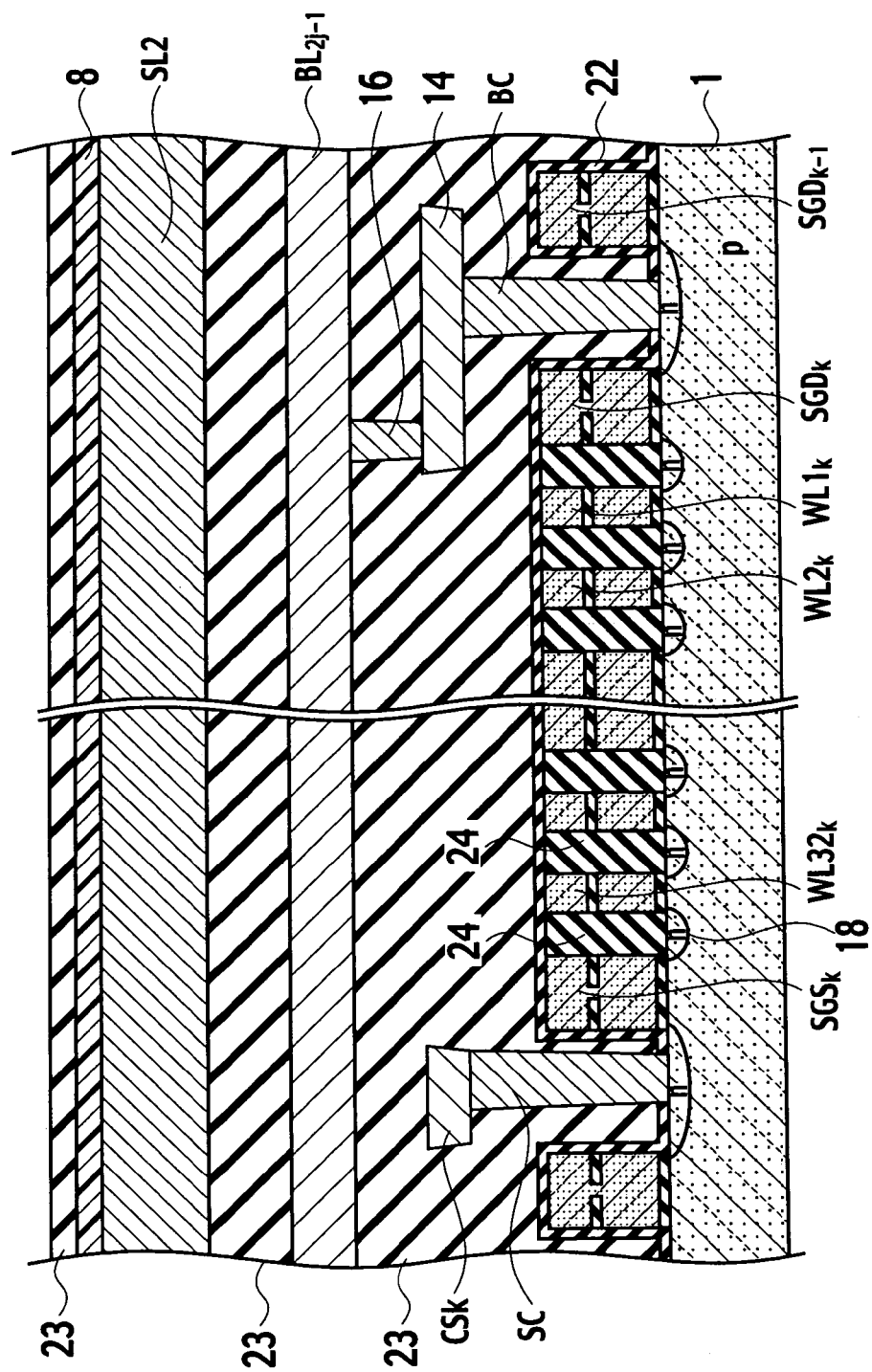
FIG. 4 is a cross-sectional view showing a part of the memory cell array (NAND cell column) cut along the direction of data transfer lines shown in FIG. 2.

As shown in FIG. 4, the cross-sectional structure of the nonvolatile semiconductor memory according to the embodiment of the present invention cut along the column direction (along the line A-A) of FIG. 2 includes a p-well or semiconductor substrate 1, n-type diffused layers 18 selectively formed on the surface of the p-well or semiconductor substrate 1, memory cell transistors connected to the word lines $WL_{1k}$, $WL_{2k}$, . . . $WL_{32k}$, $WL_{1k-1}$, . . . and using the n-type diffused layers 18 as source/drain regions, select gate transistors connected to select gate lines $SGD_k$, $SGS_k$, and $SGD_{k-1}$ and using the n-type diffused layers 18 as source/drain regions, barrier insulating films 22 covering the surfaces of the memory cell transistors and the select gate transistors, a bit line contact (data transfer line contact) BC connected to a diffused layer (drain region) 18 positioned between a pair of the select gate transistors which is connected to the respective select gate lines $SGD_k$ and $SGD_{k-1}$, a source line contact SC connected to a diffused layer (source drain) 18 positioned between a pair of the select gate transistors which is connected to the respective select gate lines $SGS_k$ and $SGS_{k+1}$, a first source line $CS_k$ connected to the source line contact SC, a data transfer line extension (junction plate) 14 connected to the bit line contact (data transfer line contact) BC, a via plug 16 connected to the data transfer line extension 14, a bit line (data transfer line) $BL_{2j-1}$ connected to the via plug 16, and a second source line SL2 arranged on the bit line (data transfer line) $BL_{2j-1}$ via an interlayer insulating film 23. The "barrier insulating films 22" are etching stoppers for preventing excessive etching when forming the bit line contact (data transfer line contact) BC and the source line contact SC, and may be omitted. Interlayer insulating films 23 are also provided between the bit line (data transfer line) $BL_{2j-1}$ and the barrier insulating films, but they are composite membranes made up of multiple insulating films. There are also interlayer insulating films 24 inserted between each memory cell transistor and between each memory cell transistor and adjacent select gate transistor. A silicon nitride ($Si_3N_4$) film 8 covers as a passivation film, the second source line SL2.

Figure 5:
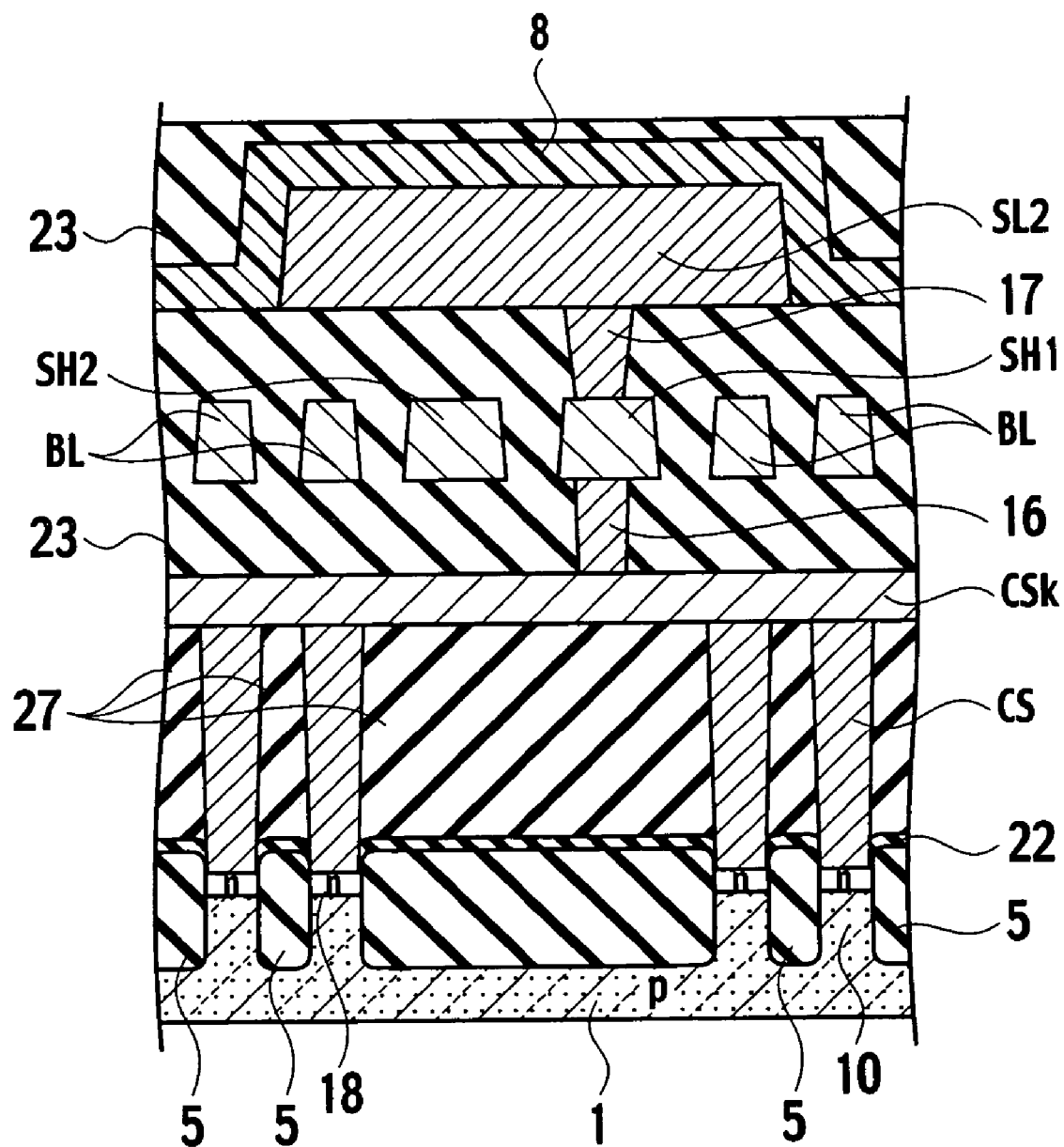
FIG. 5 is a cross-sectional view showing a part of the memory cell array cut along the direction of word lines shown in FIG. 2.
Figure 6:
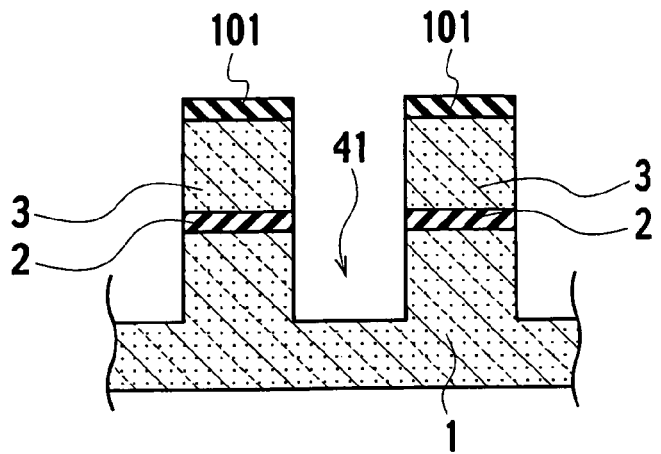
FIG. 6 is a cross-sectional view showing a state of the industrial product in a normal routine procedure, the industrial product is assumed to be a nonvolatile semiconductor memory (NAND flash memory) as a preferred example, describing a fabrication method of industrial product according to the embodiment of the present invention.

FIG. 5 corresponds to a cross-sectional view cut along the line B-B passing through the source line contact SC in a direction orthogonal to the line A-A of FIG. 2, and shows a first via plug 16 connected to the first source line $CS_k$, a source shunt line SH1 connected to the first via plug 16, a second via plug 17 connected the source shunt line SH1, and the second source line SL2 connected to the second via plug.

Figure 33:
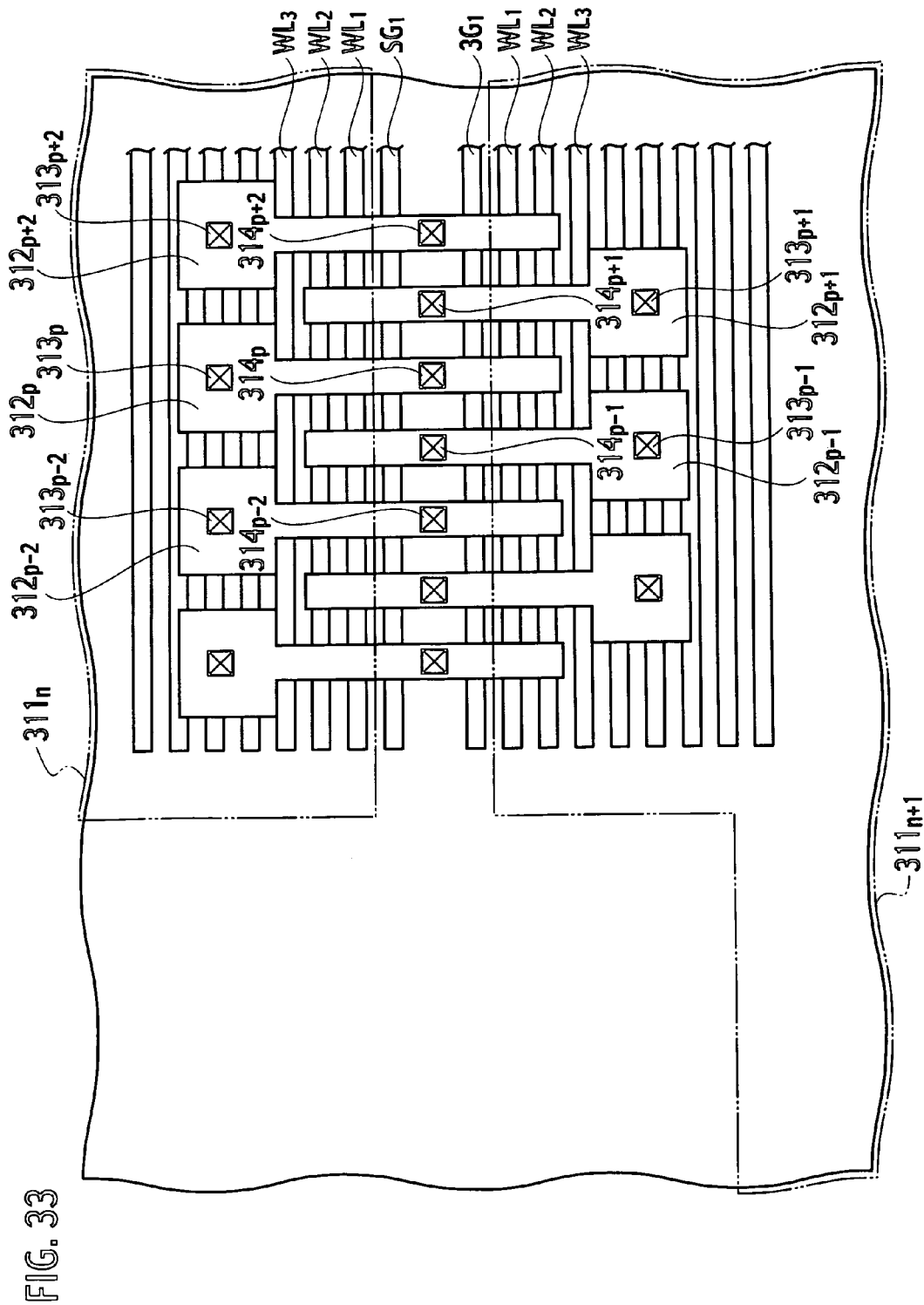
FIG. 33 is a top view of the process-level evaluation pattern (short-circuit failure detecting pattern) corresponding to FIG. 32.

The contact hole for the bit line contact (data transfer line contact) BC and the via hole for the first via plug 16 are filled in with a doped polysilicon, a refractory metal such as tungsten (W), titanium (Ti), molybdenum (Mo), a silicide of these metals ($WSi_2$, $TiSi_2$, $MoSi_2$), or a polycide using these silicides. The doped polysilicon may be doped with a high concentration of impurity atoms such as phosphorous (P). The data transfer line extension 14 and the first source line $CS_k$ are made of a refractory metal such as W, Ti, Mo or silicides ($WSi_2$, $TiSi_2$, $MoSi_2$) in the same manner. In FIG. 4, while the data transfer line extension 14 longer than 7 F extending along the length of the bit line (data transfer line) $BL_{2j-1}$ is assumed as an interconnect layer, it is merely an example, and various structures and dimensions such as a data transfer line extension 14 longer than 20 F may be adopted, as shown in FIG. 33. The second via plug 17 connecting the bit line (data transfer line) $BL_{2j-1}$, the second source line SL2, the source shunt line SH1, and the second source line SL2 is made of a metal such as aluminum (Al) or copper (Cu).

Intermediate Product with Active Area

First, a normal routine procedure up to delineation process of active areas (AAs) using the fabrication method for the NAND flash memory, according to the embodiment of the present invention, and process-level evaluation procedure accompanying the delineation process of the active areas (AAs) are described using FIGS. 6 through 15.

FIGS. 6 through 8, 10, 11, and 13 show only cross-sectional views cut along the word lines $WL_{1k}$, $WL_{2k}$, . . . , $WL_{32k}$, $WL_{1k-1}$, . . . , omitting the cross-sectional views cut along the data transfer lines $BL_{2j-1}$, $BL_{2j}$, $BL_{2j+1}$, . . . of FIG. 2. Note that the NAND flash memory fabrication method and the accompanying process-level evaluation method given below are merely an example, and other various methods are available including modifications of this method. Similarly, disclosed patterns are merely examples, and it is needless to say that other various patterns may be used.

(a) First, using the semiconductor substrate (Si substrate) 1 doped with a desired impurity as "a base body to be processed (mother base material to be processed)", a 10 nm-thick tunnel oxidized film, which becomes a gate insulating film 2, is formed on the surface of the base body through thermal oxidation. A first conducting layer 3 made of a 100 nm-thick polysilicon layer doped with phosphorous (P) and a mask film 101 for element isolation are successively deposited through chemical vapor deposition (CVD), implementing "a new base body" to be processed. In other words, the "base body to be processed" of the present invention changes to a "new base body to be processed" as needed as the fabrication procedure progresses, and is successively defined as a new base body in a flow of normal routine procedure for manufacturing the industrial product. That is, the base body is defined by a preceding intermediate product fabricated by a preceding sequence of processes conducted before the sequence of subject processes configured to fabricate subject intermediate product, the preceding sequence of processes corresponds to a part of the normal routine procedure for manufacturing the industrial product. Afterwards, a photoresist film is coated on the entire surface of the mask film 101, and the photoresist film is then exposed and developed through lithography. The new base body to be processed, which is made up of the mask film 101, the first conducting layer (polysilicon layer) 3, and the tunnel oxide film (gate insulating film) 2, is then etched by reactive ion etching (RIE) using the photoresist film as an etching mask so as to form a plurality of grooves in the new base body to be processed. That is, the mask film 101, the first conducting layer (polysilicon layer) 3, and the tunnel oxide film (gate insulating film) 2, are successively etched by RIE. Furthermore, at the bottoms of the grooves, laid bare surfaces of the semiconductor substrate 1 are further etched so as to form a plurality of grooves in the surface of the semiconductor substrate 1. Removal of the photoresist film, after successive etching is completed, forms parallel 100 nm-deep element isolation grooves 41 extending in a stripe form along the column direction. A plurality of ridge shaped protrusions of the semiconductor substrate 1 sandwiched alternately by the U-shaped element isolation grooves 41 on either side of the subject protrusion become a plurality of strip patterns of the active areas (AAs) extending along the column direction.

Figure 7:
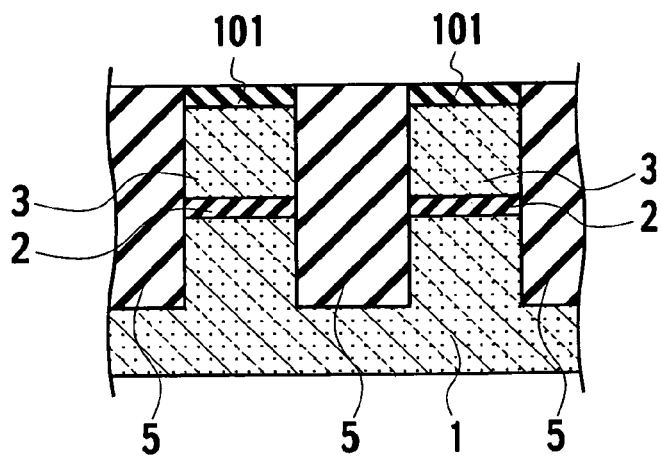
FIG. 7 is a cross-sectional view describing a state of the industrial product when a next process after the process shown in FIG. 6 of normal routine procedure is completed.
Figure 9:
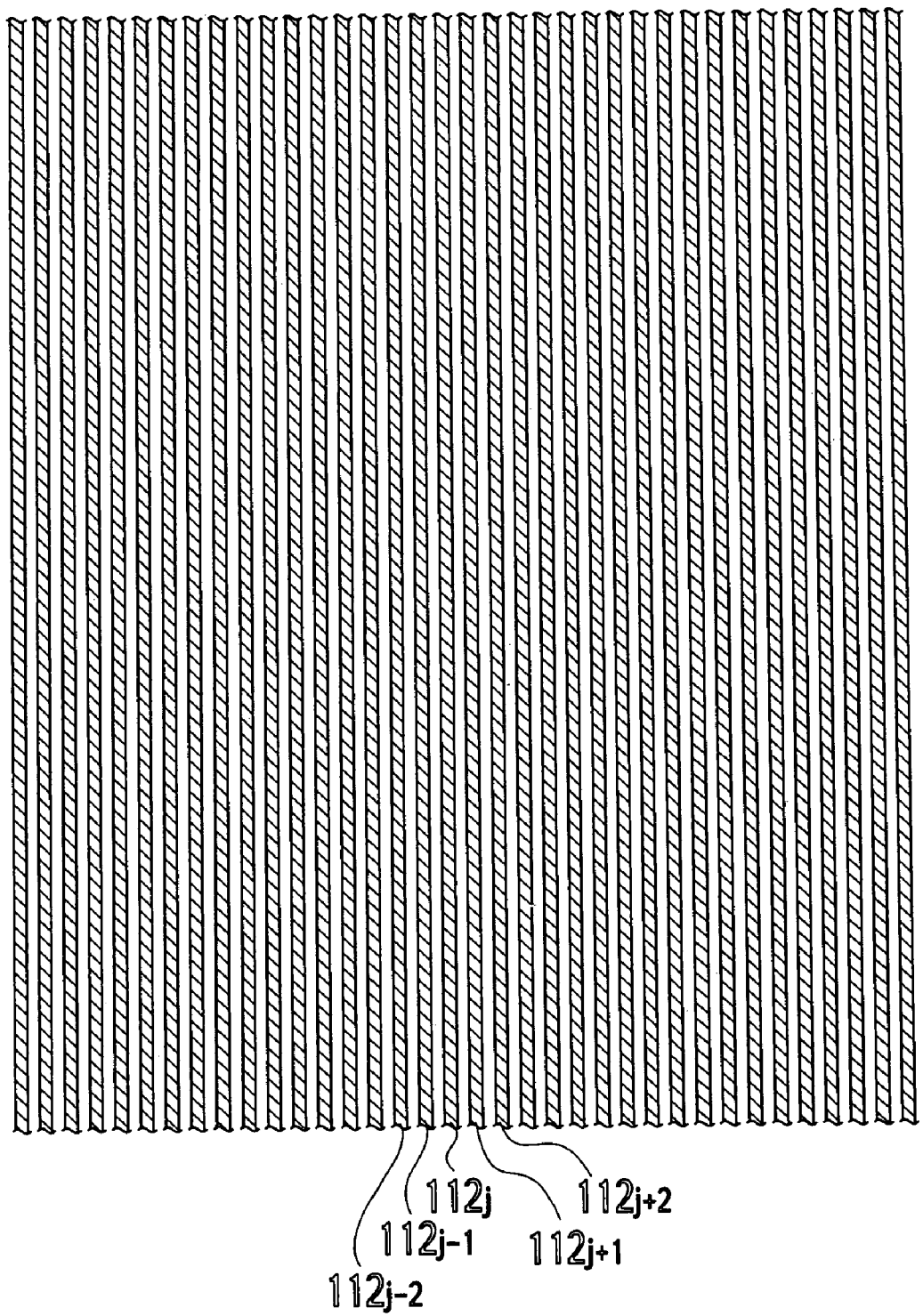
FIG. 9 is a top view showing a state of the industrial product when a process after the step shown in FIG. 8 of the normal routine procedure is completed.

(b) Next, a silicon oxide film 4 for element isolation is deposited across the entirety, completely filling in the element isolation grooves 41. The silicon oxide film 4 on the surface is removed by chemical mechanical polishing (CMP) until the surface of the mask film 101 is made visible, thereby planarizing the surface of the base body as shown in FIG. 7. As a result, element isolation insulators 5 made of a silicon oxide film are embedded in the respective element isolation grooves 41. The exposed mask film 101 is then selectively etched and removed. A top view of the base body, when the process is completed, is shown in FIG. 9, where column-wise multiple strip patterns of the active areas $112_{j-2}$, $112_{j-1}$, $112_j$, $112_{j+1}$, $112_{j+2}$, . . . are aligned as parallel and periodical line-and-space patterns. The normal routine procedure has been described thus far. While omitted from FIG. 7, the element isolation insulators 5 or shallow trench isolations (STIs) are naturally formed in regions of the peripheral circuits 521, 522, 523, 524, shown in FIG. 1. As a result, a plurality of strip patterns of the first conducting layers (floating gate electrodes) 3 are periodically formed in a self aligned manner above the strip patterns of the active areas surrounded alternately by the STI element isolation insulators 5.

Figure 10:
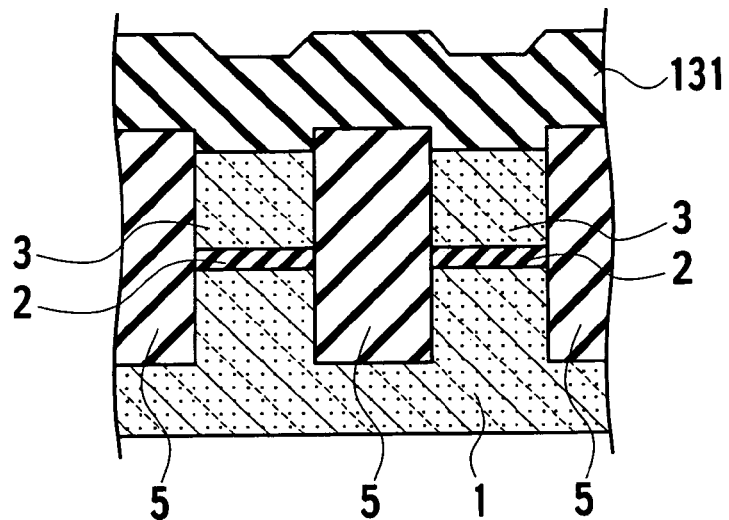
FIG. 10 is a cross-sectional view describing a state in which an interconnect-changing insulator is formed on the base body for carrying out process-level evaluation procedure, which evaluates process levels up to the state of the process shown in FIG. 8, after the process shown in FIG. 8 of the normal routine procedure has been completed.
Figure 11:
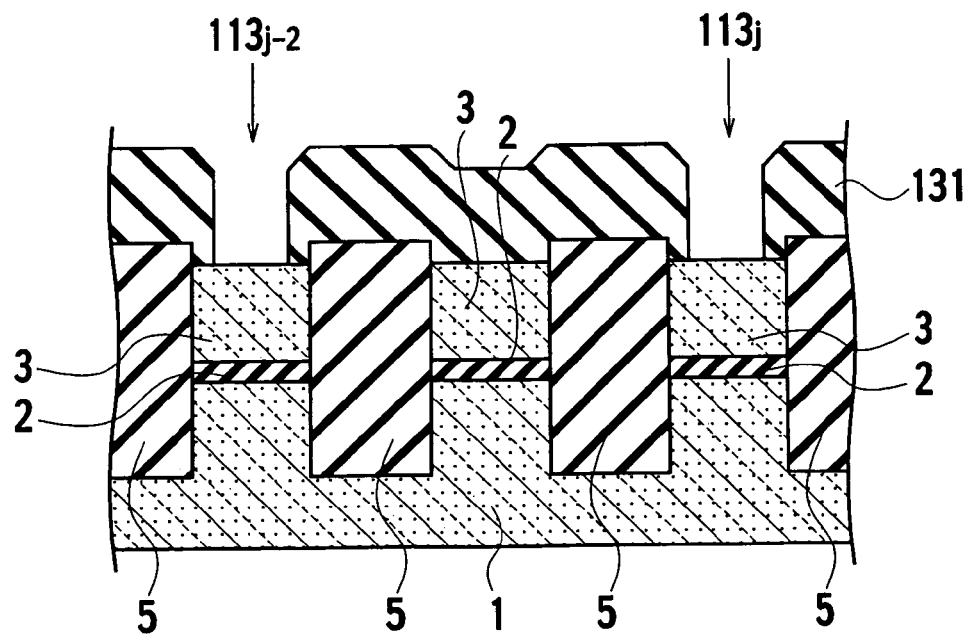
FIG. 11 is a process cross-sectional view describing a state of sampling contact holes formed in the interconnect-changing insulating film shown in FIG. 10 for carrying out the process-level evaluation procedure, which evaluates process levels up to the state of the process shown in FIG. 8.
Figure 12:
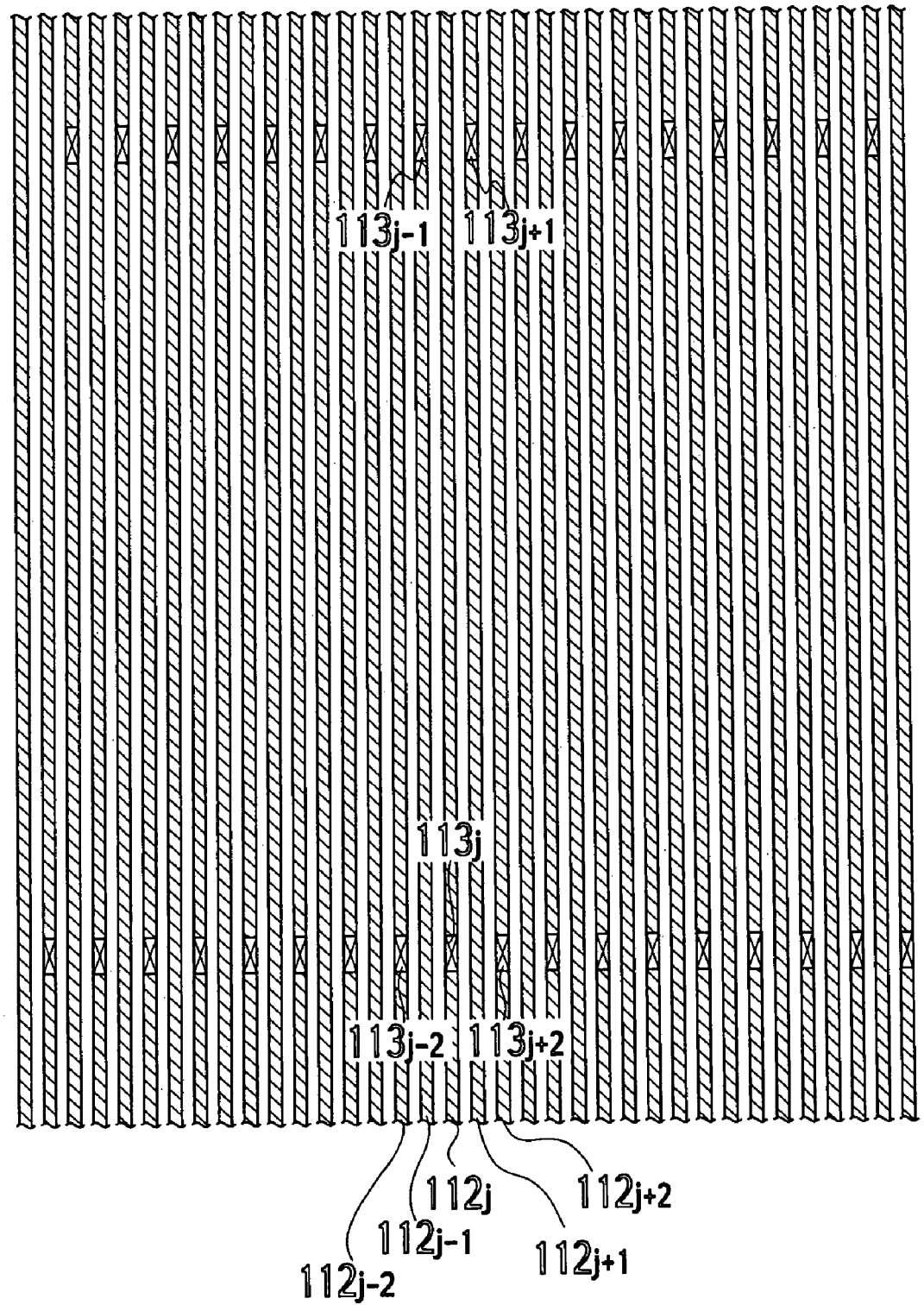
FIG. 12 is a top view corresponding to FIG. 11.

(c) Afterwards, a 50 to 400 nm-thick interconnect-changing insulator 131 made of a silicon oxide film or the like is formed on the first conducting layers (polysilicon layers) 3 by CVD as shown in FIG. 10. A photoresist film not shown in the drawing is coated on the interconnect-changing insulator 131, the photoresist film is exposed and developed through lithography, and the interconnect-changing insulator 131 is then etched by RIE using the photoresist film as an etching mask. The photoresist film is removed, after etching is completed, to form sampling contact holes $113_{j-2}$, $113_j$, . . . in the interconnect-changing insulator 131 shown in FIG. 11 such that parts of the first conducting layers (polysilicon layers) 3 are selectively made bare. A top view of the base body to be processed when the process is completed is shown in FIG. 12, where sampling contact holes $113_{j-2}$, $113_{j-1}$, $113_j$, $113_{j+1}$, $113_{j+2}$, . . . are formed alternately in the respective parallel strip patterns of the active areas $112_{j-2}$, $112_{j-1}$, $112_j$, $112_{j+1}$, $112_{j+2}$, . . . In other words, the sampling contact holes $113_{j-2}$, $113_j$, $113_{j+2}$, . . . are formed periodically in the respective parallel strip patterns of the active areas $112_{j-2}$, $112_j$, $112_{j+2}$, . . . along the row direction shown in the lower part of FIG. 12, and the sampling contact holes $113_{j-1}$, $113_{j+1}$, . . . are formed periodically in the respective parallel strip patterns of the active areas $112_{j-1}$, $112_{j+1}$, . . . along the row direction shown in the upper part of FIG. 12 (where "j" is assumed as an even number).

Figure 13:
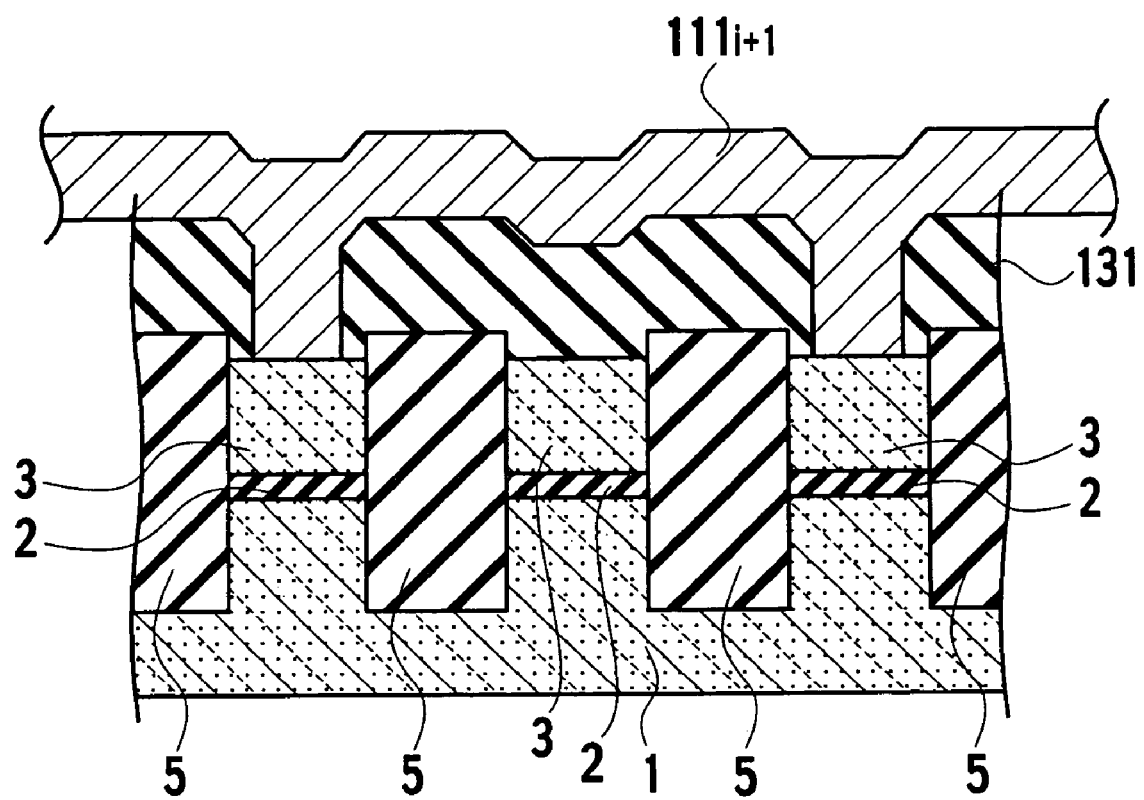
FIG. 13 is a process cross-sectional view describing a state of evaluation interconnects connected to strip patterns of the active areas via the sampling contact holes of FIG. 11 for carrying out process-level evaluation procedure, which evaluates process levels up to the state of the process shown in FIG. 8.
Figure 14:
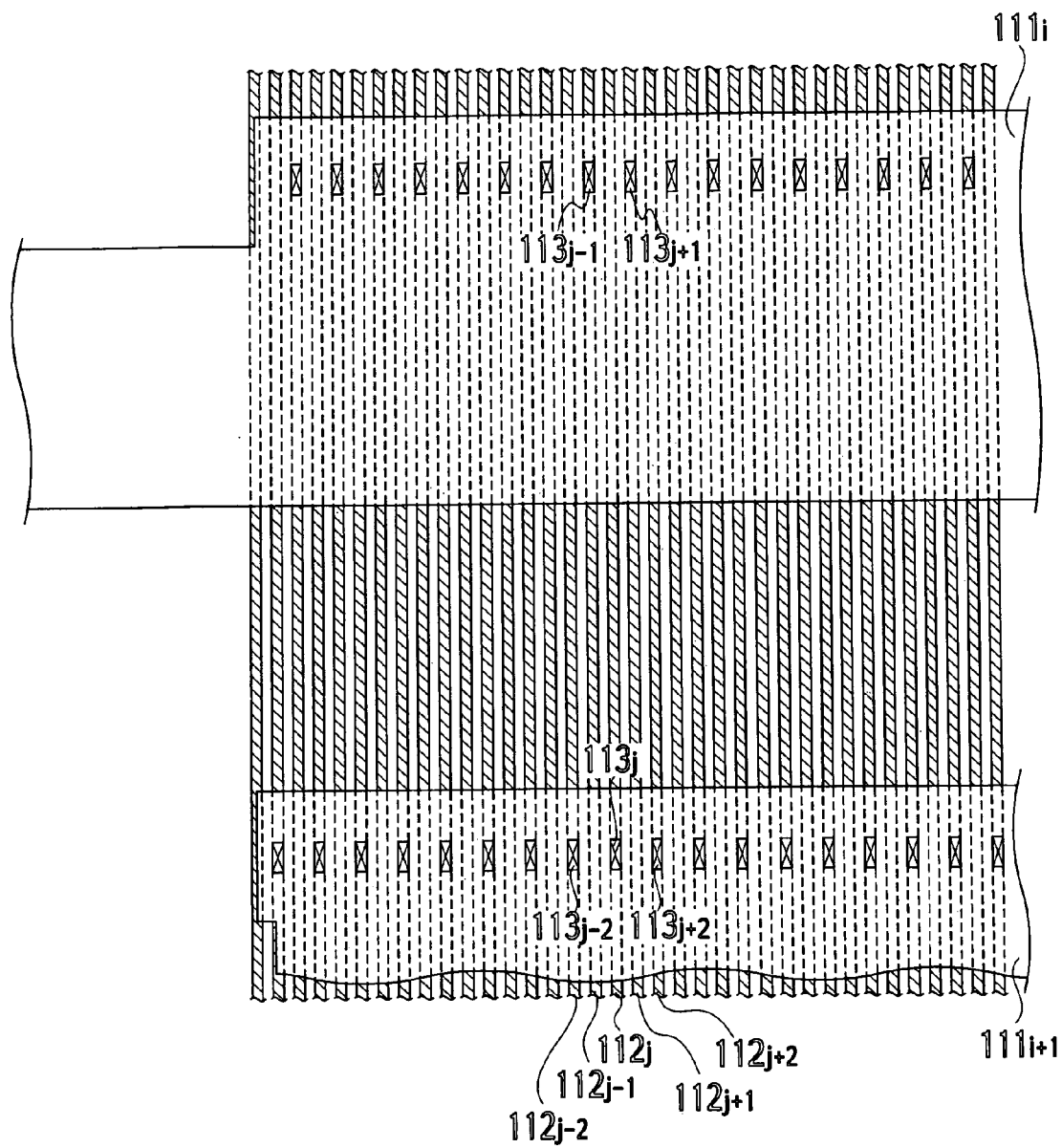
FIG. 14 is a top view of the process-level evaluation pattern (short-circuit failure detecting pattern) corresponding to FIG. 13.
Figure 15:
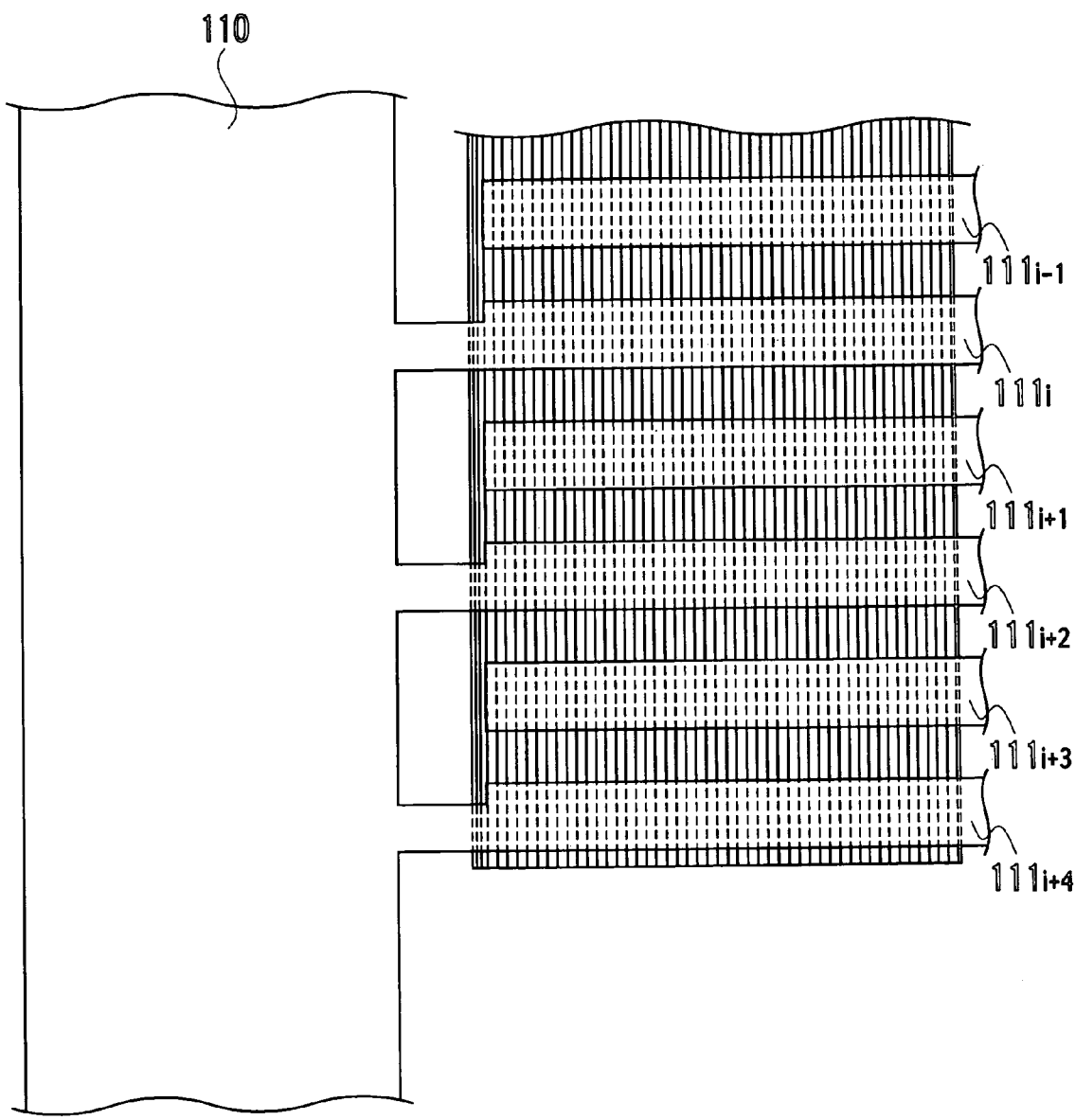
FIG. 15 is a top view of a process-level evaluation pattern (short-circuit failure detecting pattern) across a wide range larger than the view shown in FIG. 14, including an evaluation interconnect located above the evaluation interconnect shown in FIG. 14, and a plurality of evaluation interconnects located below the evaluation interconnect shown in FIG. 14.

(d) A metal film such as Al film is then formed to a thickness of approximately 100 to 800 nm by sputtering or vacuum evaporation. A photoresist film not shown in the drawing is coated on the metal film, the photoresist film is exposed and developed through lithography, and the metal film is then etched by RIE or the like using the photoresist film as an etching mask. Removal of the photoresist film, after etching is completed, delineates a pattern of an extension interconnect for evaluation (hereinafter called "evaluation interconnect") $111_{i+1}$ as shown in FIG. 13. While a top view of the base body when the process shown in FIG. 13 is completed is shown in FIG. 14, a first evaluation interconnect $111_{i+1}$ is connected to the even-numbered sampling contact holes $113_{j-2}$, $113_j$, $113_{j+2}$, . . . aligned along the row direction in the lower part of FIG. 14, and a second evaluation interconnect $111i$ is connected to the odd numbered sampling contact holes $113_{j-1}$, $113_{j+1}$, . . . aligned along the row direction in the upper part of FIG. 14. FIG. 15 is a top view across a large area including evaluation interconnects $111_{i+1}$, . . . located above the evaluation interconnect $111_i$ and evaluation interconnects $111_{i+2}$, $111_{i+3}$, $111_{i+4}$, . . . located below the evaluation interconnect $111_{i+1}$, and a probing pad 110 collecting together the even-numbered second evaluation interconnects $111_i$, $111_{i+2}$, $111_{i+4}$, . . . is also shown (where "i" is assumed as an even number). This probing pad 110 corresponds to one of the probing pads 611, 612, . . . , 620 shown in FIG. 3B, and although omitted from the drawing, another probing pad collecting together the odd numbered first evaluation interconnects $111_{i-1}$, $111_{i+1}$, $111_{i+3}$, . . . is naturally located on the right side of FIG. 15. Making tips of testing probes touch the respective probing pad 110 shown in FIG. 15 and the probing pad located on the right side of FIG. 15 and then measuring resistance between the probing pads achieves detection of short-circuit failures between adjacent fingers of respective strip patterns of the active areas $112_{j-2}$, $112_{j-1}$, $112_j$, $112_{j+1}$, $112_{j+2}$, . . . extending in parallel with the topology of the even-numbered active areas $112_{j-2}$, $112_j$, $112_{j+2}$, . . . and the odd numbered active areas $112_{j-1}$, $112_{j+1}$, . . . facing each other interdigitally.

According to the embodiment of the present invention as described above, easy detection of short-circuit failures and evaluation of the process levels is possible by providing two additional evaluation masks, configured to change a part of electrical connection of the intermediate product pattern implemented by the routinely employed working masks, in combination with the set of working masks, without preparing an exclusive set of process-level evaluation masks.

Furthermore, as is apparent from FIGS. 14 and 15, since the patterns of the evaluation interconnects $111_{i-1}$, $111_i$, $111_{i+1}$, $111_{i+2}$, $111_{i+3}$, $111_{i+4}$, . . . for extracting electrical information of specified portions on the semiconductor wafer to the outside of the semiconductor chip, in combination with the set of the working masks, can be delineated with sufficiently large dimensions compared to the minimum feature size F, not only is production of the mask itself easy, lithography and etching in the process-level evaluation procedure are also easy and simple, and therefore the process-level evaluation procedure can be accomplished in a short period.

Figure 42:
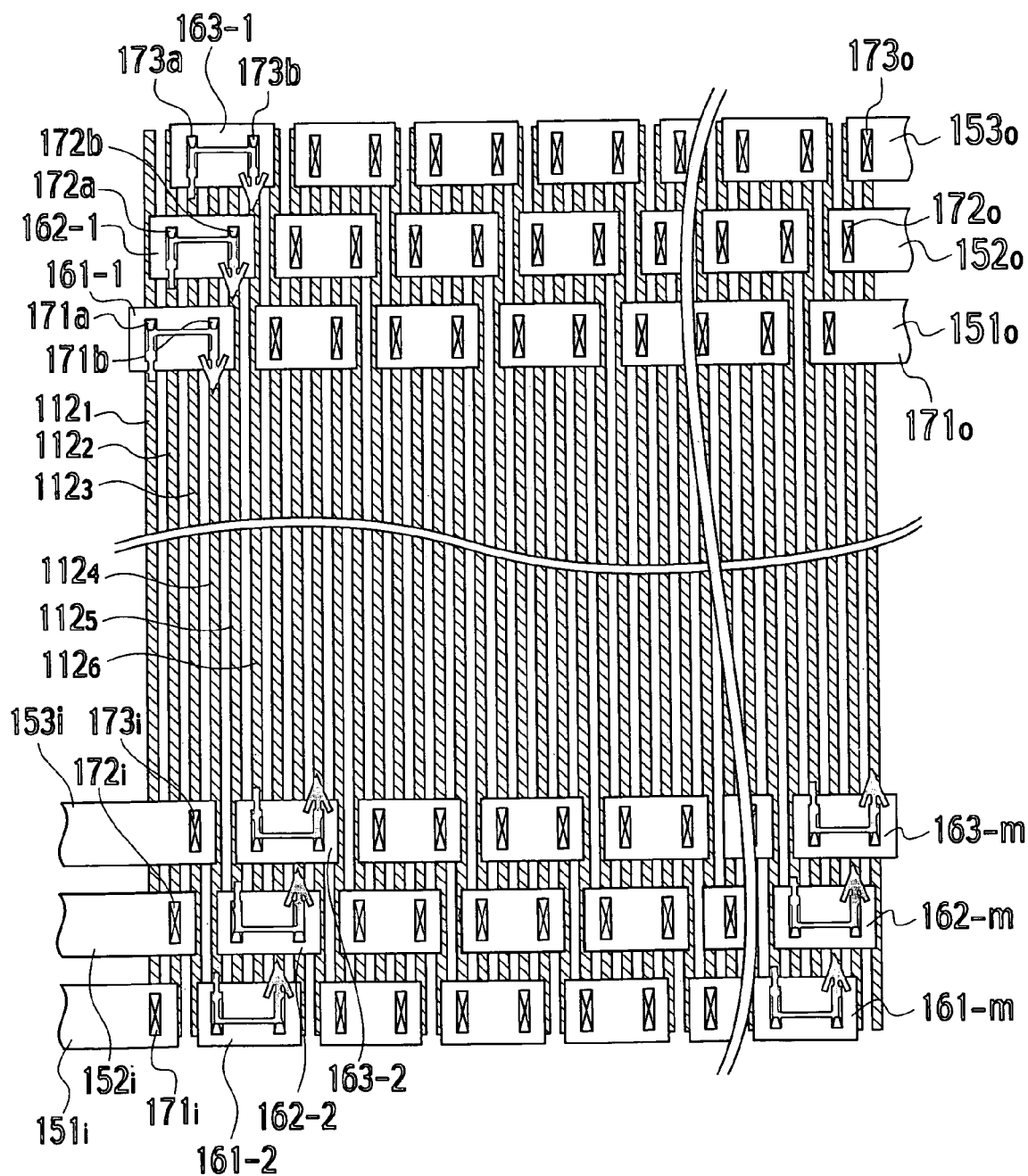
FIG. 42 is a top view describing a state of a process-level evaluation pattern (open-circuit failure detecting pattern) formed through a sequence of processes using additional masks after the process shown in FIG. 8.

As shown in FIG. 15, short-circuit failures can be detected by interdigitally facing the even-numbered active areas $112_{j-2}$, $112_j$, $112_{j+2}$, . . . with the odd numbered active areas $112_{j-1}$, $112_{j+1}$, . . . and then measuring the resistance therebetween. As shown in FIG. 42, open-circuit failures can be detected by connecting in series the strip patterns of the active areas $112_{j-2}$, $112_{j-1}$, $112_j$, $112_{j+1}$, $112_{j+2}$, . . . extending parallel along the column direction using a plurality of auxiliary connection-changing interconnects 161-1, 161-2, . . . , 161-m; 162-1, 162-2, . . . , 162-m; 163-1, 163-2, . . . , 163-m, into a plurality of meander lines, and then measuring the resistance between opposing terminals in each of the meander lines.

FIG. 42 exemplifies a parallel arrangement of a first meander line connected using a plurality of auxiliary connection-changing interconnects 161-1, 161-2, . . . , and 161-m, a second meander line connected using a plurality of auxiliary connection-changing interconnects 162-1, 162-2, . . . , and 162-m, and a third meander line connected using a plurality of auxiliary connection-changing interconnects 163-1, 163-2, . . . , and 163-m; however the number of meander lines is not limited to three. Increase in the number of meander lines facilitates identification of locations of open-circuit failures. In other words, in the case of three meander lines, as shown in FIG. 42, the auxiliary connection-changing interconnects 161-1, 161-2, . . . , and 161-m; 162-1, 162-2, . . . , and 162-m; 163-1, 163-2, . . . , and 163-m turn back (loop back), skipping every two strip patterns of the active areas, to make a serial connection in meander line topology. For example, the auxiliary connection-changing interconnect 161-1 loops back from the far left end active area 1121 to the fourth from the left active area 1124 via the sampling contact holes 171a and 171b connecting in series, the auxiliary connection-changing interconnect 162-1 loops back from the second from the left active area 1122 to the fifth from the left active area 1125 via the sampling contact holes 172a and 172b connecting in series, and the auxiliary connection-changing interconnect 163-1 loops back from the third from the left end active area 1123 to the sixth from the left active area 1126 via the sampling contact holes 173a and 173b connecting in series. In the same manner, the auxiliary connection-changing interconnects can turn back, skipping every three strip patterns of the active areas, to serially connect them in the case of four meander lines while the auxiliary connection-changing interconnects can turn back, skipping every four strip patterns of the active areas, to serially connect them in the case of five meander lines. Note that while a cross-sectional structure corresponding to FIG. 42 is omitted, it is basically the same as FIG. 13, where the sampling contact holes 171a, 171b; 172a, 172b; 173a, 174b; . . . are formed in the interconnect-changing insulator 131 provided on the first conducting layer (polysilicon layer) 3 so as to selectively make bare a plurality of parts of the first conducting layer (polysilicon layer) 3.

One end of the first meander line is connected to a evaluation interconnect wing 151i via a sampling contact hole 171i while the other end of the first meander line is connected to a evaluation interconnect wing 151o via a sampling contact hole 171o. The evaluation interconnect wings 151i and 151o are each connected to a couple of probing pads omitted from the drawing. Therefore, making tips of testing probes touch the respective probing pads and measuring resistance between the probing pads achieves detection of open-circuit failures.

Similarly, one end of the second meander line is connected to a evaluation interconnect wing 152i via a sampling contact hole 172i while the other end of the second meander line is connected to a evaluation interconnect wing 152o via a sampling contact hole 172o. The evaluation interconnect wings 152i and 152o are each connected to a couple of probing pads omitted from the drawing.

Furthermore, one end of the third meander line is connected to a evaluation interconnect wing 153i via a sampling contact hole 173i while the other end thereof is connected to a evaluation interconnect wing 153o via a sampling contact hole 173o. The evaluation interconnect wings 153i and 153o are each connected to a couple of probing pads omitted from the drawing. Accordingly, making tips of testing probes touch the respective corresponding probing pads and measuring resistance between the probing pads achieves detection of open-circuit failures.

According to the embodiment of the present invention as described above, detection of open-circuit failures is possible by using a routinely employed working masks and providing two additional evaluation masks, configured to change a part of electrical connection of the intermediate product pattern implemented by the set of working masks, without preparing an exclusive set of process-level evaluation masks.

In recent years, as miniaturization advances, production of a perfect mask becomes more difficult. Particularly, with the NAND flash memory, a mask having many miniaturized fine line-and-space patterns with a minimum feature size F of 100 to 150 nm or less as shown in FIG. 9 is needed. With present products, such production of a perfect mask is difficult, and a mask having many fine line-and-space patterns with a certain defect is often applied.

Furthermore, a mask actually in use may be damaged for one reason or another. For example, a growing mask defect, which may cause a short-circuit failure between adjacent lines, the short-circuit failure may be generated by a photo-catalyst action caused by ammonia or the like in the air. Although the growing mask defect is often removable through rinsing the working mask, a mask material such as a chrome (Cr) film or a chrome oxide ($Cr_2O_3$) film may peel off from the working mask, and in that case, frequent rinsing of the working mask has limitations since the mask material needs to be regenerated. Accordingly, pre-checking the working mask before subject exposure process is important. However, since a growing mask defect grows over time, results of pre-checking the working mask before the subject exposure process and an actual image transferred onto the semiconductor wafer may not be identical.

If exposing the image of a defective pattern using a working mask including a defect, the image of the defect is also transferred onto the semiconductor wafer. In other words, if exposing the image of a defective pattern using a working mask having a defect, the defective pattern causing a short-circuit failure between adjacent lines, an actual device defect 121, which may cause a short-circuit failure between adjacent actual lines, will generate, as shown in FIG. 16.

Figure 16:
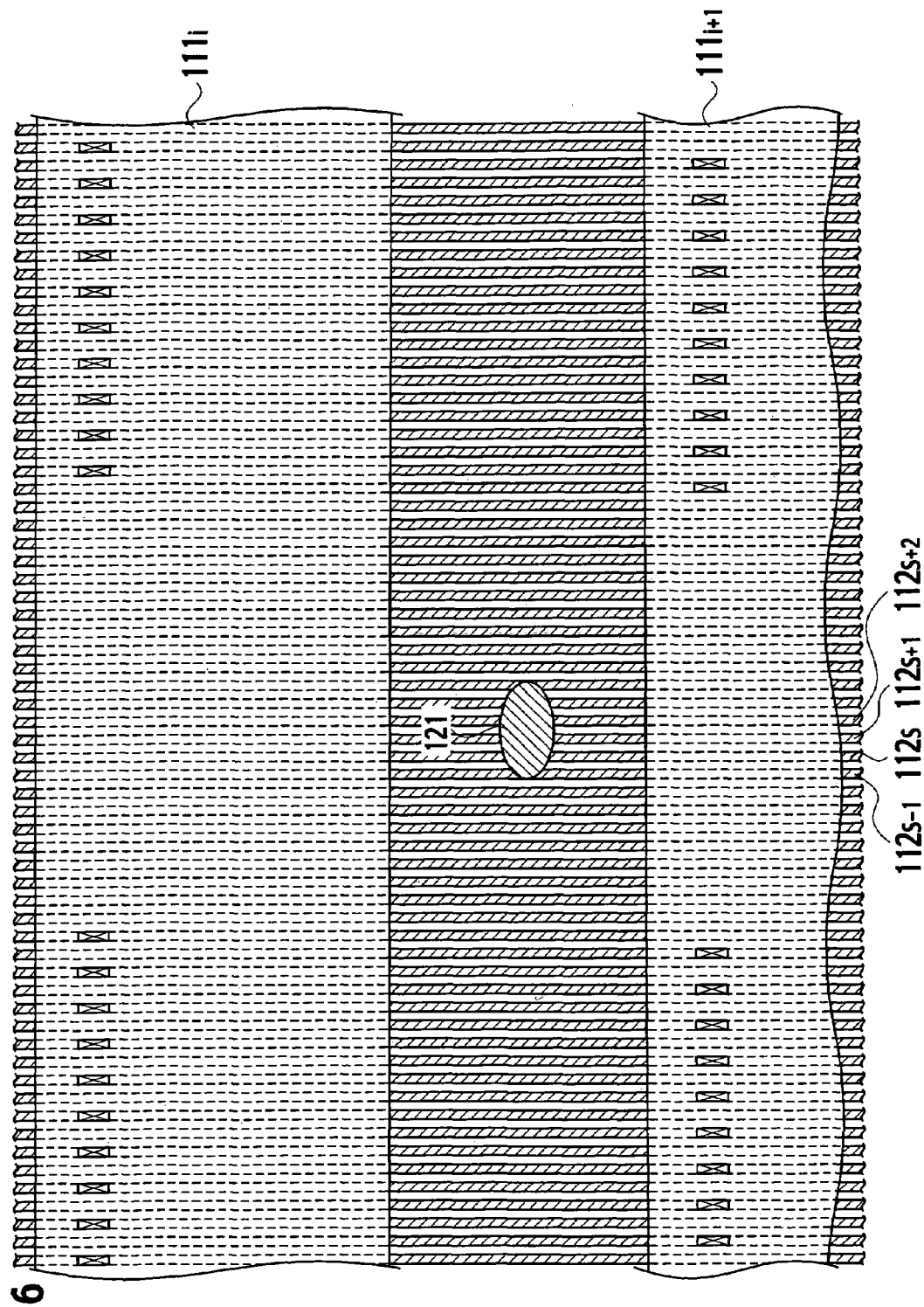
FIG. 16 is a top view showing an exemplary process-level evaluation pattern (short-circuit failure detecting pattern) schemed so as not to be adversely affected by pattern defects (short-circuit failures) occurring in any process up to the state of the process shown in FIG. 8.
Figure 17A:
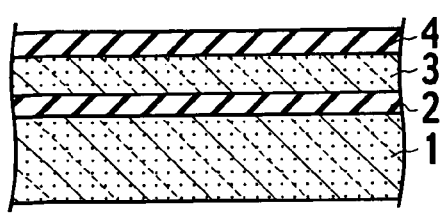
FIG. 17A is a process cross-sectional view describing a state of the industrial product when a next process after the process after the process shown in FIG. 8 is completed in the normal routine procedure, showing a part of the memory cell array cut along the direction of the bit lines (data transfer lines) of FIG. 2.
Figure 17B:
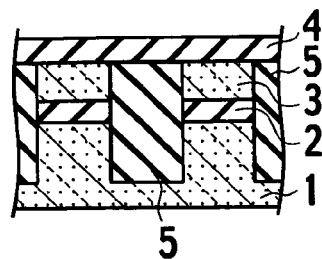
FIG. 17B is a process cross-sectional view describing a state of the industrial product when a next process after the process shown in FIG. 8 is completed in the normal routine procedure, showing a part of the memory cell array cut along the direction of the word lines of FIG. 2.

With the embodiment of the present invention, when generation of the pattern defect 121 is confirmed during pre-checking of the working mask before subject exposure process, or during arbitrary checking of an actual device pattern transferred onto the semiconductor wafer, a working mask not allocating sampling contact holes in the corresponding active areas is newly prepared to prevent adverse affects from the pattern defect 121, as shown in FIG. 16.

Figure 43:
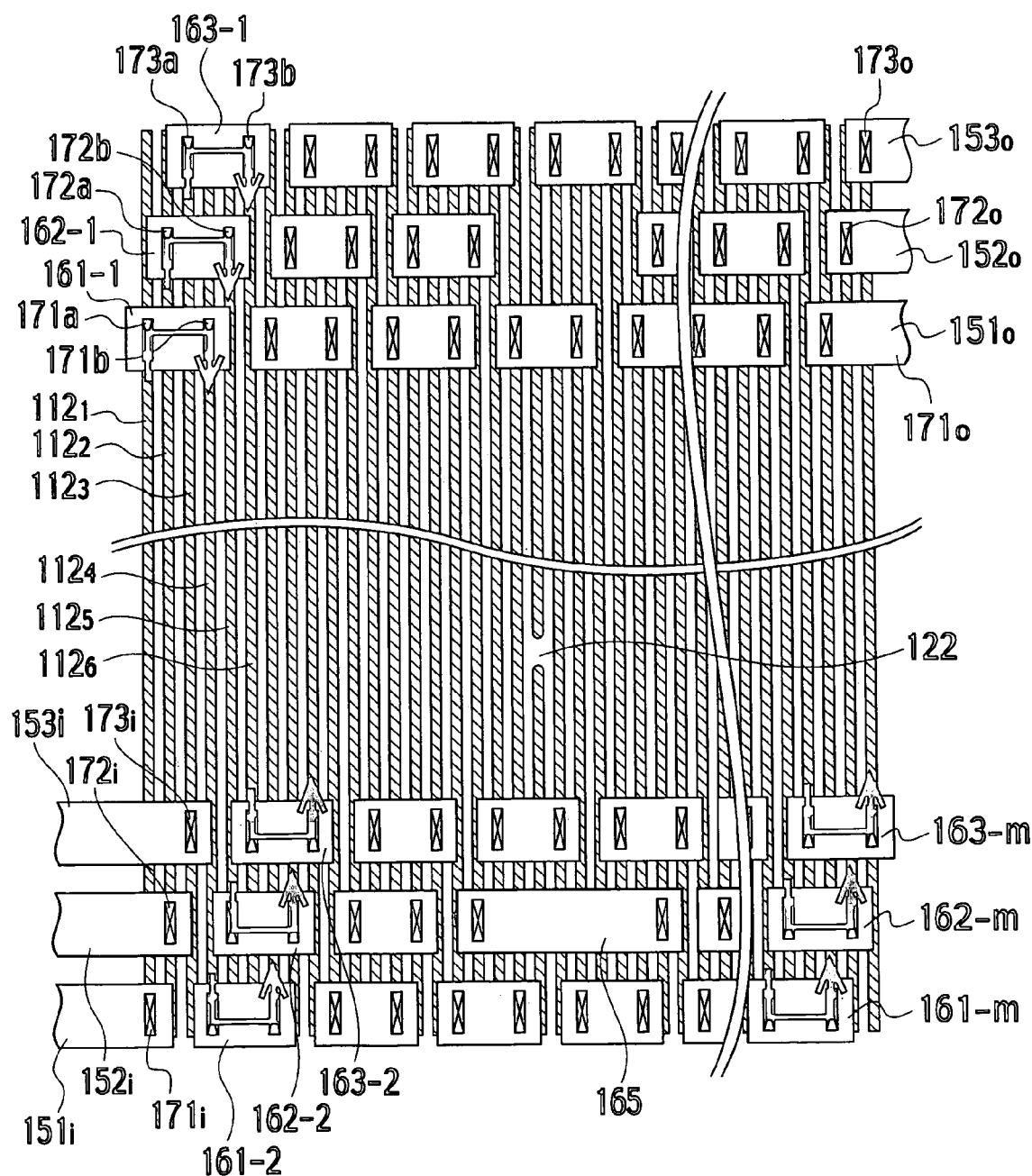
FIG. 43 is a top view showing an exemplary process-level evaluation pattern (open-circuit failure detecting pattern) schemed so as not to be adversely affected by pattern defects (open-circuit failures) occurring in any process up to the state of the process shown in FIG. 8.

Meanwhile, when generation of a pattern defect (open-circuit failure) 122 is confirmed during pre-checking of the working mask before subject exposure process, or during arbitrary extracted checking of an actual device pattern transferred onto the semiconductor wafer, a working mask not allocating a sampling contact hole in the corresponding active area is prepared to prevent adverse affects from the pattern defect (open-circuit failure) 122, as shown in FIG. 43. In other words, removal of the sampling contact hole from the stripe-shaped active area in which the open-circuit failure 122 is generated, and connecting it to a subsequent cycle meander line in the periodic arrangement of the meander lines using a bridging interconnect 165 achieves prevention of adverse affects from the open-circuit failure 122. As shown in FIG. 43, in the case of skipping one cycle in the periodic arrangement of the meander lines, the length of the bridging interconnect 165 measured along the row direction is approximately twice that of the other auxiliary connection-changing interconnects 162-1, 162-2, ..., and 162-m.

While FIG. 43 exemplifies the case where the pattern defect (open-circuit failure) 122 is generated in a single active area, adverse affects from a short-circuit failure can be prevented, even if the short-circuit failure generates due to a growing working mask defect as with FIG. 16, by removing the sampling contact holes from all of the strip patterns of the active areas in which the short-circuit failure is generated and then connecting them to subsequent cycle meander lines in the periodic arrangement of the meander lines using the bridging interconnect 165. In this case, since a plurality of active area stripes contribute, a plurality of bridging interconnects are required. In addition, in the case of the short-circuit failure, a necessity of jumping two cycles in the periodic arrangement of the meander lines may occur, and in that case, the length of the bridging interconnect 165 is approximately three times or more that of the standard auxiliary connection-changing interconnects 161-1, 161-2, ..., 161-m; 162-1, 162-2, ..., 162-m; 163-1, 163-2, ..., and 163-m.

As such, according to the embodiment of the present invention, a process-level evaluation pattern, which can characterize the defect on the intermediate product pattern, can be provided in combination with the set of working masks. The pattern defects 121 and 122 may become critical by themselves, depending on the extent of defectiveness, or alternatively, can become a critical defect through a process-dependent combination with the pattern defect on the semiconductor wafer. However, according to the embodiment of the present invention, since open-circuit characteristics and short-circuit characteristics of the intermediate product pattern, directly pertaining to the final product of semiconductor integrated circuit, are tested, generation of open-circuit failures and short-circuit failures in combination with the fluctuation of process conditions of the actual production of the semiconductor integrated circuit may be prevented by regular periodical testing through an accelerated test in which the process conditions are intentionally changed.

Intermediate Product With Word Line

The normal routine procedure up to the delineation process of word lines, after the aforementioned procedure up to formation process of the active areas (AAs), and process-level evaluation procedure accompanying the delineation process of the word lines are described using FIGS. 17 through 25.

Figure 8:
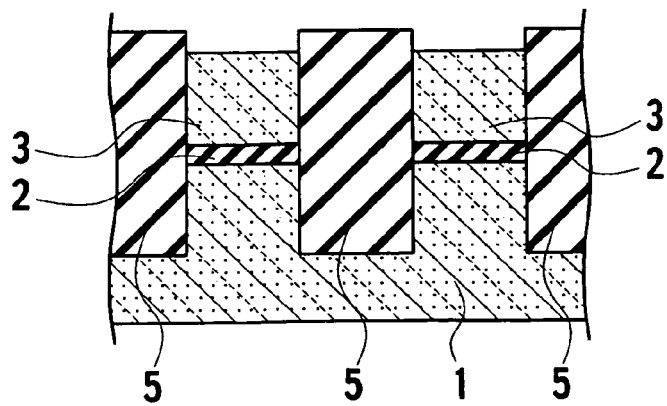
FIG. 8 is a cross-sectional view describing a state of the industrial product when a next process after the process shown in FIG. 7 of the normal routine procedure is completed.

In the same manner as the process up to the formation process of the active areas (AAs), the NAND flash memory fabrication method and the accompanying process-level evaluation method given below are merely an example, and other various methods are available including modifications of these methods. Similarly, disclosed patterns are also merely examples, and it is needless to say that other various patterns may be used. FIGS. 17A, 18A, 19A, 20A and 21A are process cross-sectional views showing a part of the memory cell array 520 cut along the direction of the bit lines (data transfer lines) $BL_{2j-1}$, $BL_{2j}$, $BL_{2j+1}$, ... of FIG. 2, respectively, and FIGS. 17B, 18B, 19B, 20B and 21B are process cross-sectional views showing a part of the memory cell array 520 cut along the direction of the word lines $WL_{1k}$, $WL_{2k}$, ..., $WL_{32k}$, $WL_{32k}$, $WL_{1k-1}$, ... of FIG. 2, respectively. Each of FIGS. 17B, 18B, 19B, 20B and 21B corresponds to a turn back region of two adjacent memory cell columns, and is equivalent to a process cross-sectional view of select transistors $QSG_k$ and $QSG_{k-1}$ belonging to respective different memory cell columns. (a) Once the process-level evaluation procedure accompanying the formation process of the active areas (AAs) is completed, the procedure returns to the normal routine procedure. In the normal routine procedure, the aforementioned state of cross-sectional structure of the intermediate product shown in FIG. 8 is defined as a new base body to be processed. That is, the new base body is defined by the preceding intermediate product shown in FIG. 8 fabricated by the preceding sequence of processes, which corresponds to a part of the normal routine procedure for manufacturing the industrial product (final product). At first, an aluminum oxide ($AL_2O_3$) film (alumina film), which is a dielectric material, is deposited as an inter-electrode insulator 4 across the entirety of the new base body, including the surfaces of the stripe-shaped element isolation insulators 5 and the surfaces of the stripe-shaped first conducting layers 3 alternately arranged with the element isolation insulators 5, by CVD. Note that various insulating films other than the alumina film are available as a "high dielectric insulating film" used as the inter-electrode insulator 4. Particularly, with nonvolatile semiconductor memory miniaturized to have a minimum feature size F of 100 nm or less, from the relationship in coupling capacitance between the first conducting layers (floating gate electrodes) 3 and the second conducting layers (control gate electrodes) 7, a material with a larger dielectric constant $\epsilon_r$ than that of $SiO_2$ film is preferable. More specifically, it is preferable to have approximately the same or greater dielectric constant $\epsilon_r$ of 5 to 5.5 obtained with the ONO film employed in the earlier technology. For example, a single layer film of any one of a strontium oxide (SrO) film where $\epsilon_r$ is 6, a silicon nitride ($Si_3N_4$) film where $\epsilon_r$ is 7, an aluminum oxide ($Al_2O_3$) film where $\epsilon_r$ is 8 to 11, a magnesium oxide (MgO) film where $\epsilon_r$ is 10, a yttrium oxide ($Y_2O_3$) film where $\epsilon_r$ is 16 to 17, a hafnium oxide ($HfO_2$) film where $\epsilon_r$ is 22 to 23, a zirconium oxide ($ZrO_2$) film where $\epsilon_r$ is 22 to 23, a tantalum oxide ($Ta_2O_5$) film where $\epsilon_r$ is 25 to 27, and a bismuth oxide ($Bi_2O_3$) film where $\epsilon_r$ is 40, or a composite film made up of a plurality of layers thereof may be used. $Ta_2O_5$ and $Bi_2O_3$ is deficient in thermal stability at the interface with the polysilicon (note that the values of the respective dielectric constants $\epsilon_r$ exemplified here may change according to fabrication method, and therefore may deviate from these values). Furthermore, a composite film of these layers and a silicon oxide film may also be used. The composite film may have a stacked structure of three or more layers. In other words, an insulating film in which at least a portion is made of a material having the above dielectric constant $\in_r$ of 5 to 6 or greater is preferable. However, in the case of a composite film, selection of a combination where the effective dielectric constant $\epsilon_{reff}$ measured for the entire film is 5 to 6 or greater is preferred. When the inter-electrode insulator 4 has an effective dielectric constant $\epsilon_{reff}$ of less than 6, because it is approximately the same as that of the ONO film, better performance of the NAND flash memory than the memory with ONO film cannot be expected, however, there is no intention of excluding use of the ONO film. Furthermore, an insulating film made of a ternary compound such as a hafnium aluminate (HfAlO) film may also be used. In other words, an oxide including at least one element of strontium (Sr), aluminum (Al), magnesium (Mg), yttrium (Y), hafnium (Hf), zirconium (Zr), tantalum (Ta) or bismuth (Bi), or a silicon oxide including these elements may be used as the inter-electrode insulator 4. Note that a ferroelectric such as strontium titanate ($SrTiO_3$) or barium strontium titanate ($BaSrTiO_3$) may also be used as the high dielectric insulating film material; however, deficiency in thermal stability at the interface with the polysilicon and hysteresis characteristics of the ferroelectric need to be taken into consideration. As such, various insulating films other than an alumina film may be employed as the inter-electrode insulator 4. Although the case where such an alumina film is employed as the inter-electrode insulator 4 is exemplified, it is apparent from the above description that the present invention is not limited the case in which alumina film is employed as the inter-electrode insulator 4.

Figure 18A:
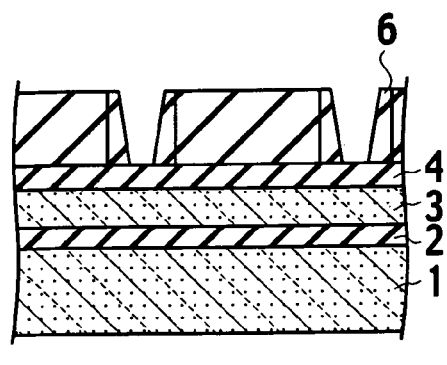
FIG. 18A is a process cross-sectional view describing a state of the industrial product when a next process after the process shown in FIG. 17A is completed in the normal routine procedure, showing a part of the memory cell array cut along the direction of the bit lines (data transfer lines) of FIG. 2.
Figure 18B:
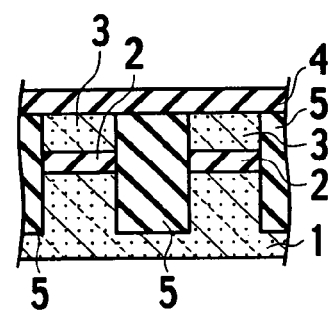
FIG. 18B is a process cross-sectional view describing a state of the industrial product when a next process after the process shown in FIG. 17B is completed in the normal routine procedure, showing a part of the memory cell array cut along the direction of the word lines of FIG. 2.
Figure 19A:
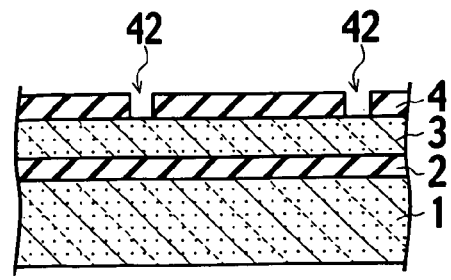
FIG. 19A is a process cross-sectional view describing a state of the industrial product when a next process after the process shown in FIG. 18A is completed in the normal routine procedure, showing a part of the memory cell array cut along the direction of the bit lines (data transfer lines) of FIG. 2.
Figure 19B:
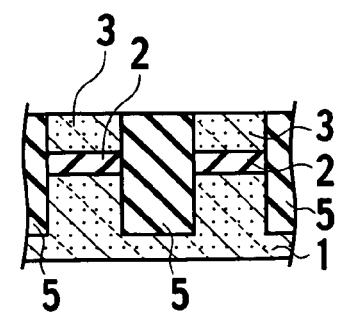
FIG. 19B is a process cross-sectional view describing a state of the industrial product when a next process after the process shown in FIG. 18B is completed in the normal routine procedure, showing a part of the memory cell array cut along the direction of the word lines of FIG. 2.

(b) Next, a first tetraethyl orthosilicate (first TEOS) film is deposited as a mask material across the entirety. A photoresist film not shown in the drawing is coated on the first TEOS film, the photoresist film is exposed and developed through lithography, 200 nm openings are formed in the photoresist film of regions in which the select transistors $QSG_k$ and $QSG_{k-1}$ are scheduled to be formed, and the first TEOS film is then etched by RIE using the photoresist film as an etching mask. Afterwards, the photoresist film is removed, a second TEOS film is deposited to a thickness of approximately 60 nm, the second TEOS film is etched by RIE, and as shown in FIG. 18A, sidewalls are formed in the openings. The inter-electrode insulator ($Al_2O_3$) 4 is etched using an etchant having a large selectivity to silicon, a silicon oxide such as hot phosphoric acid ($H_3PO_4$), and RIE using the first and the second TEOS film as an etching mask, and inter-electrode connection holes 42 are formed, as shown in FIG. 19A, in the select transistor formation regions. The first and the second TEOS film are then removed using hydrofluoric acid (HF) or the like, as shown in FIGS. 19A and 19B.

Figure 20A:
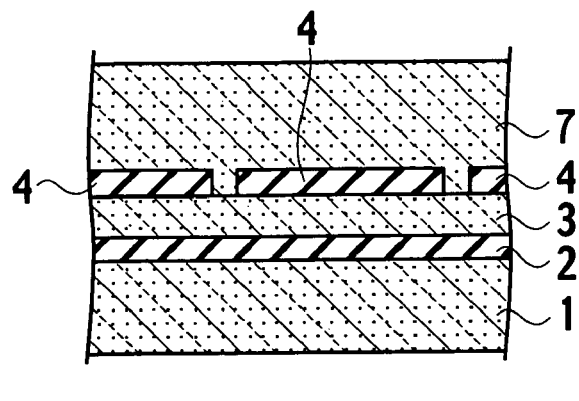
FIG. 20A is a process cross-sectional view describing a state of the industrial product when a next process after the process shown in FIG. 19A is completed in the normal routine procedure, showing a part of the memory cell array cut along the direction of the bit lines (data transfer lines) of FIG. 2.
Figure 20B:
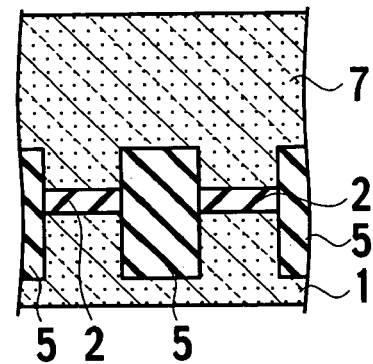
FIG. 20B is a process cross-sectional view describing a state of the industrial product when a next process after the process shown in FIG. 19B is completed in the normal routine procedure, showing a part of the memory cell array cut along the direction of the word lines of FIG. 2.
Figure 21A:
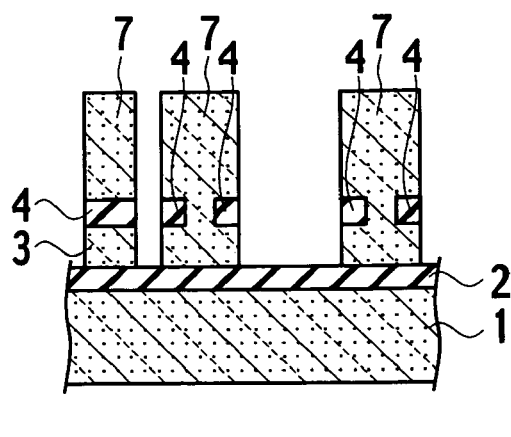
FIG. 21A is a process cross-sectional view describing a state of the industrial product when a next process after the process shown in FIG. 20A is completed in the normal routine procedure, showing a part of the memory cell array cut along the direction of the bit lines (data transfer lines) of FIG. 2.
Figure 21B:
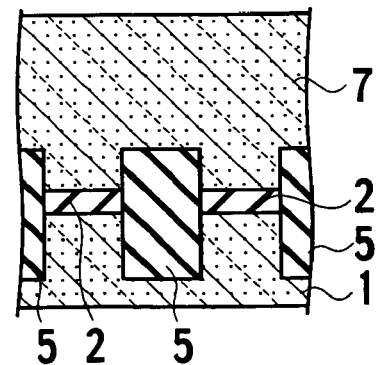
FIG. 21B is a process cross-sectional view describing a state of the industrial product when a process after the shown in FIG. 20B is completed in the normal routine procedure, showing a part of the memory cell array cut along the direction of the word lines of FIG. 2.
Figure 22:
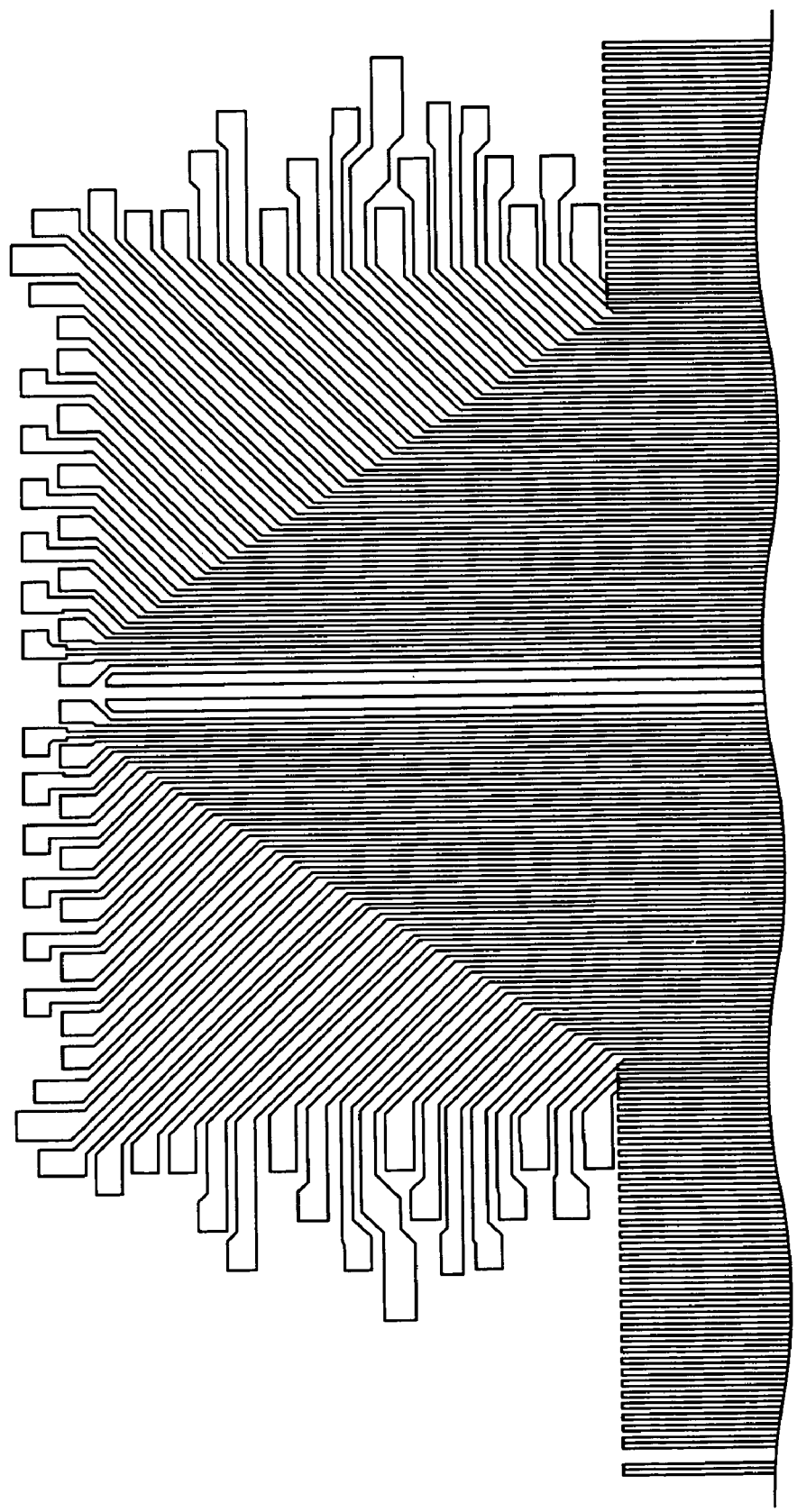
FIG. 22 is a top view corresponding to FIGS. 21A and 21B.
Figure 23A:
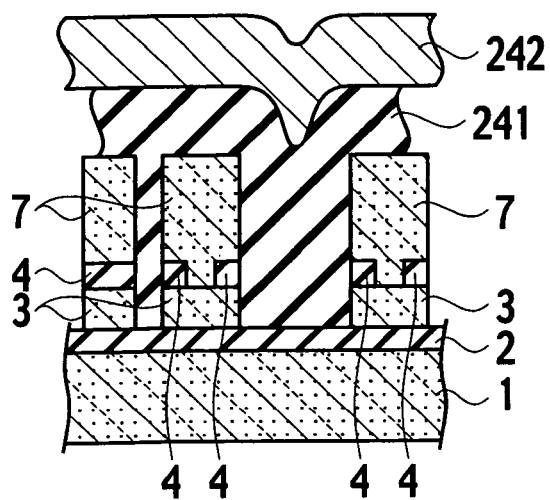
FIG. 23A is a process cross-sectional view describing a state of a process-level evaluation pattern (short-circuit failure detecting pattern) formed through a sequence of processes using additional masks after the process shown in FIG. 21A is completed in the normal routine procedure, showing a part of the memory cell array cut along the direction of the bit lines (data transfer lines) of FIG. 2.
Figure 23B:
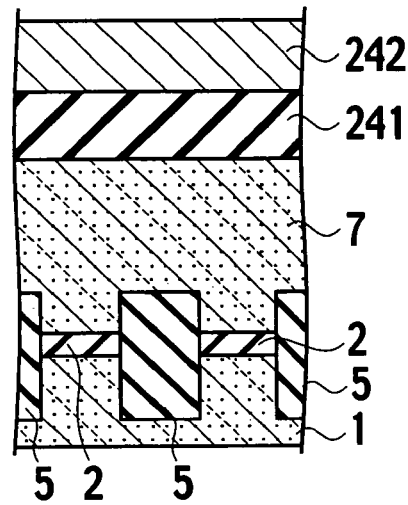
FIG. 23B is a process cross-sectional view describing a state of a process-level evaluation pattern (short-circuit failure detecting pattern) formed through a sequence of processes using additional masks after the process shown in FIG. 21B is completed in the normal routine procedure, showing a part of the memory cell array cut along the direction of the word lines of FIG. 2.
Figure 24:
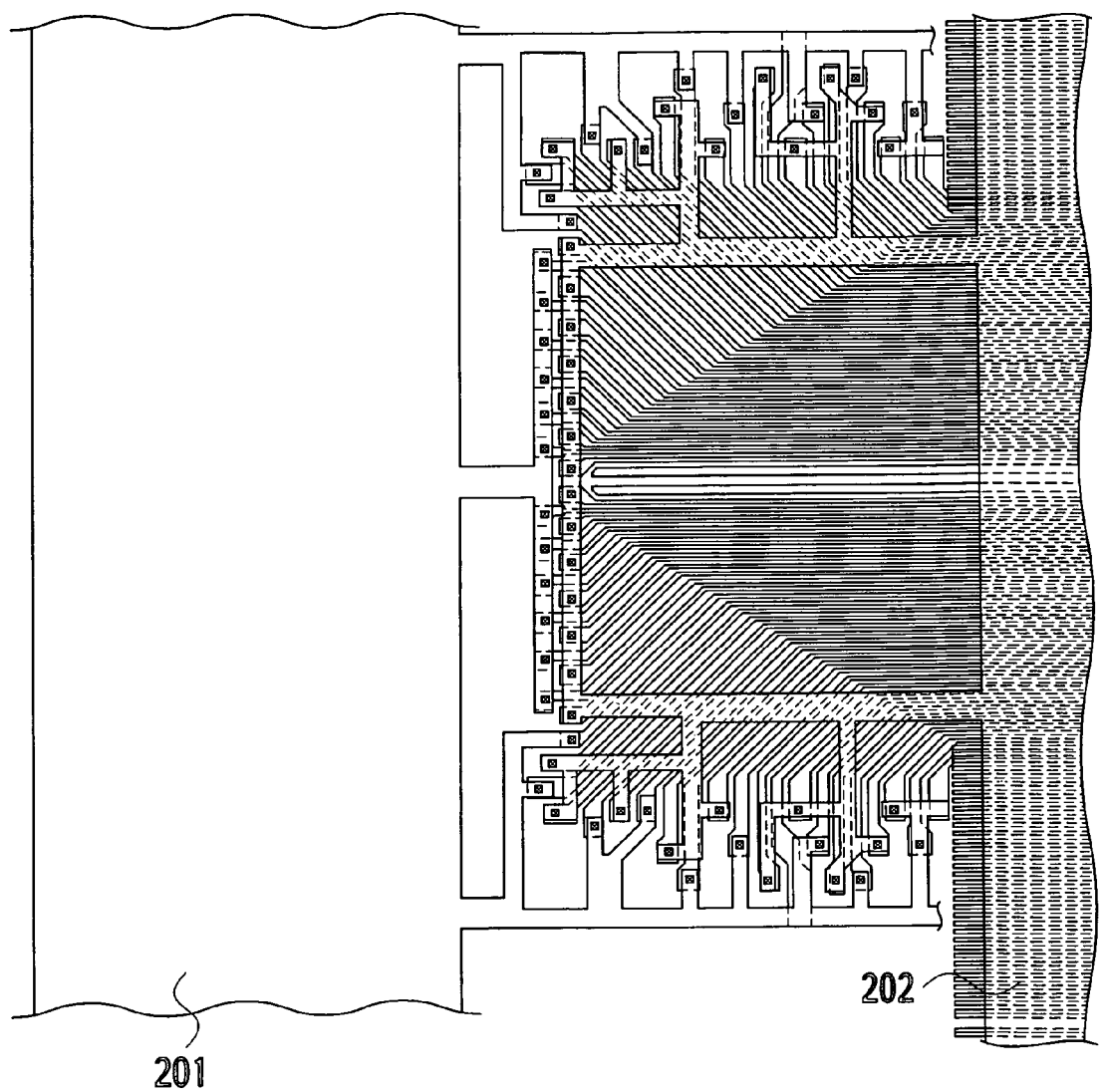
FIG. 24 is a top view of the process-level evaluation pattern (short-circuit failure detecting pattern) corresponding to FIGS. 23A and 23B.
Figure 25:
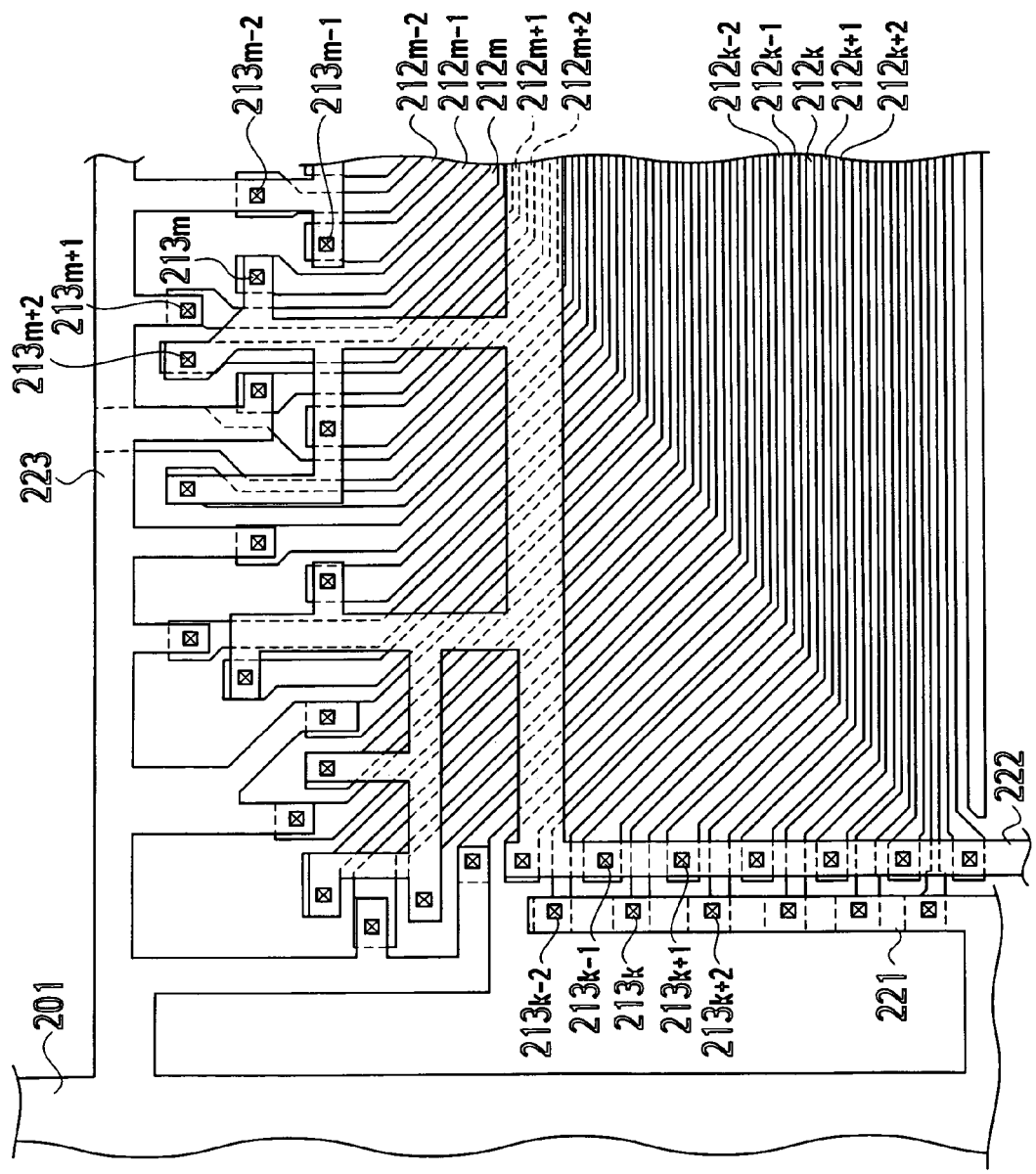
FIG. 25 is an enlarged top view of the process-level evaluation pattern (short-circuit failure detecting pattern) describing details of a part of FIG. 24.

(c) A second doped polysilicon film, which becomes the second conducting layer (control gate electrode) 7, is then deposited across the surfaces of the inter-electrode insulator ($Al_2O_3$) 4 by CVD as shown in FIGS. 20A and 20B, implementing a new base body to be processed. In the normal routine procedure, a process of forming peripheral circuit transistors comes next; however, description thereof is omitted, only focusing on the memory cell array. In other words, a photoresist film (not shown in the drawing) is coated on the second conducting layer (control gate electrode) 7 of the memory cell array 520, the photoresist film is exposed and developed through lithography, the second doped polysilicon film 7, the inter-electrode insulator ($Al_2O_3$) 4, and the first doped polysilicon film 3 of the memory cell array 520 are etched by RIE using the photoresist film as an etching mask, separating the memory cell transistors of respective memory cell columns from each other as shown in FIG. 21A. As shown in FIG. 21A, the second conducting layers 7 and the first conducting layers 3 of the select transistors are electrically conductive via the inter-electrode connection holes 42 of the inter-electrode insulators 4. Once the memory cell transistors are separated, the photoresist film used as an etching mask is removed. A top view of the base body when the process is completed is shown in FIG. 22, where a plurality of terminal extension interconnects made up of a plurality of left-ascending oblique lines for connecting word lines in the peripheral circuits, and a plurality of terminal extension interconnects made up of a plurality of left-descending oblique lines are provided to respective ends of the word lines, implementing a "lead-in interconnects" which facilitates connection between the word lines and the peripheral circuits. As can be seen from FIGS. 1 and 2, thirty-two word lines extending in parallel along the row direction are sandwiched between the pair of select gate interconnects $SGD_k$ and $SGD_{k-1}$ running along the row direction (d) Once the normal routine procedure reaches the process stage shown in FIGS. 21A, 21B and 22, the procedure proceeds to the process-level evaluation procedure. In other words, a 50 to 400 nm-thick interconnect-changing insulator 241 made of a silicon oxide film or the like is formed on the second conducting layers (polysilicon layers) 7 by CVD as shown in FIGS. 23A and 23B. A photoresist film (not shown in the drawing) is coated on the interconnect-changing insulator 241, the photoresist film is exposed and developed through lithography, and the interconnect-changing insulator 241 is then etched by RIE using the photoresist film as an etching mask. The photoresist film is removed, after etching is completed, to form sampling contact holes $213_{k-2}$, $213_{k-1}$, $213_k$, $213_{k+1}$, $213_{k+2}$, ..., $213_{m-2}$, $213_{m-1}$, $213_m$, $213_{m+1}$, $213m+2$, ... in the interconnect-changing insulator 241 shown in FIGS. 24 and 25 such that portions of the second conducting layers (polysilicon layers) 7 are selectively made bare. Details are shown in FIG. 25, where the sampling contact holes $213_{k-2}$, $213_k$, $213_{k+2}$, ..., $213_{m-1}$, $213_{m+1}$, ... are formed in the terminal extension interconnects for the respective even-numbered word lines $212_{k-2}$, $212_k$, $212_{k+2}$, ..., $212_{m-1}$, $212_{m+1}$, ..., the sampling contact holes $213_{k-1}$, $213_{k+1}$, ..., $213_m$, $213_{m+2}$, ..., $213_{m-2}$ are formed in the terminal extension interconnects for the respective odd numbered word lines $212_{k-1}$, $212_{k+1}$, ..., $212_m$, $212_{m+2}$, ..., and the sampling contact hole $213_{m-2}$ is formed in the select gate line $212_{m-2}$.

(e) A metal film such as Al film is then formed to a thickness of approximately 100 to 800 nm by sputtering or vacuum evaporation. A photoresist film (not shown in the drawing) is coated on the metal film, the photoresist film is exposed and developed through lithography, and the metal film is then etched by RIE or the like using the photoresist film as an etching mask. Removal of the photoresist film, after etching is completed, delineates evaluation interconnects 221, 222, and 223 as shown in FIGS. 24 and 25. The terminal extension interconnects for the respective even-numbered word lines $212_{k-2}$, $212_k$, $212_{k+2}$, ... are connected to the evaluation interconnect 221 via the sampling contact holes $212_{k-2}$, $212_k$, $212_{k+2}$, ..., the terminal extension interconnects for the respective odd numbered word lines $212_{k-1}$, $212_{k+1}$, ..., $212_m$, $212_{m+2}$, ... are connected to the evaluation interconnect 222 via the sampling contact holes $213_{k-1}$, $213_{k+1}$, ..., $213_{m-2}$, $213$, $213_{+2}$, ..., the terminal extension interconnects for the respective even-numbered word lines $212_{m-1}$, $212_{m+1}$, ... are connected to the evaluation interconnect 223 via the sampling contact holes $213_{m-1}$, $213_{m+1}$, ..., and the terminal extension interconnect of the select gate line $212_{m-2}$ is also connected to the evaluation interconnect 223 via the sampling contact holes $213_{m-2}$, ... FIGS. 24 and 25 also show a probing pad 201 collecting together the evaluation interconnects 221, 223, . . . . The probing pad 201 corresponds to one of the probing pads 611, 612, . . . , 620 shown in FIG. 3B, and although omitted from the drawing, another probing pad collecting together the evaluation interconnects 222, . . . is naturally located on the right side of FIG. 25. Making tips of testing probes touch the probing pad 201 and the probing pad located on the right side of FIG. 25, respectively, and measuring resistance between the probing pads achieves detection of short-circuit failures between adjacent fingers of respective word lines $212_{k-2}$, $212_{k-1}$, $212_k$, $212_{k+1}$, $212_{k+2}$, . . . , $212_{m-1}$, $212_m$, $212_{m+1}$, $212_{m+2}$, . . . extending in parallel with an interdigital topology of the even-numbered word lines $212_{k-2}$, $212_k$, $212_{k+2}$, . . . , $212_{m-1}$, $212_{m+1}$, . . . facing the odd numbered word lines $212_{k-1}$, $212_{k+1}$, . . . , $212_m$, $212_{m+2}$, . . . .

According to the embodiment of the present invention as described above, easy detection of short-circuit failures and evaluation of the process levels are possible by providing two additional evaluation masks, configured to change a part of electrical connection of the intermediate product pattern implemented by the routinely employed working masks, in combination with the set of working masks, without preparing an exclusive set of process-level evaluation masks.

As with FIG. 42, the open-circuit failures can be detected by connecting in series the word lines $212_{k-2}$, $212_{k-1}$, $212_k$, $212_{k+1}$, $212_{k+2}$, . . . , $212_{m-1}$, $212_m$, $212_{m+1}$, $212_{m+2}$, . . . extending parallel using connection-changing interconnects, into a meander line, and then measuring the resistance between opposing terminals in each of the meander lines.

Figure 26:
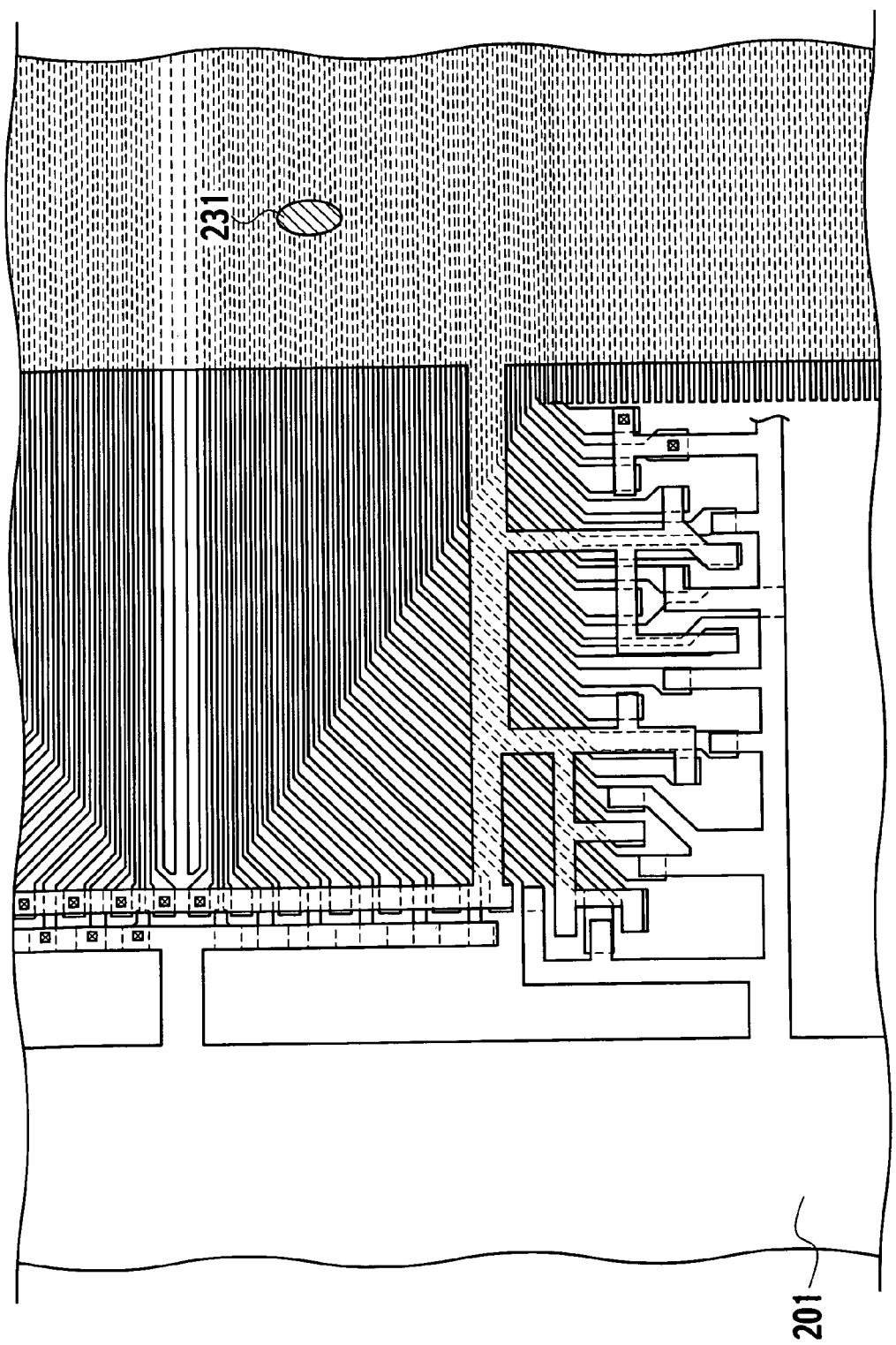
FIG. 26 is a top view of the process-level evaluation pattern corresponding to FIG. 24 schemed so as not to be adversely affected by pattern defects (short-circuit failures) occurring in any process up to the state of the process shown in FIG. 21.

Furthermore, when generation of the pattern defect 231 is confirmed during pre-checking of the working mask before subject exposure process, or during arbitrary checking of actual patterns transferred onto the semiconductor wafer, a new working mask not allocating a sampling contact hole in the corresponding word lines is prepared to prevent adverse affects from the pattern defect 231, as shown in FIG. 26.

As such, according to the embodiment of the present invention, a process-level evaluation pattern, which can characterize the defect in the intermediate product pattern, may be provided in combination with the set of working masks. The pattern defect 231 may be critical depending on the extent of defectiveness by itself, or alternatively, may become critical defect through a process-dependent combination with a pattern defect on the semiconductor wafer. However, according to the embodiment of the present invention, since open-circuit characteristics and short-circuit characteristics of the intermediate product pattern, pertaining to the target industrial product (final product), is directly tested, generation of open-circuit failures and short-circuit failures due to a combination with the fluctuation of process conditions may be prevented by regular periodical testing through an accelerated test in which the process conditions are intentionally changed.

Furthermore, as is apparent from FIGS. 24 and 25, since the patterns of the evaluation interconnects 221, 222, 223, . . . for extracting electrical information of specified portions on the semiconductor wafer to the outside of the semiconductor chip, in combination with the set of the working masks, can be delineated with sufficiently large dimensions compared to the minimum feature size F, not only is production of the evaluation mask itself easy, lithography and etching in the process-level evaluation procedure are also easy and simple, and therefore the process-level evaluation procedure can be accomplished in a short period.

Intermediate Product With Junction Plate

The normal routine procedure up to the formation process of the junction plates (data transfer line extensions) after the delineation process of the word lines, and process-level evaluation procedure accompanying the formation process of the junction plates are described using FIGS. 27 through 34.

In the same manner as the process up to delineation process of the word lines, the NAND flash memory fabrication method and accompanying process-level evaluation method given below are merely an example, and other various methods are available including modifications of these methods. Similarly, disclosed patterns are also merely examples, and it is needless to say that other various patterns may be used.

Figure 27:
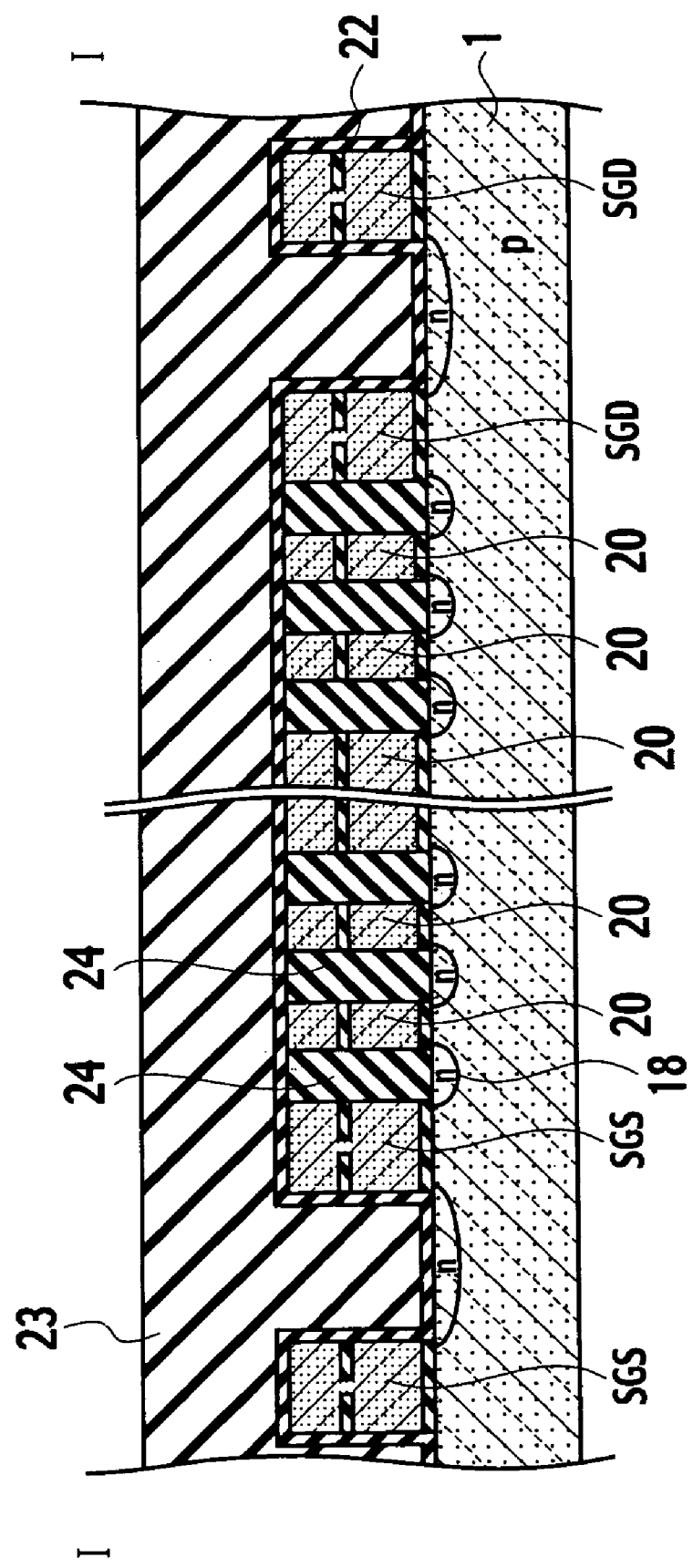
FIG. 27 is a cross-sectional view describing a state of the industrial product when a next process after the process shown in FIG. 21 of the normal routine procedure is completed.

(a) Once the process-level evaluation procedure accompanying with delineation process of the word lines is completed, the procedure returns to the normal routine procedure. In the normal routine procedure, the aforementioned state of cross-sectional structure of the intermediate product shown in FIGS. 21A and 21B is defined as a new base body to be processed. That is, the new base body is defined by the preceding intermediate product shown in FIGS. 21A and 21B fabricated by the preceding sequence of processes, which corresponds to a part of the normal routine procedure for manufacturing the industrial product (final product). At first, n-type impurity ions are implanted in the p-type semiconductor substrate (or, alternatively p-well) 1 so as to form n-type source/drain regions, n-type bit line contact BC and n-type source line contact SC of the memory cell transistors in the new base body. Furthermore, the dose of the ions is changed and then implanted so as to form another source/drain regions and well contact regions of the transistors in the peripheral circuits. Of course, a dose of p-type impurity ions are implanted in the p-type semiconductor substrate (or, alternatively p-well) so as to form the p-type well contact regions. Next, as shown in FIG. 27, a fluorine-doped silicon oxide (SiOF) film approximately 10 nm thick is deposited as column-wise cell isolation insulators (interlayer insulating films) 24 through high density plasma (HDP) using diphlorosilane ($SiH_2F_2$) gas, filling in between the respective memory cell transistors and the respective select transistors isolated from each other by cell isolating grooves. Inductive coupling plasma (ICP) or the like may be used as a plasma source for HDP. Insulating films having a smaller dielectric constant $\in_r$ than 3.9 are preferred as the column-wise cell isolation insulators (interlayer insulating films) 24, and the SiOF film may be formed through HDP using a mixed gas of silicon (IV) fluoride ($SiF_4$) gas and monosilane ($SiH_4$) gas, disilane ($Si_2H_6$) gas, dichlorosilane ($SiH_2Cl_2$) gas and the like instead of the $SiH_2F_2$ gas. Alternatively, the column-wise cell isolation insulators (interlayer insulating films) 24 respectively made of a SiOC film may be embedded between each memory cell transistor and between each select transistor and adjacent memory cell transistor by, for example, CVD using trimethylsilane. Furthermore, a spin-coat method using methylpolysiloxane, an alkylsiloxane polymer, an alkylsilsesquioxane polymer (MSQ), a silsesquioxane hydride polymer (HSQ), an alkylsilsesquioxane hydride polymer (HOSP) or the like may be employed. Afterwards, etching back is carried out by RIE so as to remove the column-wise cell isolation insulators (interlayer insulating films) 24 between the select transistors.

(b) Next, a barrier insulating film 22 made of a silicon nitride film, a silicon oxide film, or an aluminum oxide film is deposited within a range of 10 to 1000 nm across the entire surface including the memory cell transistors and the select transistors. The barrier insulating film 22 serves as an etching stopper for preventing excessive etching when forming the source line contact CS and the bit line contact (data transfer line contact) CB. Using as a stopper layer the barrier insulating film 22, which has a slower etching rate than that of the interlayer insulating film 23 or selectivity against the interlayer insulating film 23, the barrier insulating film 22 is removed by etching, which prevents excessive etching of the semiconductor substrate 1 when forming the source line contact CS and the bit line contact (data transfer line contact) CB. Alternatively, before deposition of the barrier insulating film 22, a silicon oxide film 1 to 50 nm in thickness may be formed on the surface of the semiconductor substrate 1 through oxidation or deposition. The interlayer insulating film 23 made of an insulating film such as a silicon oxide film, a silicon nitride film, a silicate glass such as boro-phosphate-silicate-glass (BPSG) or phosphosilicate-glass (PSG), HSQ or MSQ, or an organic polymer with an aromatic hydrocarbon structure not including fluorine is deposited 10 to 1000 nm in thickness on the barrier insulating film 22, the surface of the interlayer insulating film 23 is then planarized as shown in FIG. 27 by CMP, implementing a new base body to be processed.

Figure 28:
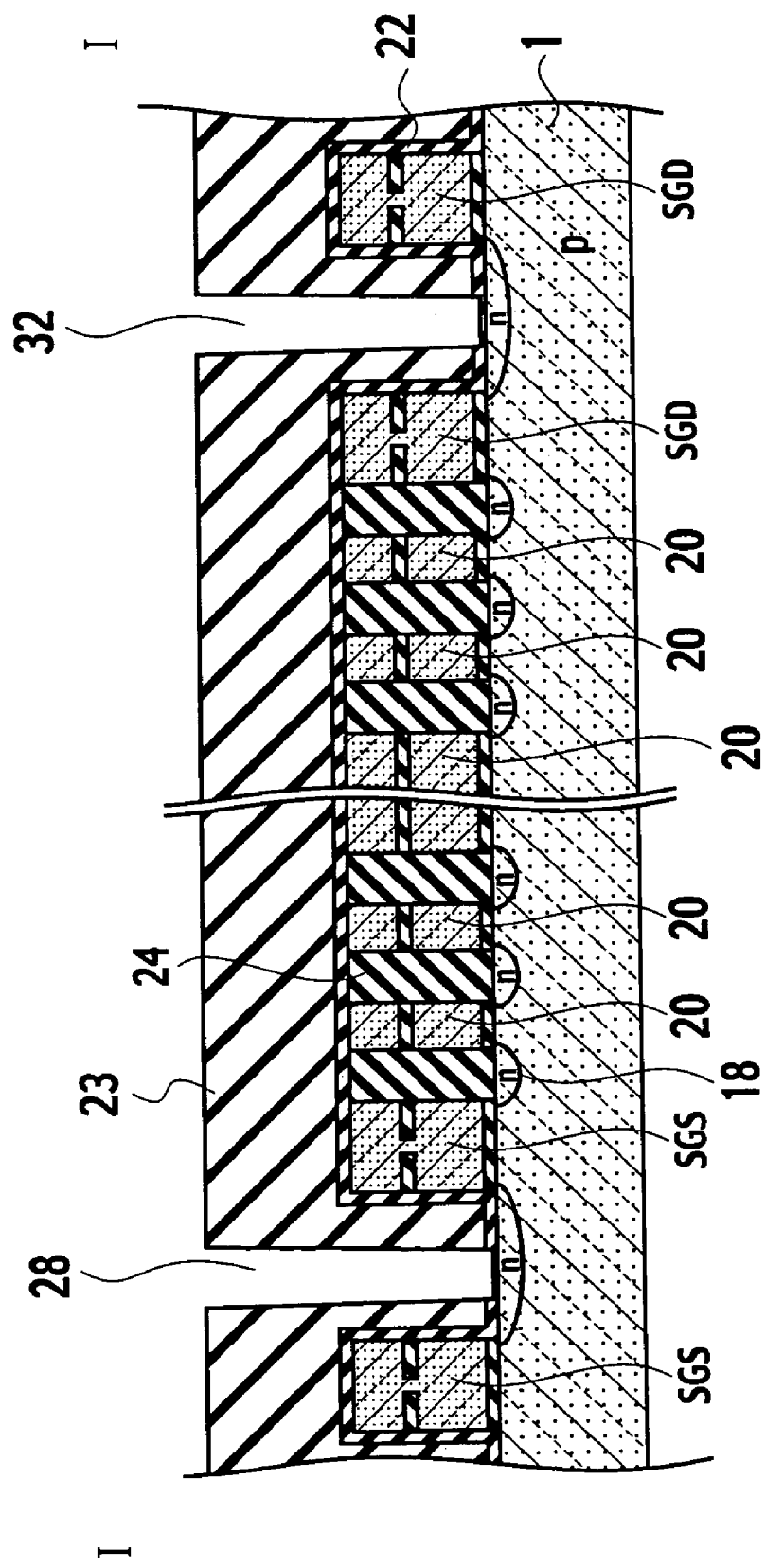
FIG. 28 is a cross-sectional view describing a state of the industrial product when a next process after the process shown in FIG. 27 of the normal routine procedure is completed.

(c) Next, a photoresist film is coated on the new base body, and the photoresist film is delineated through lithography, the interlayer insulating film 23 is then anistropically etched using the delineated photoresist film as an etching mask, forming a bit line contact (data transfer line contact) CB opening 32 and a source line contact CS opening 28. The photoresist film used as the etching mask is then removed, as shown in FIG. 28. Once the photoresist film is removed, the barrier film 22 on the respective bottoms of the bit line contact (data transfer line contact) CB opening 32 and the source line contact CS opening 28 is etched and removed, parts of the semiconductor substrate 1 on the respective bottoms of the bit line contact (data transfer line contact) CB opening 32 and the source line contact CS opening 28 are selectively made bare.

Figure 29:
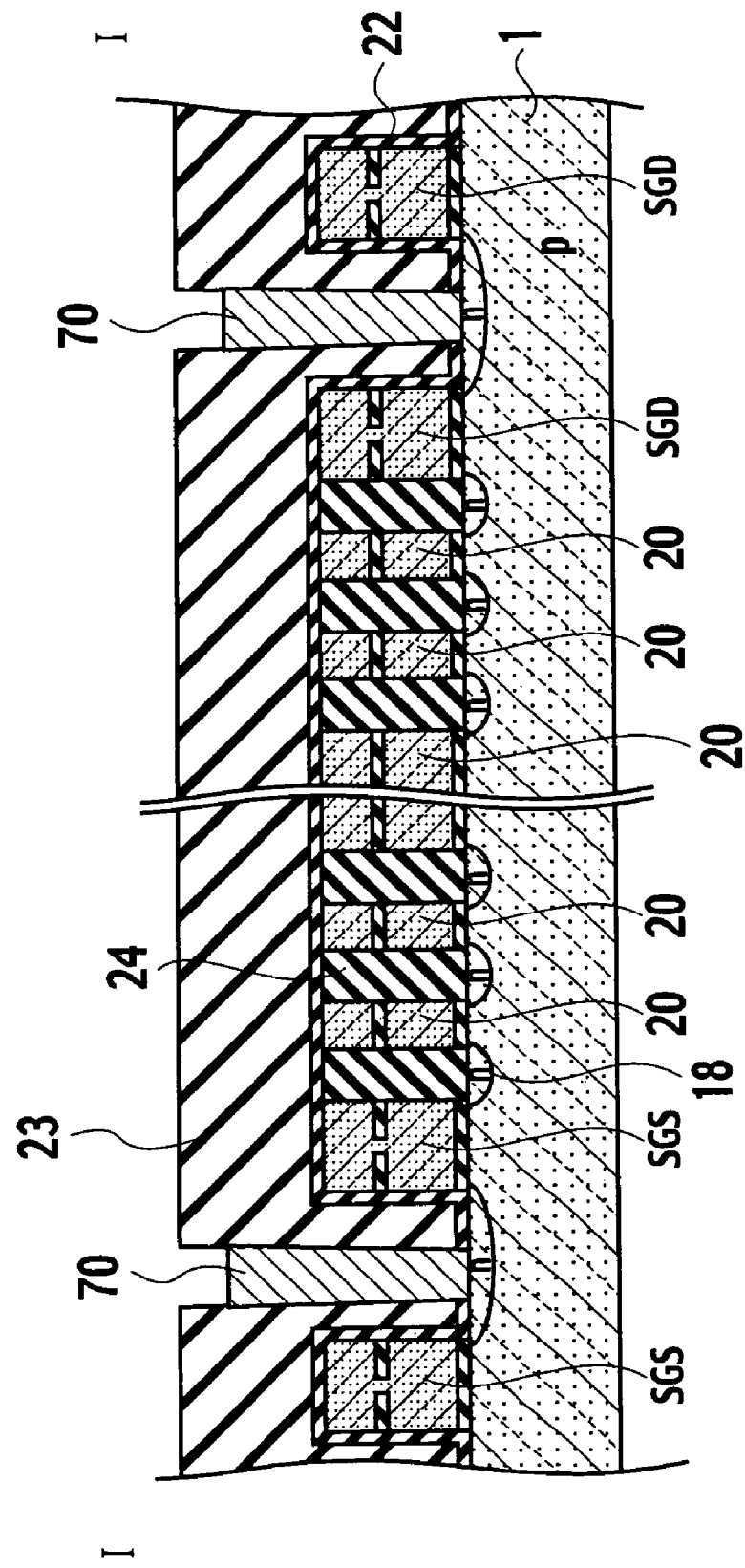
FIG. 29 is a cross-sectional view describing a state of the industrial product when a next process after the process shown in FIG. 28 of the normal routine procedure is completed.

(d) Then, heavily doped polysilicon doped with n-type impurity atoms such as phosphorous (P) atoms or arsenic (As) atoms is then buried as a filler 70 in the respective bit line contact (data transfer line contact) CB opening 32 and the source line contact CS opening 28. Furthermore, as shown in FIG. 29, a part of the surfaces of the filler 70 is etched back by anistropic etching or isotropic etching such as chemical dry etching (CDE).

Figure 30:
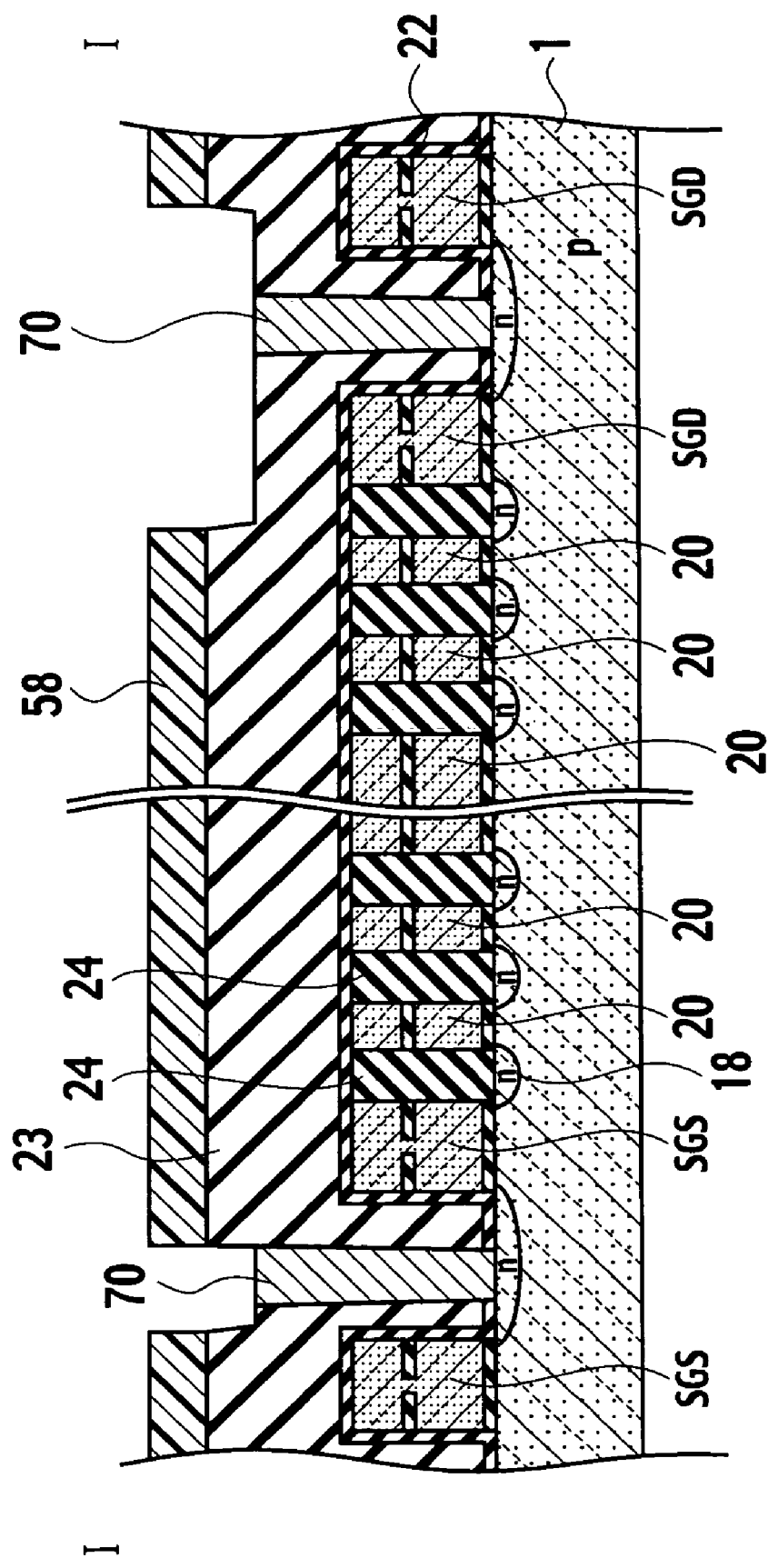
FIG. 30 is a cross-sectional view describing a state of the industrial product when a next process after the process shown in FIG. 29 of the normal routine procedure is completed.
Figure 31:
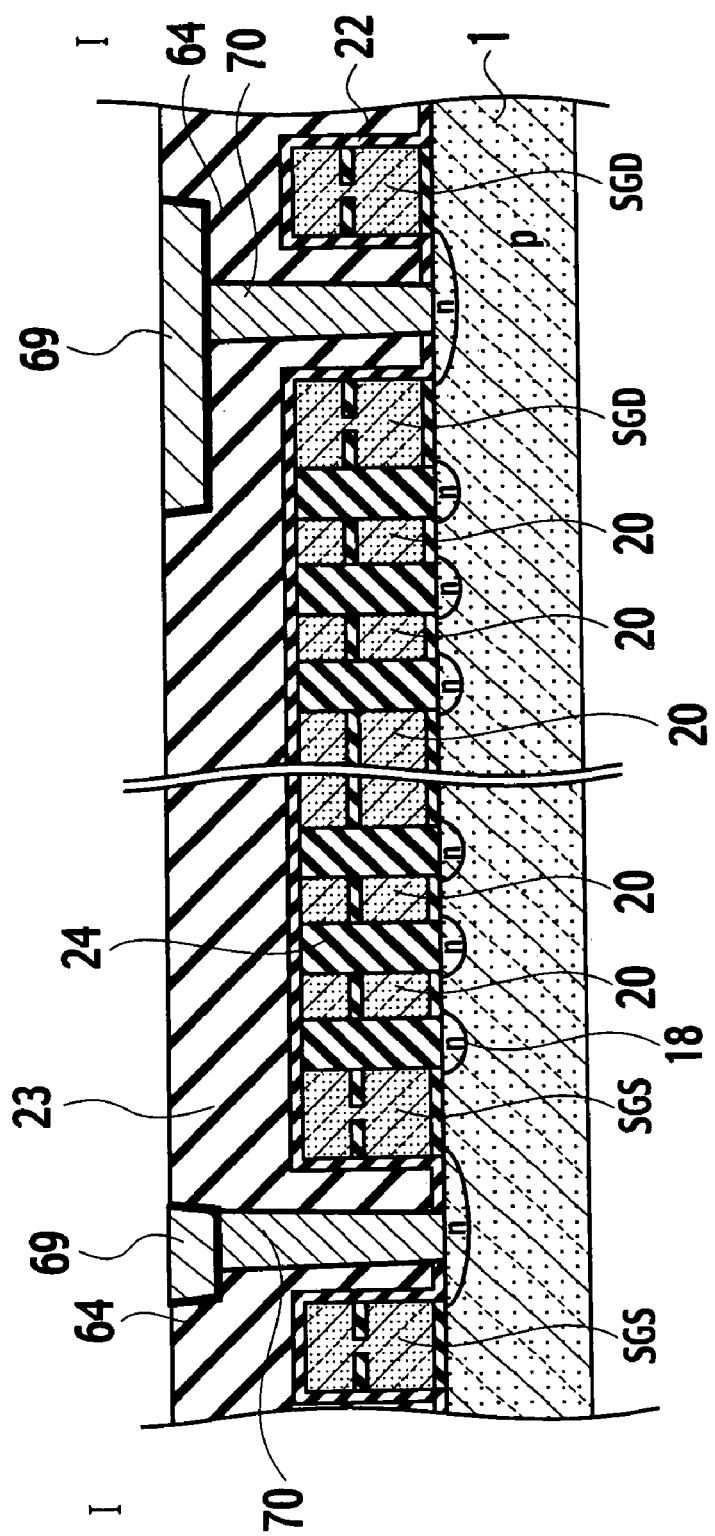
FIG. 31 is a cross-sectional view describing a state of the industrial product when a next process after the process shown in FIG. 30 of the normal routine procedure is completed.

(e) Although omitted from the drawing, a part of the interlayer insulating film 23 is then selectively etched through lithography and RIE, forming a substrate contact SB opening. Once the photoresist film used for formation of the substrate contact SB opening is removed, a new photoresist film 58 is coated, the photoresist film 58 is delineated through lithography, the interlayer insulating film 23 is selectively etched by RIE using the delineated photoresist film 58 as an etching mask, and as shown in FIG. 30, damascene grooves are formed in the upper part of the filler 70, forming a new base body to be processed. Once the photoresist film 58 used for formation of the damascene grooves is removed, a barrier metal 64 such as Ti, Ta, TaN, or TiN is deposited in the damascene grooves within a range of 1 to 100 nm in thickness by sputtering, vacuum evaporation or CVD, for example. A metallic material such as W, Al, or Cu is further deposited as a 10 to 1000 nm-thick interconnect material 69 on the barrier metal 64. As shown in FIG. 31, the surface of the base body is planarized by CMP or the like so that the interconnect materials 69 filled into the damascene grooves becomes source lines and junction plates.

Figure 32:
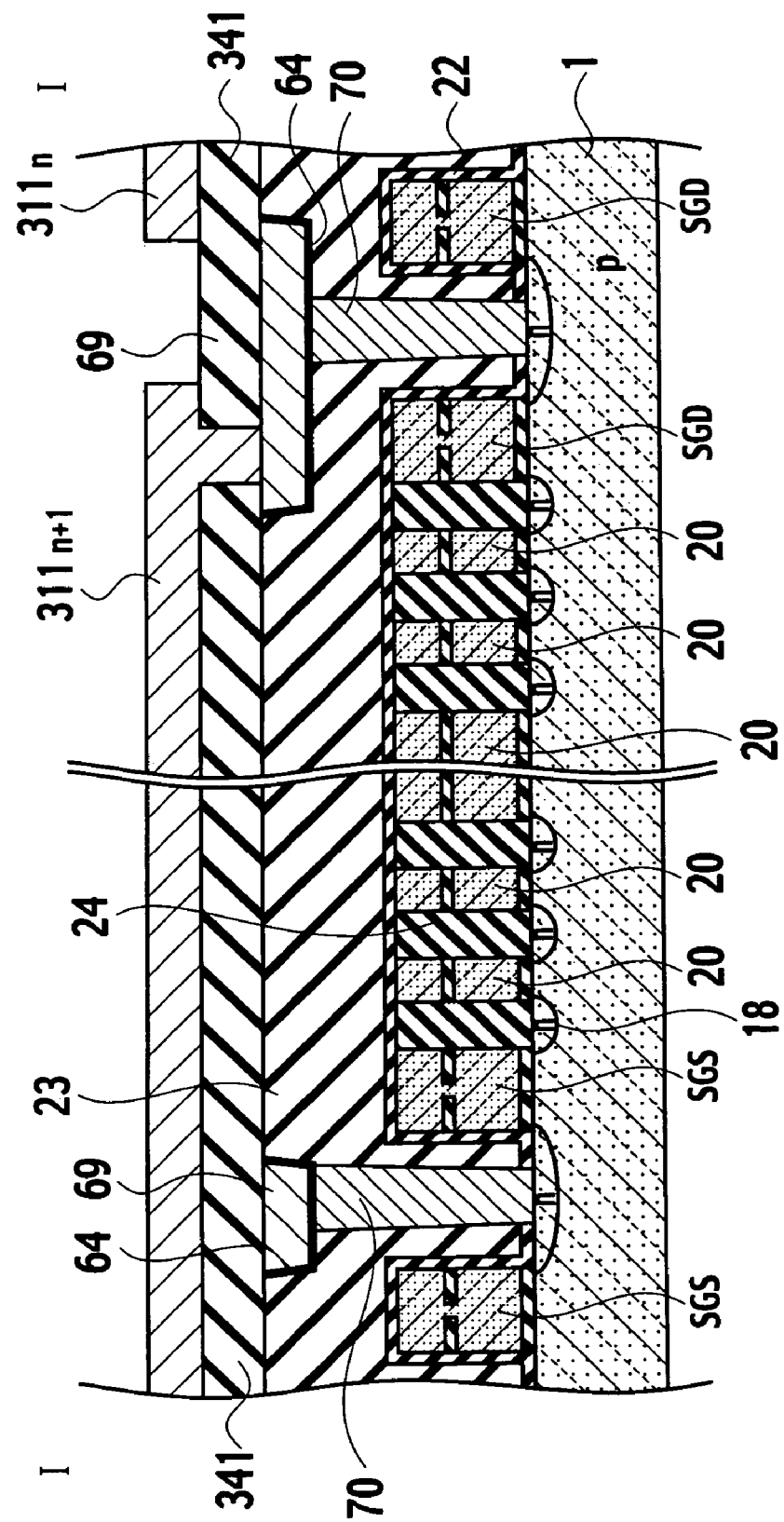
FIG. 32 is a process cross-sectional view describing a state of a process-level evaluation pattern (short-circuit failure detecting pattern) formed through a sequence of processes using additional masks after the process shown in FIG. 31 is completed.

(f) Once the normal routine procedure reaches the process stage shown in FIG. 31, the procedure proceeds to the process-level evaluation procedure. Afterwards, a 50 to 400 nm-thick interconnect-changing insulator 341 made of a silicon oxide film or the like is formed on the interconnect material 69 by CVD as shown in FIG. 32. FIG. 33 is a top view corresponding to FIG. 32, showing a plurality of T-shaped junction plates intermediate relay interconnects) $312_{p-2}$, $312_{p-1}$, $312_p$, $312_{p+1}$, $312_{p+2}$, . . . as a planar pattern made of the interconnect material 69. T-shape of the junction plates $312_{p-2}$, $312_{p-1}$, $312_p$, $312_{p+1}$, $312_{p+2}$, . . . is implemented by a narrow strip portion and a base portion of a rectangular pattern having width wider than the strip portion. In the plan view of FIG. 33, even numbered junction plates $312_{p-2}$, $312_p$, $312_{p+2}$, . . . may be called as inverse T-shape, while odd numbered junction plates $312_{p-1}$, $312_{p+1}$, . . . may be called as normal T-shape. However, while FIG. 32 shows junction plates made of the interconnect material 69 approximately 7 F in length extending along the data transfer line direction, FIG. 33 shows the junction plates $312_{p-2}$, $312_{p-1}$, $312_p$, $312_{p+1}$, $312_{p+2}$, . . . approximately 20 F in length extending along the data transfer line direction. A width of the rectangular base portion implementing the T-shape of the junction plates $312_{p-2}$, $312_{p-1}$, $312_p$, $312_{p+1}$, $312_{p+2}$, . . . , viewed as the planar pattern in FIG. 33, is approximately 6 F measured along the word line direction. The length of the junction plates $312_{p-2}$, $312_{p-1}$, $312_p$, $312_{p+1}$, $312_{p+2}$, . . . should be decided based on the degree of miniaturization and the technical level of the processes corresponding to the degree of miniaturization. Data transfer line contacts $314_{p-2}$, $314_{p-1}$, $314_p$, $314_{p+1}$, $314_{p+2}$, . . . shown as the filler 70 in the cross-sectional view of FIG. 32 are respectively connected to the centers of the thin strip patterns of the approximately 2 F wide junction plates (intermediate relay interconnects) $312_{p-2}$, $312_{p-1}$, $312_p$, $312_{p+1}$, $312_{p+2}$, . . . . A photoresist film (not shown in the drawing) is coated on the interconnect-changing insulator 341, the photoresist film is exposed and developed through lithography, and the interconnect-changing insulator 341 is then etched by RIE using the photoresist film as an etching mask. The photoresist film is removed, after etching is completed, to form sampling contact holes $313_{p-2}$, $313_{p-1}$, $313_p$, $313_{p+1}$, $313_{p+2}$, . . . in the interconnect-changing insulator 341 shown in FIG. 33 so that part of the junction plates $312_{p-2}$, $312_{p-1}$, $312_p$, $312_{p+1}$, $312_{p+2}$, . . . are selectively made bare.

Figure 34:
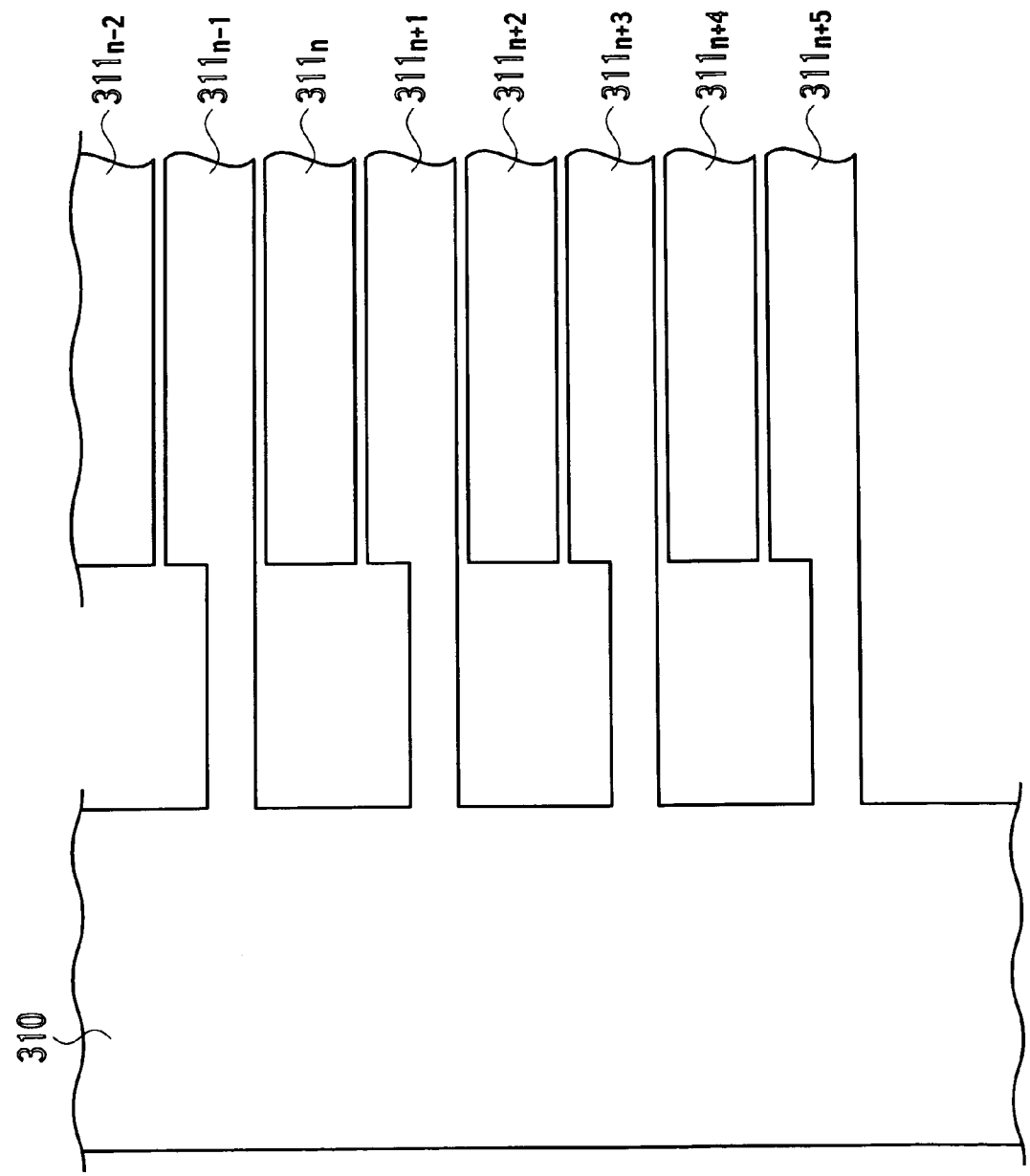
FIG. 34 is a top view of a process-level evaluation pattern (short-circuit failure detecting pattern) across a wide range larger than the view shown in FIG. 33, including a plurality of evaluation interconnects located above the evaluation interconnects shown in FIG. 33, and a plurality of evaluation interconnects located below the evaluation interconnects shown in FIG. 33.

(g) A metal film such as Al film is then formed to a thickness of approximately 100 to 800 nm by sputtering or vacuum evaporation. A photoresist film (not shown in the drawing) is coated on the metal film, the photoresist film is exposed and developed through lithography, and the metal film is then etched by RIE or the like using the photoresist film as an etching mask. Removal of the photoresist film, after etching is completed, delineates evaluation interconnects $311_n$, $311_{n+1}$, . . . as indicated by chain double-dashed lines in the top view of FIG. 33. FIG. 34 is a top view across a large area including evaluation interconnects $311_{n-1}$, . . . located above the evaluation interconnect $311_n$ and evaluation interconnects $311_{n+2}$, $311_{n+3}$, $311_{n+4}$, $311_{n+5}$, . . . located below the evaluation interconnect $311_{n+1}$, and a probing pad 310 collecting together the odd numbered evaluation interconnects $311_{n-1}$, $311_{n+1}$, $311_{n+3}$, $311_{n+5}$, . . . is also shown (where n is assumed as an even number). This probing pad 310 corresponds to one of the probing pads 611, 612, . . . , 620 shown in FIG. 3B, and although omitted from the drawing, another probing pad collecting together the even-numbered evaluation interconnects $311_n$, $311_{n+2}$, $311_{n+4}$, . . . is naturally located on the right side of FIG. 34. Making tips of testing probes touch the probing pad 310 and the probing pad located on the right side of FIG. 34, respectively, and measuring resistance between the probing pads achieves detection of short-circuit failures between adjacent data line extensions $312_{p-2}$, $312_{p-1}$, $312_p$, $312_{p+1}$, $312_{p+2}$, . . . with the topology of the even-numbered data line extensions $312_{p-2}$, $312_p$, $312_{p+2}$, . . . interdigitally facing the odd numbered data line extensions $312_{p-1}$, $312_{p+1}$, . . . .

According to the embodiment of the present invention as described above, easy detection of short-circuit failures and evaluation of the process levels are possible by providing two additional evaluation masks, configured to change a part of electrical connection of the intermediate product pattern implemented by the routinely employed working masks, in combination with the set of working masks, without preparing an exclusive set of process-level evaluation masks.

The open-circuit failures can be detected by connecting in series the junction plates $312_{p-2}$, $312_{p-1}$, $312_p$, $312_{p+1}$, $312_{p+2}$, ... using the connection-changing interconnects, into a meander line, and then measuring the resistance between the opposing two ends of meander line.

Figure 35:
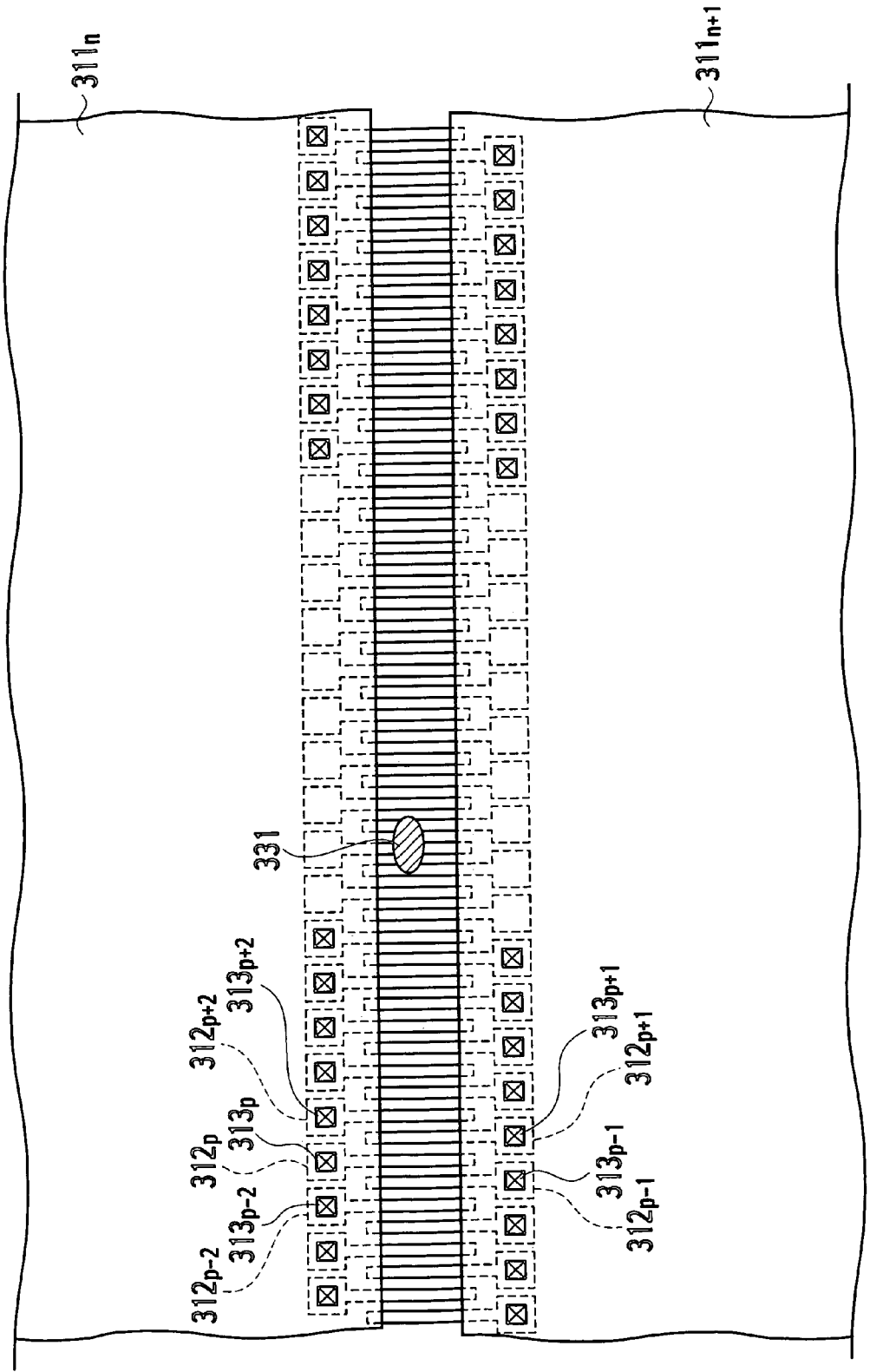
FIG. 35 is a top view of the process-level evaluation pattern corresponding to FIG. 33 schemed so as not to be adversely affected by pattern defects (short-circuit failures) occurring in any process up to the state of the process shown in FIG. 31.

Furthermore, when generation of the pattern defect 331 is confirmed during pre-checking of the working mask before subject exposure process, or during arbitrary checking of actual patterns transferred onto the semiconductor wafer, a working mask not allocating a sampling contact hole in the corresponding junction plate is prepared to prevent adverse affects from the pattern defect 331, as shown in FIG. 35.

As such, according to the embodiment of the present invention, a process-level evaluation pattern, which can characterize the defect in the intermediate product pattern, may be provided in combination with the set of working masks. The pattern defect 331 may be critical depending on the extent of defectiveness by itself, or alternatively, may become critical defect through a process-dependent combination with a pattern defect on the semiconductor wafer. However, according to the embodiment of the present invention, since open-circuit characteristics and short-circuit characteristics of the intermediate product pattern, pertaining to the target industrial product (final product), is directly tested, generation of open-circuit failures and short-circuit failures due to a combination with the fluctuation of process conditions may be prevented by regular periodical testing through an accelerated test in which the process conditions are intentionally changed.

Furthermore, as is apparent from FIGS. 33 and 34, since the patterns of the evaluation interconnects $311_{n-2}$, $311_{n-1}$, $311_n$, $311_{n+1}$, $311_{n+2}$, $311_{n+3}$, $311_{n+4}$, $311_{n+5}$, ... for extracting electrical information of specified portions on the semiconductor wafer to the outside of the semiconductor chip, in combination with the set of the working masks, can be delineated with sufficiently large dimensions compared to the minimum feature size F, not only is production of the evaluation mask itself easy, lithography and etching in the process-level evaluation procedure are also easy and simple, and therefore the process-level evaluation procedure can be accomplished in a short period.

Intermediate Product With Data Transfer Line

The normal routine procedure up to the formation process of data transfer lines after the aforementioned junction plates (intermediate relay interconnects) are formed, and process-level evaluation procedure accompanying the formation process of the data transfer lines (bit lines) are described using FIGS. 36 through 40. In the same manner as the sequence of the processes up to formation process of the junction plate, the NAND flash memory fabrication method and accompanying process-level evaluation method given below are merely an example, and other various methods are available including modifications of these methods. Similarly, disclosed patterns are also merely examples, and it is needless to say that other various patterns may be used.

Figure 36:
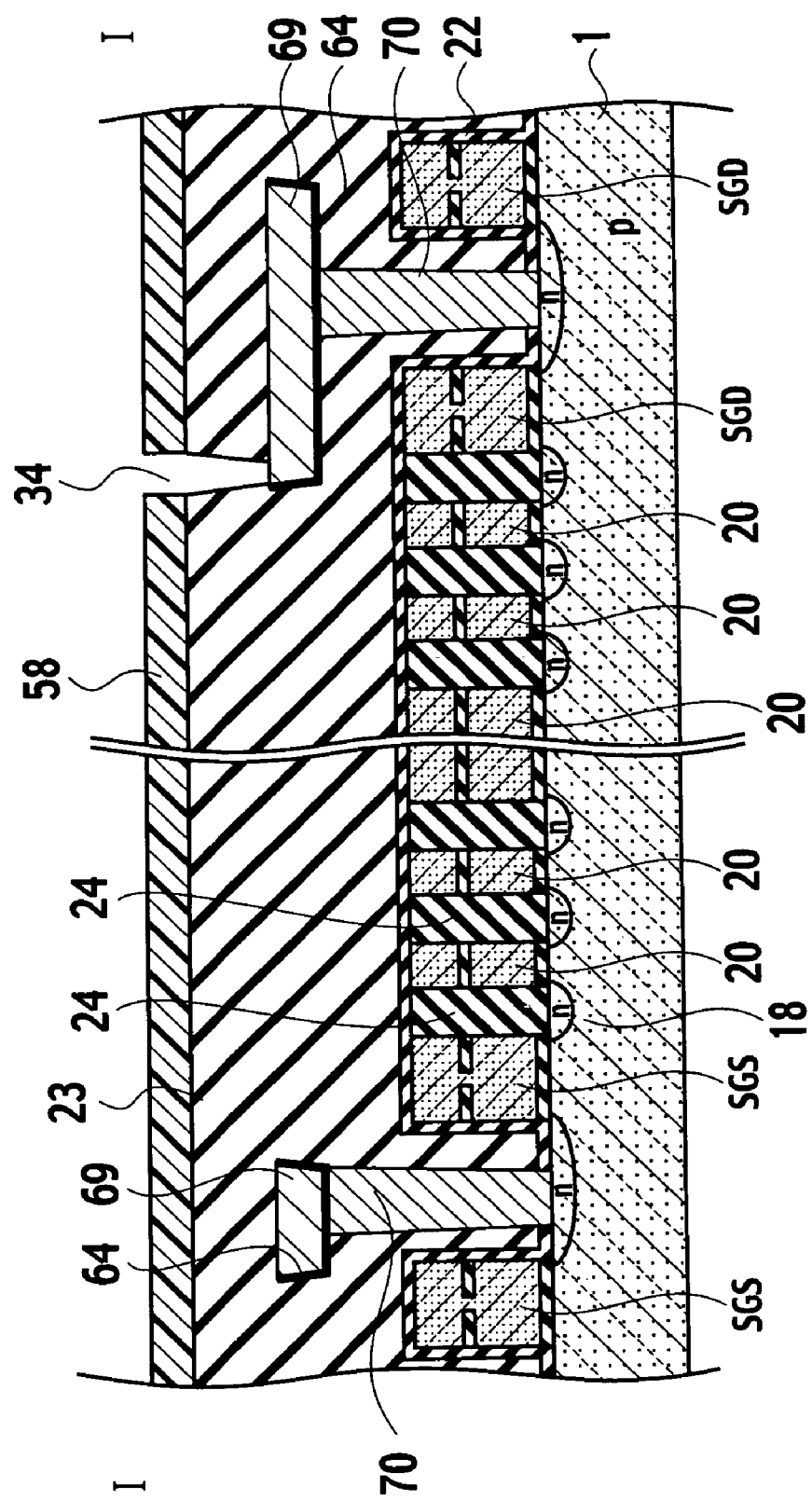
FIG. 36 is a cross-sectional view describing a state of the industrial product when a next process after the process shown in FIG. 31 of the normal routine procedure is completed.

(a) Once the process-level evaluation procedure up to the step of delineating the junction plates (intermediate relay interconnects) is completed, the procedure returns to the normal routine procedure. In the normal routine procedure, the aforementioned state of cross-sectional structure of the intermediate product shown in FIG. 31 is defined as a new base body to be processed. That is, the new base body is defined by the preceding intermediate product shown in FIG. 31 fabricated by the preceding sequence of processes, which corresponds to a part of the normal routine procedure for manufacturing the industrial product (final product). At first, an interlayer insulating film 23 having a thickness of 10 nm to 1000, made of a non-doped silicon oxide film or an insulating film such as BPSG, PSG, HSQ, MSQ, or SILK, is deposited on the new base body. A photoresist film 58 is coated on the interlayer insulating film 23 and is delineated through lithography for formation of a via plug 16. The interlayer insulating film 23 is selectively etched by RIE using the delineated photoresist film 58 as an etching mask, forming a via hole 34, as shown in FIG. 36.

Figure 37:
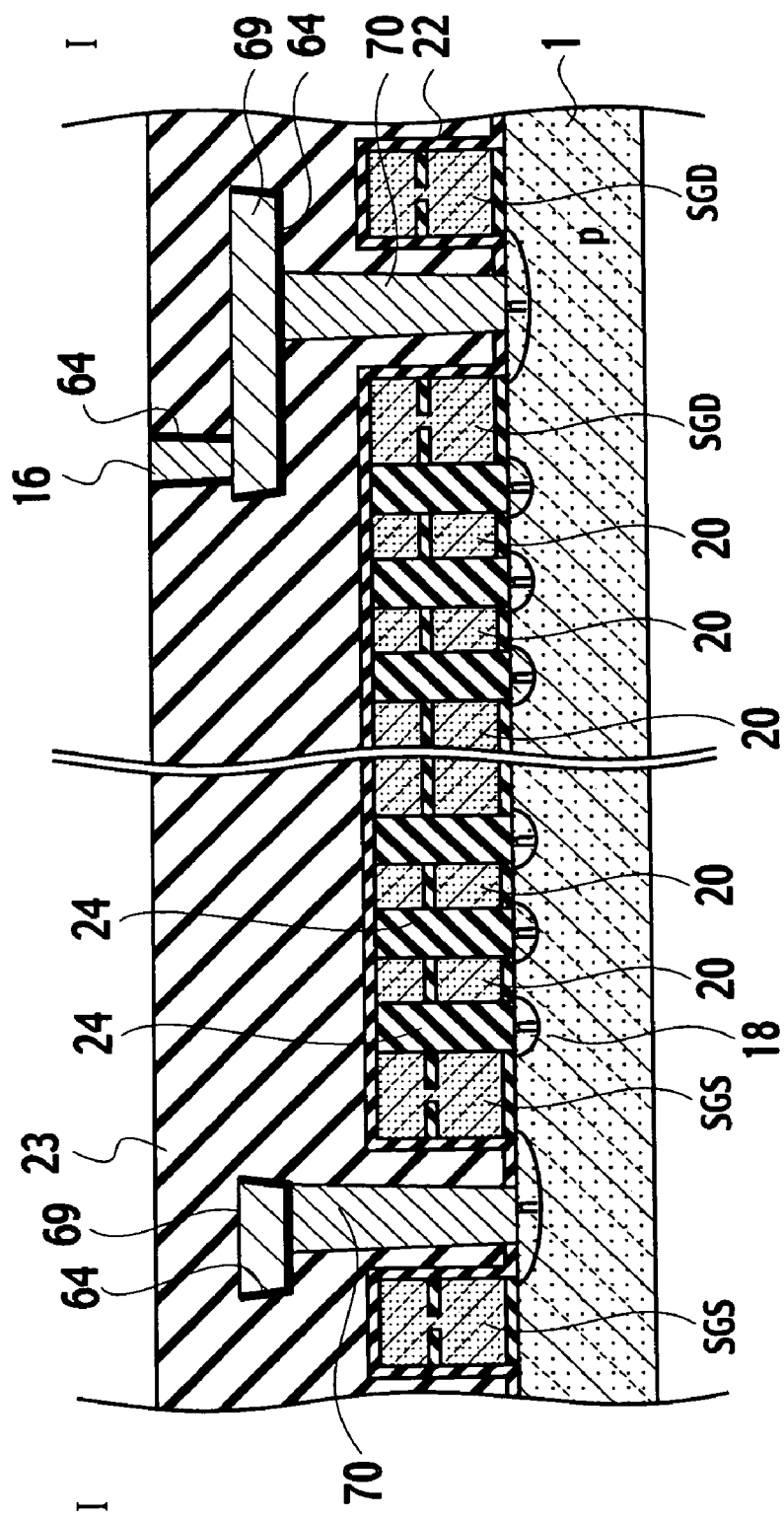
FIG. 37 is a cross-sectional view describing a state of the industrial product when a next process after the process shown in FIG. 36 of the normal routine procedure is completed.

(b) Once the photoresist film 58 used for formation of the via hole 34 is removed, a barrier metal 64 such as Ti, Ta, TaN, or TiN is deposited in the via hole 34 within a range of 1 to 100 nm by sputtering, vacuum evaporation or CVD, for example. A metallic material such as W, Al, or Cu is deposited in the via hole 34 to a thickness of 10 to 1000 nm, then etched back and planarized by CMP or the like, and as shown in FIG. 37, a via plug 16 is then buried in the via hole 34, forming a new base body to be processed.

Figure 38:
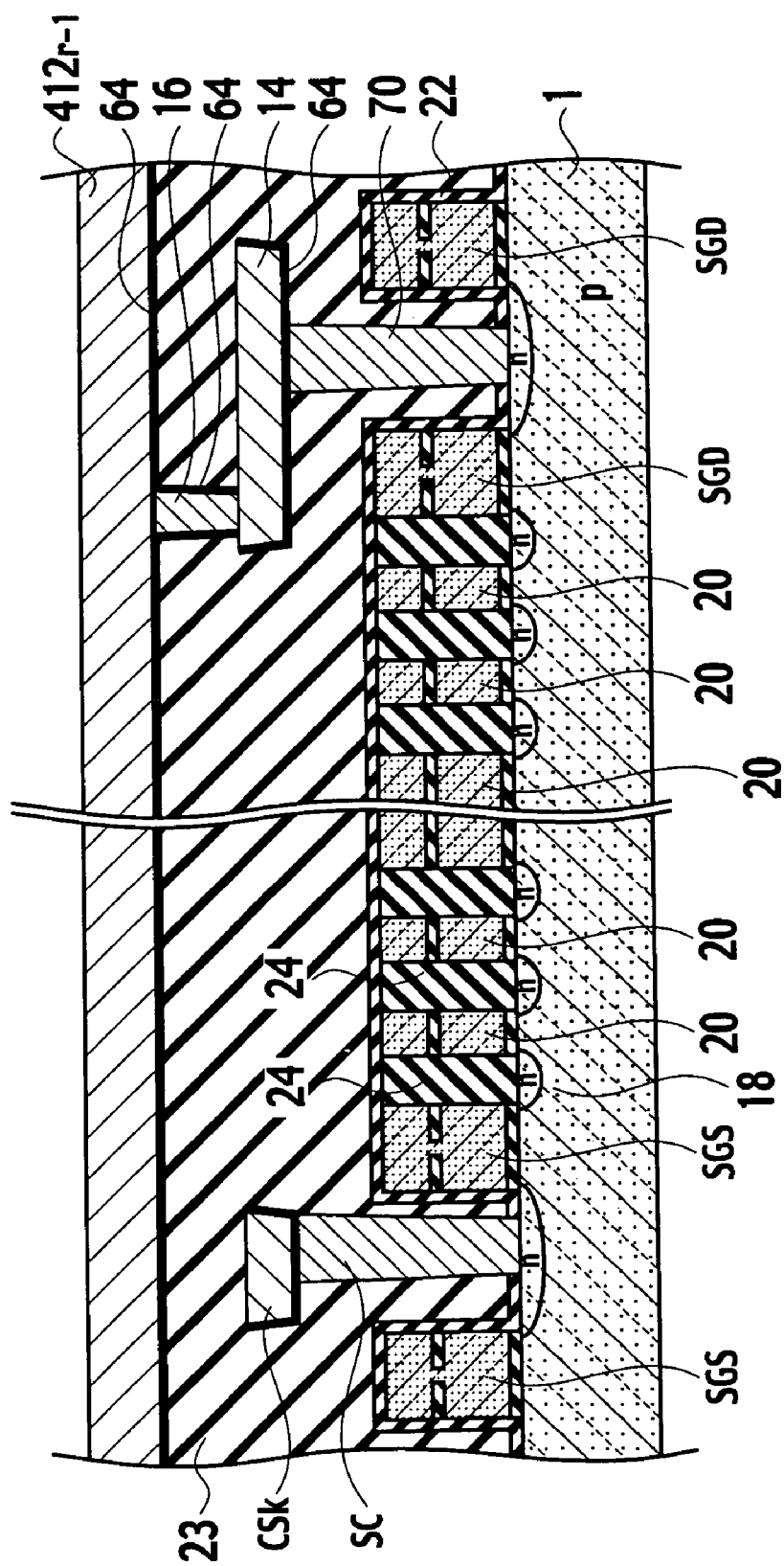
FIG. 38 is a cross-sectional view describing a state of the industrial product when a next process after the process shown in FIG. 37 of the normal routine procedure is completed.
Figure 40:
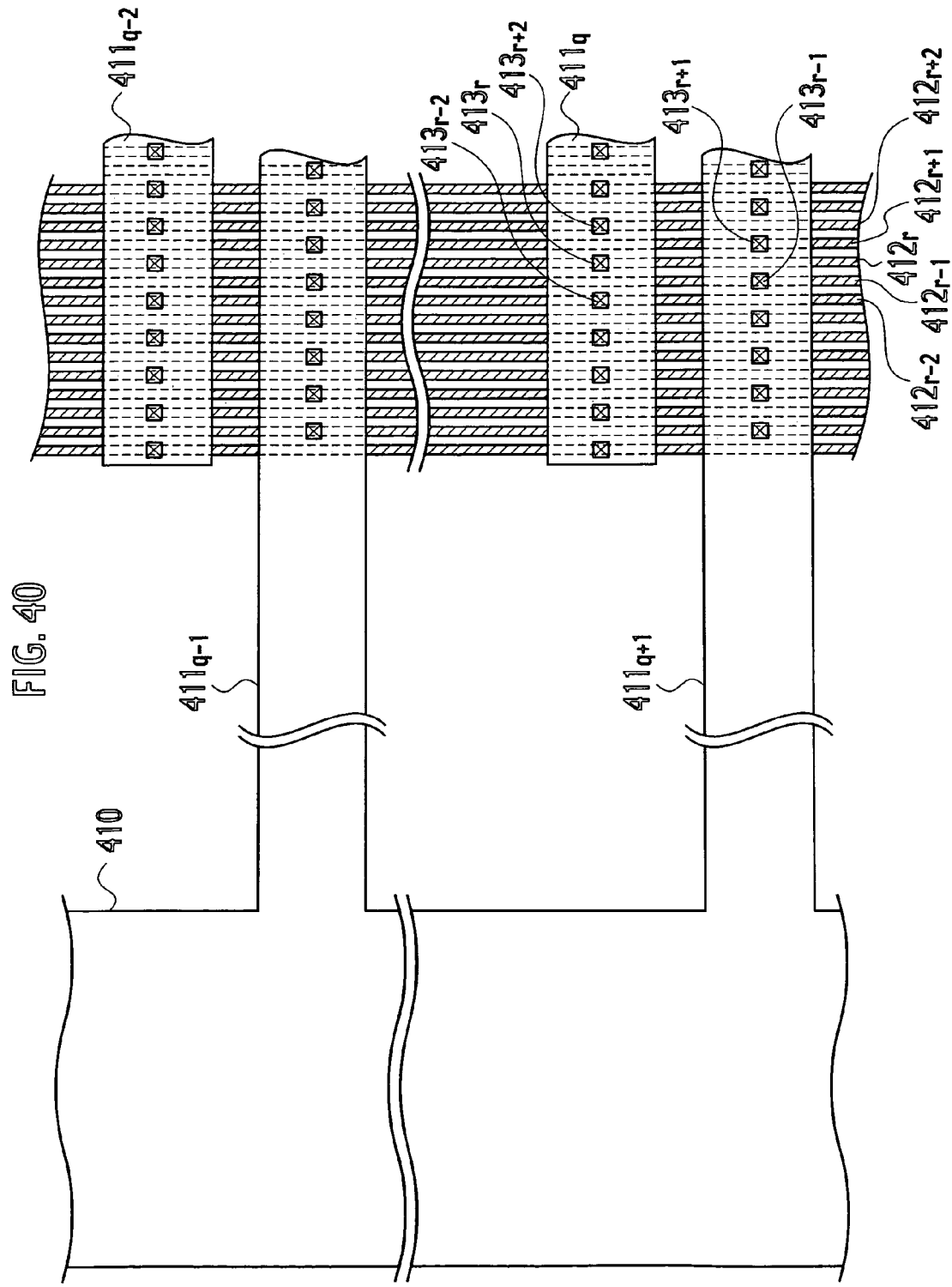
FIG. 40 is a top view of the process-level evaluation pattern (short-circuit failure detecting pattern) corresponding to FIG. 39.

(c) Afterwards, a 10 to 1000 nm-thick metal film such as Al film, Al-Si film, or Cu film is deposited across the entire surface of the interlayer insulating film 23. A photoresist film is coated on the metal film and is delineated through lithography. The metal film is selectively etched by RIE using the delineated photoresist film as an etching mask, forming a strip of the data transfer line (bit line BL) $412_{r-1}$, as shown in FIG. 38. Note that in the case of forming the data transfer line (bit line) $412_{r-1}$ with Cu, a damascene groove is formed in the surface of the interlayer insulating film 23 and Cu interconnect is buried in the damascene groove. While a single data transfer line (bit line) $412_{r-1}$ is shown in the cross-sectional view of FIG. 38, in an actual pattern, a plurality of stripe-shaped data transfer lines (bit lines) $412_{r-2}$, $412_{r-1}$, $412_r$, $412_{r+1}$, $412_{r+2}$... longitudinally extending in parallel (along the column direction) are shown in FIG. 40.

Figure 39:
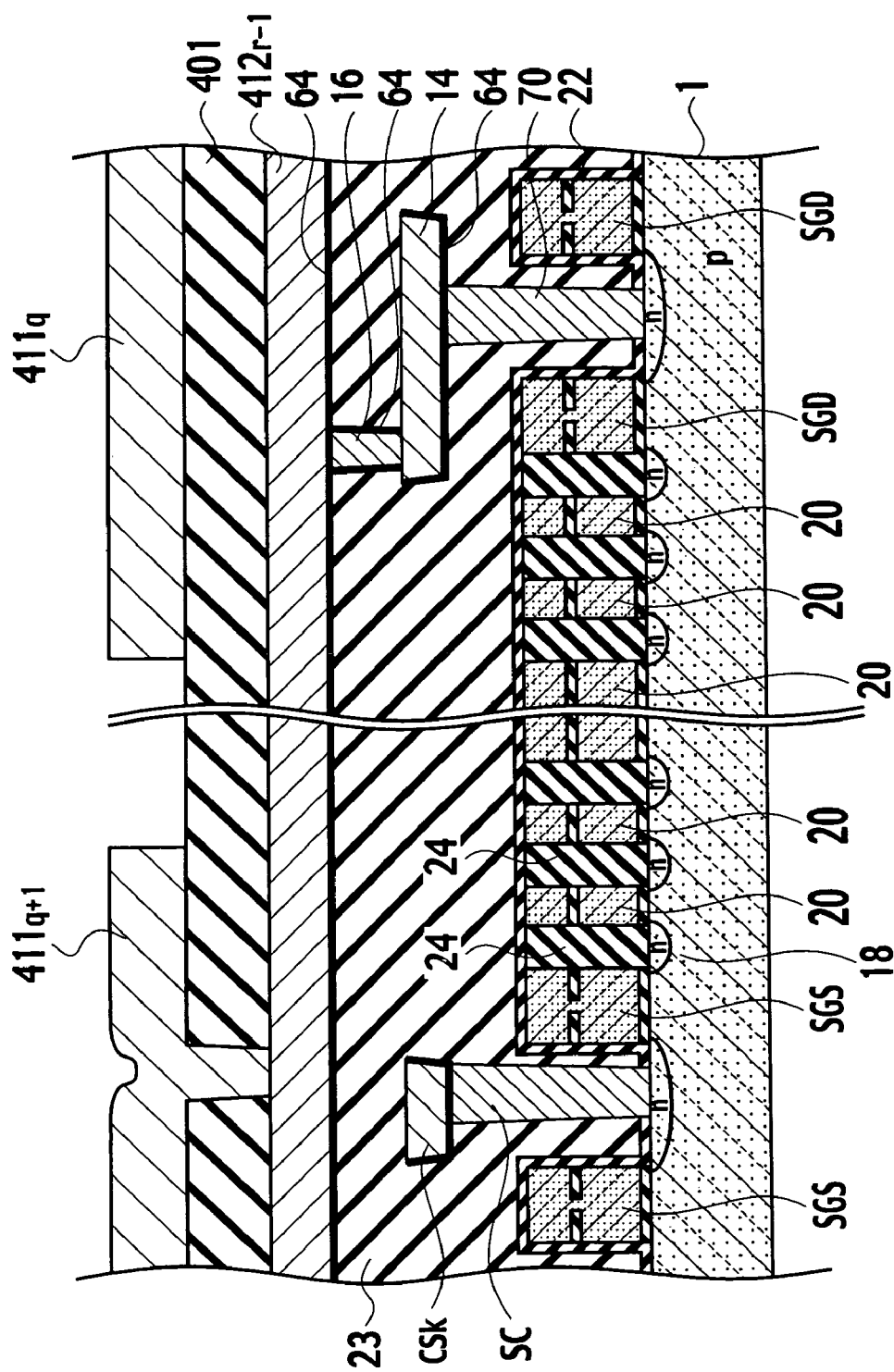
FIG. 39 is a process cross-sectional view describing a state of a process-level evaluation pattern (short-circuit failure detecting pattern) formed through a sequence of processes using additional masks after the process shown in FIG. 38 is completed.

(d) Once the normal routine procedure reaches the process stage shown in FIG. 38, the procedure proceeds to process-level evaluation procedure. That is after the state shown in FIG. 38, a 50 to 400 nm-thick interconnect-changing insulator 401 made of a silicon oxide film or the like is formed on the data transfer line (bit line) $412_{r-1}$ by CVD as shown in FIG. 39. A photoresist film (not shown in the drawing) is coated on the interconnect-changing insulator 401, the photoresist film is exposed and developed through lithography, and the interconnect-changing insulator 401 is then etched by RIE using the photoresist film as an etching mask. The photoresist film is removed, after etching is completed, to form sampling contact holes $413_{r-2}$, $413_{r-1}$, $413_r$, $413_{r+1}$, $413_{r+2}$, ... in the interconnect-changing insulator 401 shown in the top view of FIG. 40 such that part of the junction plates $412_{r-2}$, $412_{r-1}$, $412_r$, $412_{r+1}$, $412_{r+2}$, ... are selectively made bare.

(e) A metal film such as Al film is then formed to a thickness of approximately 100 to 800 nm by sputtering or vacuum evaporation. A photoresist film (not shown in the drawing) is coated on the metal film, the photoresist film is exposed and developed through lithography, and the metal film is then etched by RIE or the like using the photoresist film as an etching mask. Removal of the photoresist film, after etching is completed, delineates evaluation interconnects $411_{q-2}$, $411_{q-1}$, $411_q$, $411_{q+1}$, ... as shown in FIG. 40. A probing pad 410 collecting together the odd numbered evaluation interconnects $411_{q-1}$, $411_{q+1}$, ... is also shown (where "q" is assumed as an even number). The probing pad 410 corresponds to one of the probing pads 611, 612, ..., 620 shown in FIG. 3B, and although omitted from the drawing, another probing pad collecting together the even-numbered evaluation interconnects $411_{q-2}$, $411_q$, ... is naturally located on the right side of FIG. 40. Making tips of testing probes touch the probing pad 410 and the probing pad located on the right side of FIG. 40, respectively, and measuring resistance between the probing pads achieves detection of short-circuit failures between adjacent data lines $412_{r-2}$, $412_{r-1}$, $412_r$, $412_{r+1}$, $412_{r+2}$, ... with an interdigital topology of the even-numbered data lines $412_{r-2}$, $412_r$, $412_{r+2}$, ... facing the odd numbered data lines $412_{r-1}$, $412_{r+1}$, ....

According to the embodiment of the present invention as described above, easy detection of short-circuit failures and evaluation of the process levels are possible by providing two additional evaluation masks, configured to change a part of electrical connection of the intermediate product pattern implemented by the routinely employed working masks, in combination with the set of working masks, without preparing an exclusive set of process-level evaluation masks.

Figure 41:
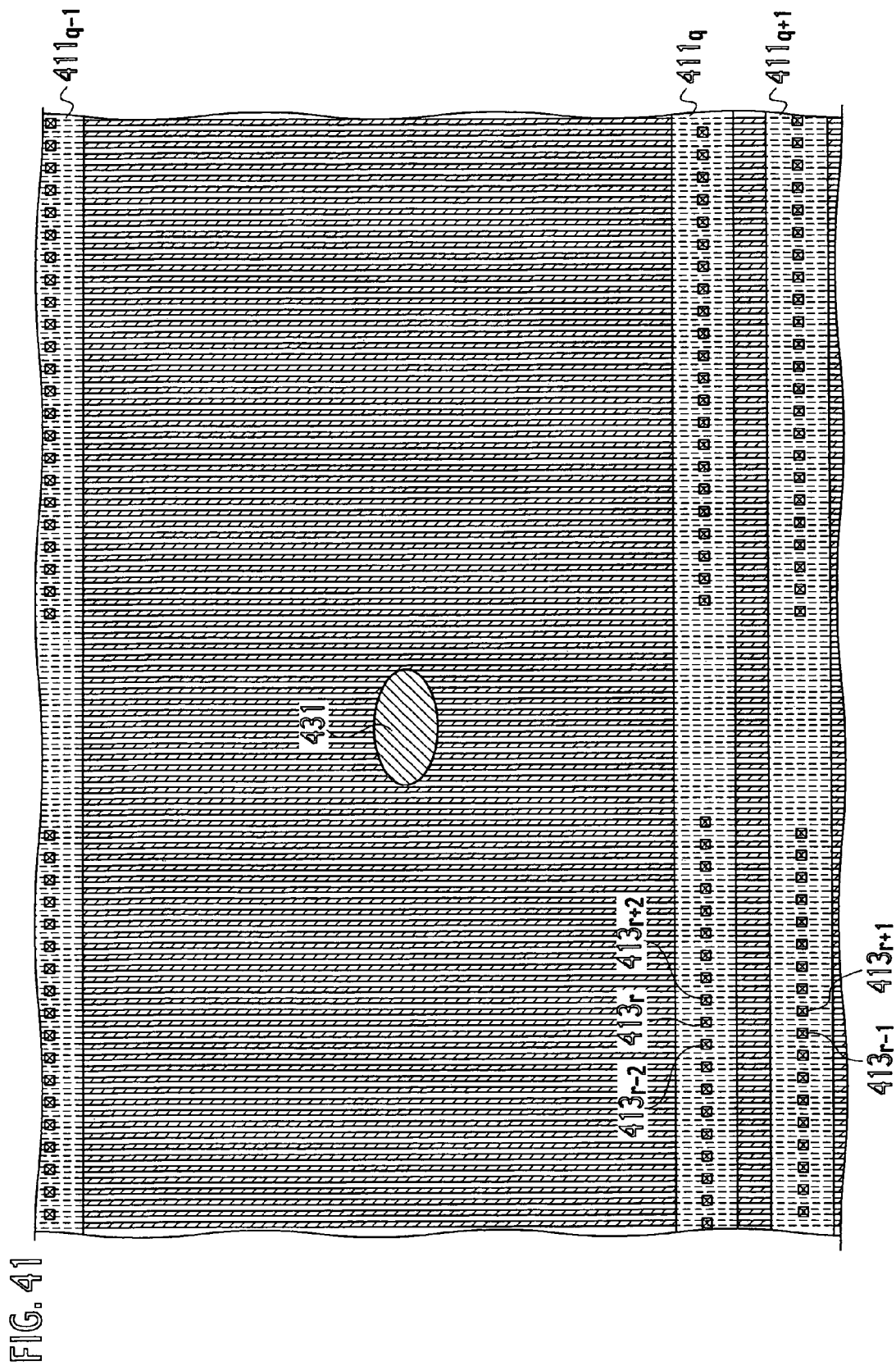
FIG. 41 is a top view of the process-level evaluation pattern corresponding to FIG. 40 schemed so as not to be adversely affected by pattern defects (short-circuit failures) occurring in any process up to the state of the process shown in FIG. 38.

As with FIG. 42, the open-circuit failures can be detected by connecting in series the junction plates $412_{r-2}$, $412_{r-1}$, $412_r$, $412_{r+1}$, $412_{r+2}$, ... using the connection-changing interconnects, into a meander line, and then measuring the resistance between opposing terminals in each of the meander lines. Furthermore, when generation of the pattern defect 431 is confirmed during pre-checking of the working mask before subject exposure process, or during arbitrary checking of actual patterns transferred onto the semiconductor wafer, a new working mask not allocating a sampling contact hole in the corresponding data transfer line is prepared to prevent adverse affects from the pattern defect 431, as shown in FIG. 41.

As such, according to the embodiment of the present invention, process-level evaluation patterns, which can characterize the defect in the intermediate product pattern, may be provided in combination with the set of working masks. The pattern defect 431 may be critical depending on the extent of defectiveness by itself, or alternatively, may become critical defect through a process-dependent combination with a pattern defect on the semiconductor wafer. However, according to the embodiment of the present invention, since open-circuit characteristics and short-circuit characteristics of the intermediate product pattern, pertaining to the target industrial product (final product), is directly tested, generation of open-circuit failures and short-circuit failures due to a combination with the fluctuation of process conditions may be prevented by regular periodical testing through an accelerated test in which process conditions are intentionally changed.

Furthermore, as is apparent from the top view of FIG. 40, since the patterns of the evaluation interconnects $411_{q-2}$, $411_{q-1}$, $411_q$, $411_{q+1}$, ... for extracting electrical information of specified portions on the semiconductor wafer to the outside of the semiconductor chip, in combination with the set of the working masks, can be delineated with sufficiently large dimensions compared to the minimum feature size F, not only is production of the evaluation mask itself easy, lithography and etching in the process-level evaluation procedure are also easy and simple, and therefore the process-level evaluation procedure can be accomplished in a short period.

Note that once the process-level evaluation procedure accompanying formation of the data transfer lines (bit lines) is completed, the procedure returns again to the normal routine procedure. After the formation process of the data transfer line (bit line) $412_{r-1}$ shown in FIG. 38, in the normal routine procedure, the interlayer insulating film 23 made of one of various insulating films such as a silicon oxide film, a silicon nitride film, BPSG, PSG, HSQ, MSQ, or an organic polymer with an aromatic hydrocarbon structure not including fluorine is deposited 10 to 1000 nm in thickness. A second via hole is then patterned through lithography. Once a barrier metal such as Ti, Ta, TaN, or TiN is filled in the second via hole after the photoresist film used for delineating the via hole is removed, a metallic material such as W, Al, or Cu is filled in the second via hole and planarized by CMP, forming the via plug 17 as shown in FIG. 5. Approximately 10 to 1000 nm of Al film, Al—Si film, or Cu film is deposited as an interconnect material once the via plug 17 is formed, and the second source line SL2 shown in FIGS. 4 and 5 is then formed though lithography or RIE (since the second source line SL2 is formed across the entirety and may be formed as an extremely wide pattern, the process-level evaluation is generally unnecessary.) Note that the processes may be simplified by simultaneously depositing conductive materials for the via plug 17 and the second source line SL2 and simultaneously delineating them. Afterwards, a silicon nitride film 8 approximately 0.05 to 2.0 μm in thickness formed through plasma deposition is deposited on the source line SL2. When an insulating film 23 such as a silicon nitride film or a polyimide film is then formed as a passivation film on the silicon nitride film 8, the NAND flash memory shown in FIGS. 4 and 5 is completed.

Other Embodiments

Various modifications will become possible for those skilled in the art after receiving the teaching of the present disclosure without departing from the scope thereof.

As described above, the embodiment of the present invention has been described exemplifying a NAND flash memory fabrication method; however, it should not be construed that descriptions and drawings forming a part of the disclosure are intended to limit the spirit and scope of the present invention, where other than the NAND flash memory, AND flash memory, DINOR flash memory or the like may be applied in the same manner, and may be applied to other various semiconductor memories such as DRAM or SRAM. Various alternative embodiments, working examples, and operational techniques will become apparent from the disclosure for those skilled in the art.

Nonvolatile semiconductor memory has been exemplified in the above description in response to frequent general demands for the most microscopic processing for the semiconductor memory; the present invention, however, is not limited to the semiconductor memory. The technical ideas of the present invention are applicable to various industrial products such as various semiconductor integrated circuits or semiconductor devices requiring micro-fabrication technology such as a petaflop super high-speed logic integrated circuit or a terahertz band communication integrated circuit. In addition, being applicable to a fabrication method for various industrial products other than the semiconductor integrated circuit, or alternatively semiconductor devices, such as a liquid crystal device, a magnetic storage medium, an optical storage medium, a thin film magnetic head, or a superconducting element, as long as the industrial product includes micro-patterns, is easily understood in the light of above description.

FIGS. 16, 26, 35, and 41 show examples where, when the pattern defects 121, 231, 331, and 431 are discovered, places to form sampling contact holes are selected avoiding patterns including the pattern defects 121, 231, 331, and 431; however, equivalent results may naturally be acquired through route-detouring of the evaluation interconnects instead of selection of places to form sampling contact holes. Furthermore, when mask defects are discovered in the process of testing for mask defects of the working mask, equivalent results may also naturally be acquired through route-detouring of the evaluation interconnects instead of selection of places to form sampling contact holes by avoiding patterns including the mask defects.

FIG. 42 shows an example of respectively forming the first meander line connected to the auxiliary connection-changing interconnects 161-1, 161-2, ..., and and 161-m, the second meander line connected to the auxiliary connection-changing interconnects 162-1, 162-2, ..., and 162-m, and the third meander line connected to the auxiliary connection-changing interconnects 163-1, 163-2, ..., and 163-m; however, as long as upper ends and lower ends of the line-and-space patterns are periodically connected so that the main pattern itself implements meander line configuration, the auxiliary connection-changing interconnects 161-1, 161-2, ..., 161-m; 162-1, 162-2, ..., 162-m; 163-1, 163-2, .... and 163-m are unnecessary. For example, when a plurality of connector patterns incorporated at upper ends and lower ends, which are used for establishing the meander line configuration, can be etched away in a latter process, a method of employing such meander line configuration is also effective. In this case, the open-circuit failures are first tested with the meander line configuration, and then the short-circuit failures are tested after the connector patterns, which is used for establishing meander lines, are etched away so as to implement a plurality of isolated strip patterns.

Moreover, the interconnect-changing insulating film may be shared with an actual insulating film employed in the device structure formed in the routine procedure. For example, the interconnect-changing insulating film 341 shown in FIG. 32 can be shared with the actual interlayer insulating film 23 shown in FIG. 36.

Thus, the present invention of course includes various embodiments and modifications and the like which are not detailed above. Therefore, the scope of the present invention will be defined in the following claims.

What is claimed is:

1. A method for manufacturing an industrial product with a set of working masks employed sequentially for implementing a final configuration of the industrial product and additional evaluation masks configured to inspect process-level defect in intermediate product patterns delineated by the working masks, comprising:
    forming a first intermediate product pattern, which implements at least a part of a first intermediate product of the industrial product, at a surface of a base body, by a sequence of processes including lithography process with a first sub-set of working masks in the set of working masks, the sequence of processes corresponds to a part of a procedure for manufacturing the industrial product;
    forming an interconnect-changing insulator configured to facilitate a change of interconnects from the final configuration implemented by the set of working masks, on the first intermediate product pattern;
    boring a plurality of sampling contact holes with one additional evaluation masks in the interconnect-changing insulator so as to make bare a part of the first intermediate product pattern to define a plurality of sampling sites;
    delineating a plurality of evaluation interconnects with another one of additional evaluation masks, the evaluation interconnects being dummy interconnects not required for a performance of the industrial product, on the interconnect-changing insulator so that each of the evaluation interconnects can electrically connect to at least one of the sampling sites of first intermediate product pattern; and
    measuring an electrical resistance between subject sampling sites through the evaluation interconnects so as to detect a product defect in the first intermediate product pattern.

2. The method of claim 1, wherein the first intermediate product pattern comprises a periodically repetitive pattern.

3. The method of claim 2, wherein the sampling contact holes are bored periodically in the interconnect-changing insulator so that the evaluation interconnects can electrically connect to the first intermediate product pattern periodically.

4. The method of claim 1, wherein the first intermediate product pattern comprises a line-and-space pattern, in which a plurality of strip patterns are arranged periodically and repetitively in parallel.

5. The method of claim 4, wherein the first intermediate product pattern further comprises a plurality of junction plates running orthogonal to the longitudinal direction of the strip patterns of the line-and-space pattern, the junction plates are arranged periodically and repetitively.

6. The method of claim 5, wherein the sampling contact holes are bored periodically in the interconnect-changing insulator so that the evaluation interconnects can electrically connect to the junction plates periodically.

7. The method of claim 4, wherein the evaluation interconnects comprises:
    a first evaluation interconnect running orthogonal to the longitudinal direction of the strip patterns, connected to even numbered strip patterns; and
    a second evaluation interconnect, running in parallel with the first evaluation interconnect, connected to odd numbered strip patterns.

8. The method of claim 1, further comprising:
    inspecting a mask defect generated in the first sub-set of working masks scheduled to be employed in the sequence of processes so as to form the first intermediate product pattern, before starting the sequence of processes in the procedure for manufacturing the industrial product.

9. The method of claim 8, wherein the sampling contact holes are bored selectively so as to excludes a site included in the inspected mask defect, when the inspection of the mask defect inspected any mask defect.

10. The method of claim 4, wherein the evaluation interconnects are connected to at least two probing pads, respectively.

11. The method of claim 10, wherein tips of testing probes touch the respective corresponding probing pads so as to measure the electrical resistance between the subject sampling sites.

12. The method of claim 4, wherein the evaluation interconnects comprises:
    evaluation interconnect wings connected to at least two probing pads; and
    an auxiliary connection-changing interconnects disposed between the evaluation interconnect wings so as to turn back a flow of current conducting through the strip patterns, making a serial connection of the strip patterns.

13. The method of claim 4, wherein the evaluation interconnects comprises:
    a first evaluation interconnect wing electrically connected to a first probing pad;

a first auxiliary connection-changing interconnect turning back a flow of current conducting through a first strip pattern assigned in the strip patterns from the first evaluation interconnect wing to a second strip pattern assigned in the strip patterns, making a serial connection between the first and second strip patterns;

a second auxiliary connection-changing interconnect turning back the flow of current conducting through the second strip pattern from the first strip pattern to a third strip pattern assigned in the strip patterns, making a serial connection between the second and third strip patterns, establishing a meander line by the first to third strip patterns; and a second evaluation interconnect wing electrically connected between the third strip pattern and a second probing pad, wherein measuring the electrical resistance between first and second probing pads detects an open-circuit failure generated in meander line.

14. The method of claim 4, wherein the evaluation interconnects comprises:

a first evaluation interconnect wing electrically connected to a first probing pad;

a second evaluation interconnect wing electrically connected to a second probing pad;

a first auxiliary connection-changing interconnect turning back a flow of current conducting through a first strip pattern assigned in the strip patterns from the first evaluation interconnect wing to a third strip pattern assigned in the strip patterns, making a serial connection between the first and third strip patterns;

a second auxiliary connection-changing interconnect turning back a flow of current conducting through a second strip pattern adjacent to the first strip pattern assigned in the strip patterns from the second evaluation interconnect wing to a fourth strip pattern adjacent to the third strip pattern assigned in the strip patterns, making a serial connection between the second and fourth strip patterns;

a third auxiliary connection-changing interconnect turning back the flow of current conducting through the third strip pattern from the first strip pattern to a fifth strip pattern assigned in the strip patterns, making a serial connection between the third and fifth strip patterns, establishing a meander line by the first to third strip patterns, establishing a first meander line by the first, third and fifth strip patterns;

a fourth auxiliary connection-changing interconnect turning back the flow of current conducting through the fourth strip pattern from the second strip pattern to a sixth strip pattern assigned in the strip patterns, making a serial connection between the fourth and sixth strip patterns, establishing a second meander line by the second, fourth and sixth strip patterns;

a third evaluation interconnect wing electrically connected between the fifth strip pattern and a third probing pad; and a fourth evaluation interconnect wing electrically connected between the sixth strip pattern and a fourth probing pad, wherein measuring the electrical resistance between the first and third probing pads detects an open-circuit failure generated in the first meander line, and measuring the electrical resistance between the second and fourth probing pads detects an open-circuit failure generated in the second meander lines.

15. The method of claim 1, further comprising:

forming a next intermediate product pattern, which implements at least a part of a next intermediate product of the industrial product, at a surface of a new base body established by the first intermediate product by a second sequence of processes including lithography process with a second sub-set of working masks in the set of working masks, the second sequence of processes corresponds to a part of the procedure for manufacturing the industrial product;

forming an upper interconnect-changing insulator on the next intermediate product pattern;

boring a plurality of upper level sampling contact holes in the upper interconnect-changing insulator so as to make bare a part of the next intermediate product pattern to define a plurality of upper level sampling sites;

delineating a plurality of upper evaluation interconnects on the upper interconnect-changing insulator so that each of the upper evaluation interconnects can electrically connect to at least one of the upper level sampling sites of next intermediate product pattern; and measuring an electrical resistance between subject upper level sampling sites through the upper evaluation interconnects so as to detect a process-level defect in the next intermediate product pattern.

16. The method of claim 1, wherein the base body is established by a preceding intermediate product fabricated by a preceding sequence of processes conducted before the sequence of processes fabricating the first intermediate product, the preceding sequence of processes corresponds to another part of the procedure for manufacturing the industrial product.

17. The method of claim 16, further comprising:

forming a lower interconnect-changing insulator on the preceding intermediate product pattern;

boring a plurality of lower level sampling contact holes in the lower interconnect-changing insulator so as to make bare a part of the preceding intermediate product pattern to define a plurality of lower level sampling sites;

delineating a plurality of lower evaluation interconnects on the lower interconnect-changing insulator so that each of the lower evaluation interconnects can electrically connected to at least one of the lower level sampling sites of preceding intermediate product pattern; and measuring an electrical resistance between subject lower level sampling sites through the lower evaluation interconnects so as to detect a process-level defect in the preceding intermediate product pattern.

18. The method of claim 1, wherein the industrial product is a semiconductor device.

19. The method of claim 1, wherein the industrial product is a nonvolatile semiconductor memory.

20. A method for manufacturing a semiconductor device with a set of working masks employed sequentially for implementing a final configuration of the semiconductor device and additional evaluation masks configured to inspect process-level defect in intermediate product patterns delineated by the working masks, comprising:

inspecting a mask defect generated in the set of working masks;

forming an intermediate product pattern at a surface of a semiconductor substrate with a part of the set of working masks;

forming an insulator configured to facilitate a change of interconnects from the final configuration implemented by the set of working masks, on the intermediate product pattern;

boring a plurality of sampling contact holes with one of additional evaluation masks in the insulator so as to define a plurality of sampling sites;

delineating a plurality of evaluation interconnects with another one of additional evaluation masks, the evaluation interconnects being dummy interconnects not required for a performance of the semiconductor device, on the insulator so that each of the evaluation interconnects can electrically connect to at least one of the sampling sites of intermediate product pattern; and measuring electrical characteristics through the evaluation interconnects so as to detect the process-level defect in the intermediate product pattern, wherein the sampling contact holes are bored selectively so as to exclude a site included in the inspected mask defect.

* * * * *